(12) United States Patent
Kim et al.

(10) Patent No.: US 9,865,828 B2
(45) Date of Patent: Jan. 9, 2018

(54) ORGANIC LIGHT EMITTING DEVICE

(71) Applicants: SAMSUNG DISPLAY CO., LTD., Yongin, Gyeonggi-do (KR); INDUSTRY-ACADEMIC COOPERATION FOUNDATION GYEONGSANG NATIONAL UNIVERSITY, Gyeongnam (KR)

(72) Inventors: Se-Hun Kim, Yongin (KR); Mie-Hwa Park, Yongin (KR); Sam-Il Koh, Yongin (KR); Mi-Kyung Kim, Yongin (KR); Kwan-Hee Lee, Yongin (KR); Yun-Hi Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 889 days.

(21) Appl. No.: 13/747,279

(22) Filed: Jan. 22, 2013

(65) Prior Publication Data

US 2014/0054559 A1    Feb. 27, 2014

(30) Foreign Application Priority Data

Aug. 22, 2012 (KR) ........................ 10-2012-0091990

(51) Int. Cl.
*H01L 51/00* (2006.01)
*H01L 51/52* (2006.01)

(52) U.S. Cl.
CPC ........ *H01L 51/0094* (2013.01); *H01L 51/006* (2013.01); *H01L 51/0052* (2013.01);
(Continued)

(58) Field of Classification Search
None
See application file for complete search history.

(56) References Cited

U.S. PATENT DOCUMENTS 5,635,308 A    6/1997  Inoue et al.
7,244,518 B2   7/2007  Yu et al.
(Continued)

FOREIGN PATENT DOCUMENTS

JP    03-200289 A    9/1991
JP    07-138561 A    5/1995
(Continued)

OTHER PUBLICATIONS

C.W. Tang et al., Organic Electroluminescent Diodes, American Institute of Physics, Sep. 21, 1987, vol. 51, No. 12, pp. 913-915.

*Primary Examiner* — Anthony J Frost
(74) *Attorney, Agent, or Firm* — H.C. Park & Associates, PLC

(57) ABSTRACT

An organic light-emitting device is disclosed, the organic light-emitting device comprising a first electrode, a second electrode disposed opposite to the first electrode, and an emission layer comprising organic materials and disposed between the two electrodes. The emission layer may include a host and a dopant. The host may be a silane derivative of anthracene having at least one silicon substituent that is an aryl group having at least two rings that are fused to each other. The dopant may be a 7H-benzo[c]fluorene having diarylamino substituents at the 5- and 9-positions. This scheme provides organic light-emitting devices having low driving voltages, high light-emitting efficiencies and long lifetimes.

19 Claims, 1 Drawing Sheet

(52) U.S. Cl.
CPC .... *H01L 51/0058* (2013.01); *B32B 2457/202* (2013.01); *H01L 51/0059* (2013.01); *H01L 51/0061* (2013.01); *H01L 51/5212* (2013.01)

(56) References Cited

U.S. PATENT DOCUMENTS

| | | | |
|---|---|---|---|
| 7,651,786 | B2 | 1/2010 | Matsuura et al. |
| 7,732,063 | B2 | 6/2010 | Matsuura et al. |
| 7,927,716 | B2 | 4/2011 | Matsuura et al. |
| 2006/0226768 | A1* | 10/2006 | Yu .................. C07F 7/0809 313/504 |
| 2008/0160347 | A1 | 7/2008 | Wang et al. |

FOREIGN PATENT DOCUMENTS

| | | | |
|---|---|---|---|
| JP | 08-012600 A | | 1/1996 |
| JP | 08-239655 A | | 9/1996 |
| JP | 2011-037838 A | | 2/2011 |
| JP | 2011-219461 A | | 11/2011 |
| JP | 2011-225546 A | | 11/2011 |
| JP | 2011219461 A | * | 11/2011 |
| KR | 10-2005-0019907 A | | 3/2005 |
| KR | 10-2008-0031808 A | | 4/2008 |
| KR | 10-1031463 B1 | | 4/2011 |

\* cited by examiner

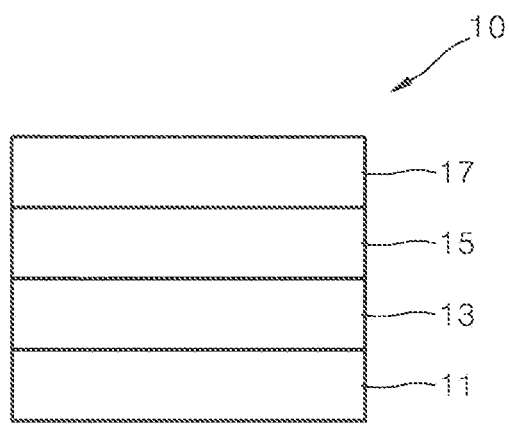

ORGANIC LIGHT EMITTING DEVICE

CLAIM OF PRIORITY

This application makes reference to, incorporates the same herein, and claims all benefits accruing under 35 U.S.C. §119 from an application for ORGANIC LIGHT EMITTING DEVICE earlier filed in the Korean Intellectual Property Office on 22 Aug. 2012 and there duly assigned Serial No. 10-2012-0091990.

BACKGROUND OF THE INVENTION

Field of the Invention

The present invention relates to an organic light-emitting device.

Description of the Related Art

Organic light-emitting devices (OLED's), which are self-emitting devices, have advantages such as wide viewing angles, excellent contrast, quick response, high brightness and excellent driving voltage characteristics and can provide multicolored images.

A typical OLED has a structure including a substrate and supported layers including an anode, a hole transport layer (HTL), an emission layer (EML), an electron transport layer (ETL), and a cathode, the supported layers being sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY OF THE INVENTION

The present invention provides an organic light-emitting device (OLED) with high efficiency and improved lifetime.

According to one embodiment of the present invention, there is provided an organic light-emitting device including: a substrate; a first electrode; a second electrode disposed opposite to the first electrode; and an emission layer disposed between the first electrode and the second electrode and including a host and a dopant, the host including an anthracene-based compound represented by Formula 1 below:

<Formula 1>

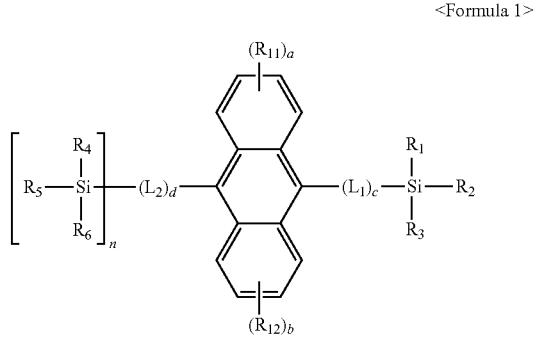

n in Formula 1 being 0 or 1:

$R_1$ to $R_6$ are each independently selected from a substituted or unsubstituted $C_1$-$C_{60}$ alkyl group, a 3- to 10-membered substituted or unsubstituted non-condensed ring group, and a substituted or unsubstituted condensed ring group in which at least two rings fused to are each other, at least one of $R_1$ to $R_3$ if n is 0, or at least one of $R_1$ to $R_6$ if n is 1 being each independently a substituted or unsubstituted condensed ring group in which at least two rings are fused to each other;

$L_1$ are $L_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group;

c and d are each independently an integer from 1 to 3;

$R_{11}$ and $R_{12}$ are each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, $-N(Q_1)(Q_2)$, and $-Si(Q_3)(Q_4)(Q_5)$, $Q_1$ to $Q_5$ being each independently selected from a hydrogen atom, a $C_1$-$C_{10}$ alkyl group, a $C_6$-$C_{20}$ aryl group, and a $C_2$-$C_{20}$ heteroaryl group; and a and b are each independently an integer from 1 to 4.

BRIEF DESCRIPTION OF THE DRAWING

The above and other features and advantages of the present invention will be made more apparent by describing in detail exemplary embodiments thereof with reference to the attached drawing in which:

FIG. 1 schematically illustrates the structure of an organic light-emitting device according to an embodiment of the present invention.

DETAILED DESCRIPTION OF THE INVENTION

As used herein, the term "and/or" includes any and all combinations of one or more of the associated listed items. Expressions such as "at least one of", when preceding a list of elements, modify the entire list of elements and do not modify the individual elements of the list.

FIG. 1 is a schematic sectional view of an organic light-emitting device 10 according to an embodiment of the present invention. Referring to FIG. 1, the organic light-emitting device 10 according to the present embodiment includes a substrate 11, a first electrode 13, an organic layer 15, and a second electrode 17. Hereinafter, a structure of an organic light-emitting device according to an embodiment of the present invention and a method of manufacturing the same will be described with reference to FIG. 1.

The substrate 11 may be any substrate that is used in existing organic light-emitting devices. In some embodiments, the substrate 11 may be a glass substrate or a transparent plastic substrate with strong mechanical strength, thermal stability, transparency, surface smoothness, ease of handling, and water resistance.

The first electrode 13 may be formed by depositing or sputtering a first electrode-forming material on the substrate 11. When the first electrode 13 is an anode, a material having a high work function may be used as the first electrode-forming material in order to facilitate hole injection. The first electrode 13 may be a reflective electrode or a transmission electrode. Suitable first electrode-forming materials may include transparent and conductive materials such as indium tin oxide (ITO), indium zinc oxide (IZO), $SnO_2$, and ZnO. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO but is not limited thereto.

The organic layer 15 may be disposed on the first electrode 13.

The organic layer 15 indicates a plurality of layers disposed between the first electrode 13 and the second electrode 17 of the organic light-emitting device 10. The organic layer 15 may include an emission layer and may include at least one of a hole injection layer, a hole transport layer, a functional layer having both hole injection and hole transport capabilities, a buffer layer, an electron blocking layer, a hole blocking layer, an electron transport layer, an electron injection layer, and a functional layer having both electron injection and electron transport capabilities.

In some embodiments, the organic layer 15 may include a hole injection layer (HIL), a hole transport layer (HTL), a buffer layer, an emission layer (EML), an electron transport layer (ETL), and an electron injection layer (EIL) that are stacked upon one another in this order.

The HIL may be formed on the first electrode 13 by vacuum deposition, spin coating, casting, Langmuir-Blodgett (LB) deposition, or the like.

When the HIL is formed using vacuum deposition, vacuum deposition conditions may vary according to the compound that is used to form the HIL and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

Non-limiting examples of the material that can be used to form the HIL are N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris (3-methylphenylphenylamino)triphenylamine (m-MTDATA), N,N'-di(1-naphthyl)-N,N'-diphenylbenzidine (NPB), 4,4',4"-tris(diphenylamino)triphenylamine (TDATA), 4,4',4"-tris(N-(naphthylen-2-yl)-N-phenylamine) triphenylamine (2-TNATA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate) (PANT/PSS).

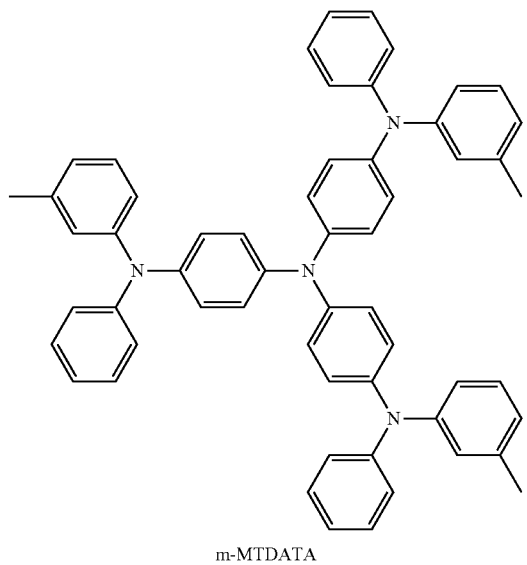

m-MTDATA

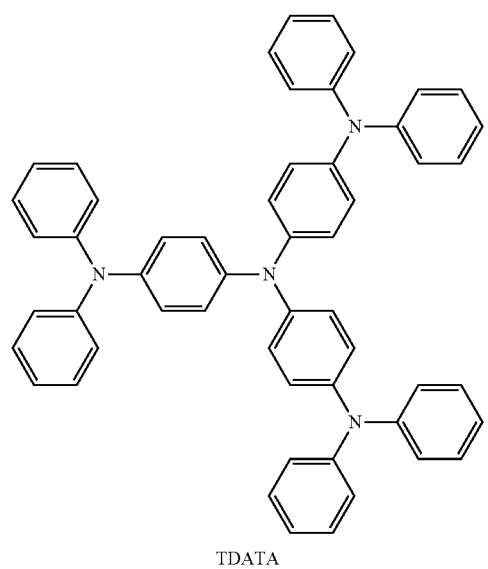

TDATA

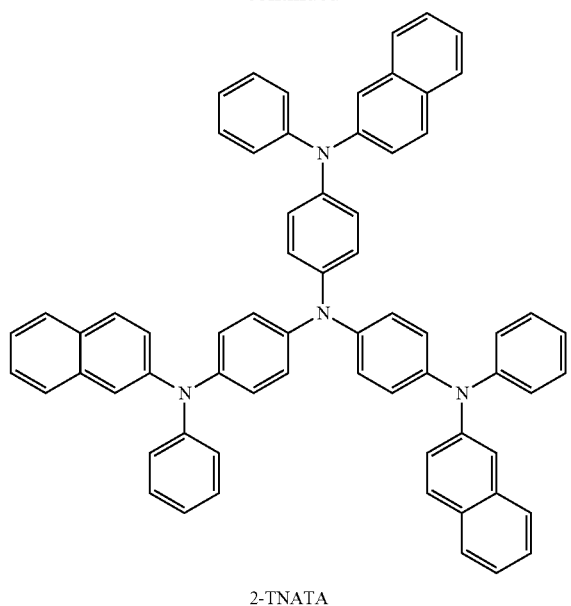

2-TNATA

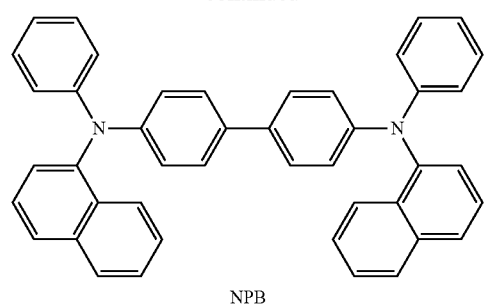

NPB

The thickness of the HIL may be from about 100 Å to about 10000 Å, and, in some embodiments, may be from about 100 Å to about 1000 Å. When the thickness of the HIL is within these ranges, the HIL may have good hole injecting ability without imparting a high driving voltage to the organic light-emitting device.

Then, a HTL may be formed on the HIL by using vacuum deposition, spin coating, casting. Langmuir-Blodgett (LB) deposition, or the like. When the HTL is formed using vacuum deposition or spin coating, the conditions for deposition and coating may be similar to those for the formation of the HIL, though the conditions for the deposition and coating may vary according to the material that is used to form the HTL.

Non-limiting examples of suitable known HTL forming materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

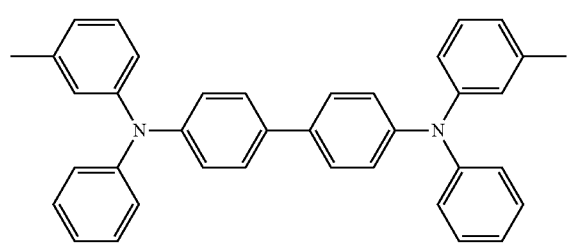

TPD

The thickness of the HTL may be from about 50 Å to about 2000 Å, and in some embodiments, may be from about 100 Å to about 1500 Å. When the thickness of the HTL is within these ranges, the HTL may have good hole transporting ability without imparting a high driving voltage to the organic light-emitting device.

The H-functional layer (having both hole injection and hole transport capabilities) may contain at least one material from each of the group of hole injection layer materials and the group of hole transport layer materials. The thickness of the H-functional layer may be from about 500 Å to about 10,000 Å, and, in some embodiments, may be from about 100 Å to about 1,000 Å. When the thickness of the H-functional layer is within these ranges, the H-functional layer may have good hole injection and transport capabilities without imparting a high driving voltage to the organic light-emitting device.

In some embodiments, at least one of the HIL, HTL, and H-functional layer may include at least one of a compound of Formula 300 below and a compound of Formula 301 below.

Formula 300

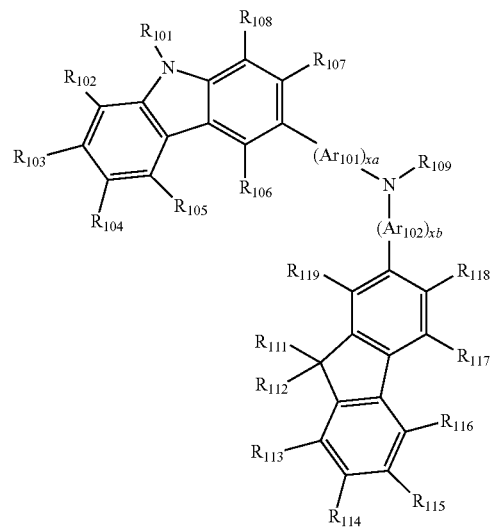

<Formula 301>

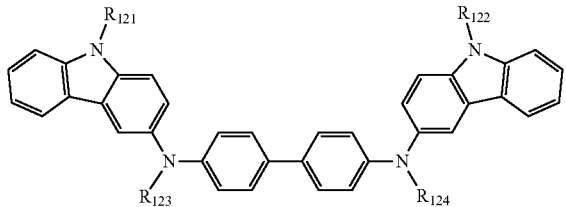

In Formula 300 above, $Ar_{101}$ and $Ar_{102}$ may be each independently a substituted or unsubstituted $C_6$-$C_{60}$ arylene group. In some embodiments, $Ar_{101}$ and $Ar_{102}$ may be each independently one of a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylenylene group, a chrysenylene group, a naphthacenylene group, a picenylene group, a perylenylene group, and a pentacenylene group, each of which may be substituted with at least one of a deuterium atom, a halogen atom, a hydroxyl group, a nitro group, a cyano group, an amino group, an amidino group, a hydrazine, a hydrazone, a carboxyl group or salt thereof, a sulfuric acid or salt thereof, a phosphoric acid or salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ hetero aryl group. In Formula 300, xa and xb may be each independently an integer from 0 to 5. For example, xa and xb may be each independently 0.1, or 2. For example, xa may be 1, and xb may be 0, but xa and xb are not limited thereto.

In Formulae 300 and 301, $R_{101}$ to $R_{108}$, $R_{111}$ to $R_{119}$, and $R_{121}$ to $R_{124}$ may be each independently one of a hydrogen atom, a deuterium atom, a halogen atom, a hydroxyl group, a cyano group, a nitro group, an amino group, an amidino group, a hydrazine, a hydrazone, a carboxyl group or a salt thereof, sulfonic acid or a salt thereof, phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, and a substituted or unsubstituted $C_6$-$C_{60}$ arylthio group.

In some non-limiting embodiments, $R_{51}$ to $R_{58}$, $R_{61}$ to $R_{69}$, $R_{71}$, and $R_{72}$ may be each independently one of a hydrogen atom; a deuterium atom; a halogen atom; a hydroxyl group; a cyano group; a nitro group; an amino group; an amidino group; a hydrazine; a hydrazone; a carboxyl group or a salt thereof; a sulfonic acid group or a salt thereof; a phosphoric acid or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid or a salt thereof, a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid or a salt thereof, a $C_1$-$C_{10}$ alkyl group, and a $C_1$-$C_{10}$ alkoxy group.

In Formula 300, $R_{109}$ may be one of a phenyl group, a naphthyl group, an anthryl group, a biphenyl group, and a pyridyl group; and a phenyl group, a naphthyl group, an anthryl group, a biphenyl group, or a pyridyl group that are substituted with at least one of a deuterium atom, a halogen atom, a hydroxyl group, a cyano group, a nitro group, an amino group, an amidino group, a hydrazine, a hydrazone, a carboxyl group or a salt thereof, sulfonic acid or a salt thereof, phosphoric acid or a salt thereof, a $C_1$-$C_{20}$ alkyl group, and a $C_1$-$C_{20}$ alkoxy group.

In an embodiment, the compound of Formula 300 may be a compound represented by Formula 300A below.

<Formula 300A>

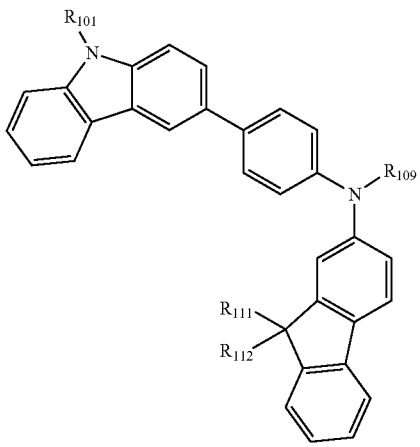

$R_{101}$, $R_{111}$, $R_{112}$ and $R_{119}$ in Formula 300A are as defined above, and thus a detailed description thereof will not be provided here.

In some non-limiting embodiments, at least one of the HIL, HTL, and H-functional layers may include at least one of compounds represented by Formulae 301 to 320 below.

301

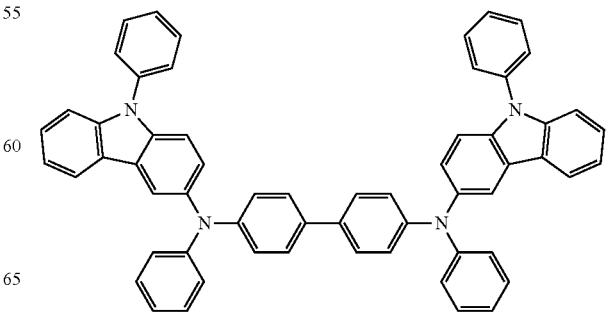

302
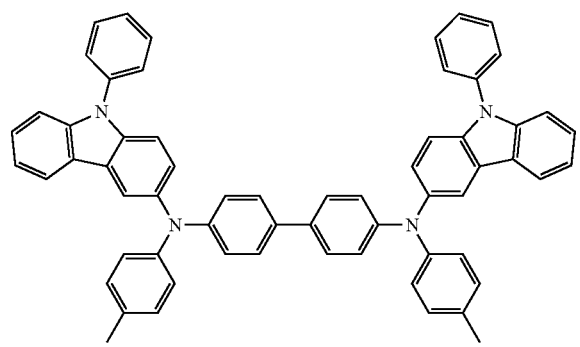
303
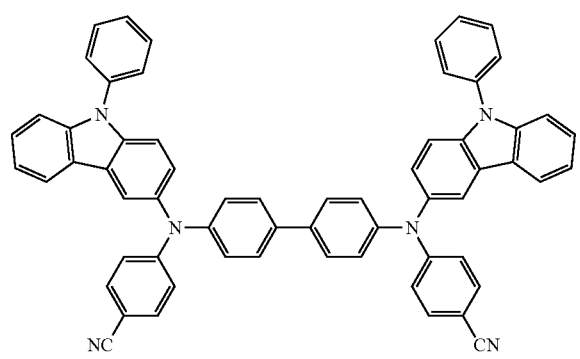
304
305
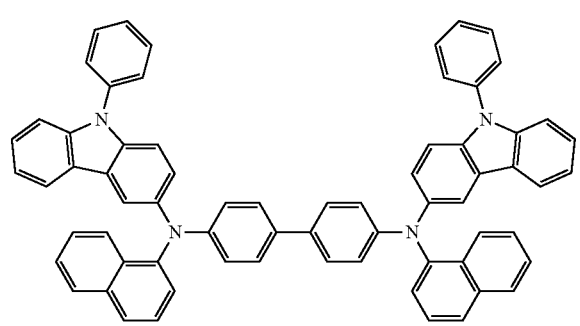
306
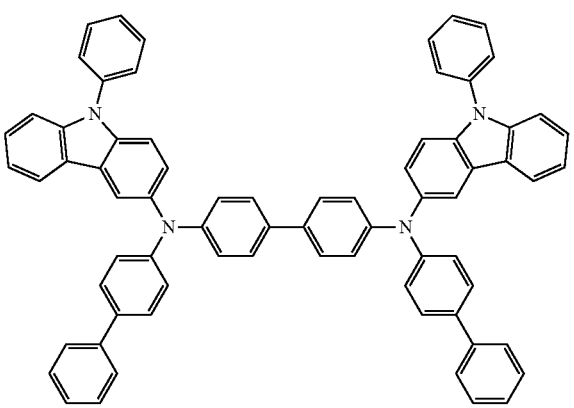
307
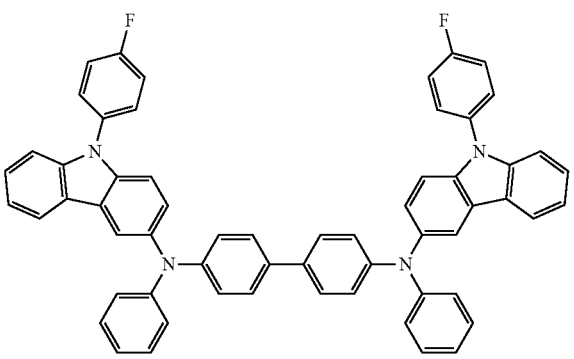
308
309
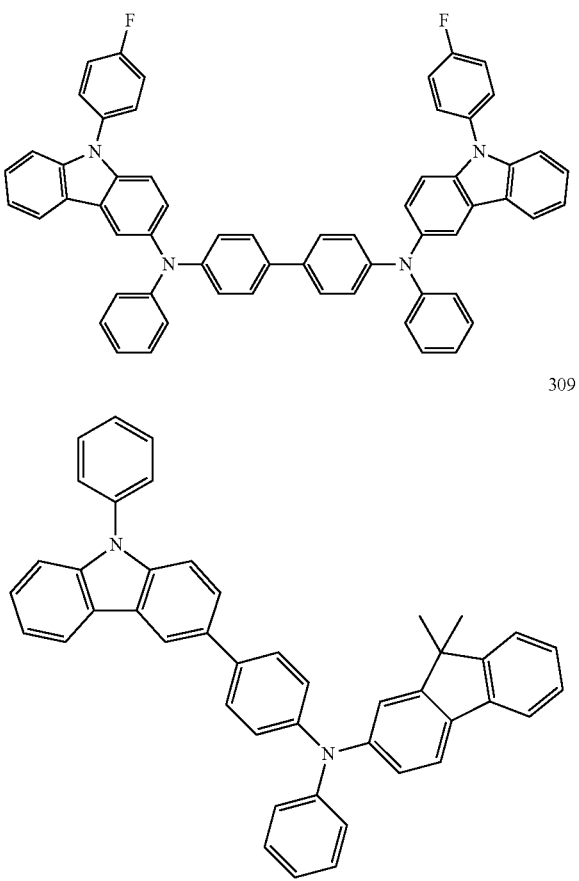

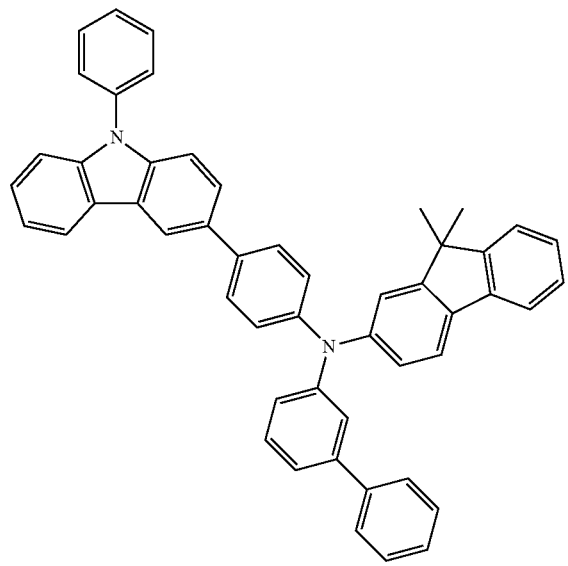
310
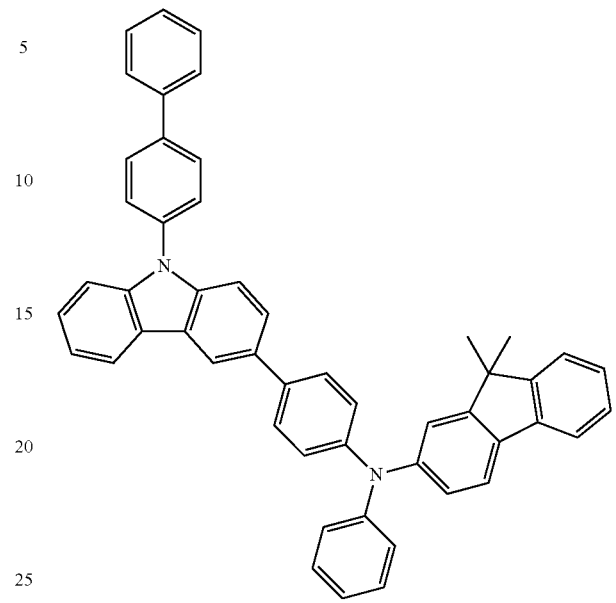
312
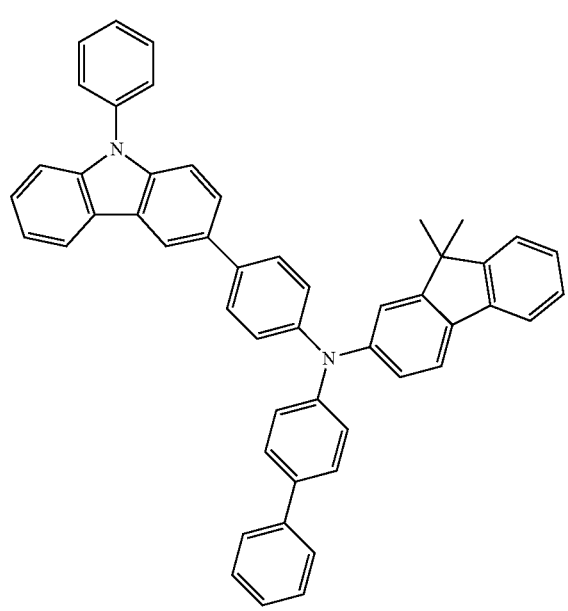
311
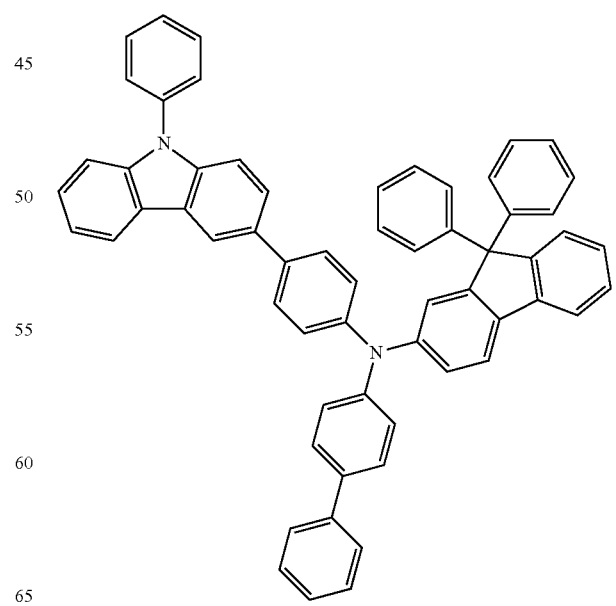
313

314
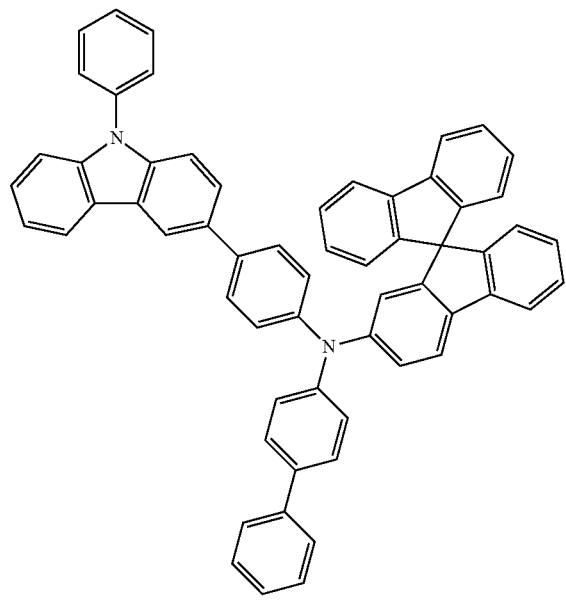
316
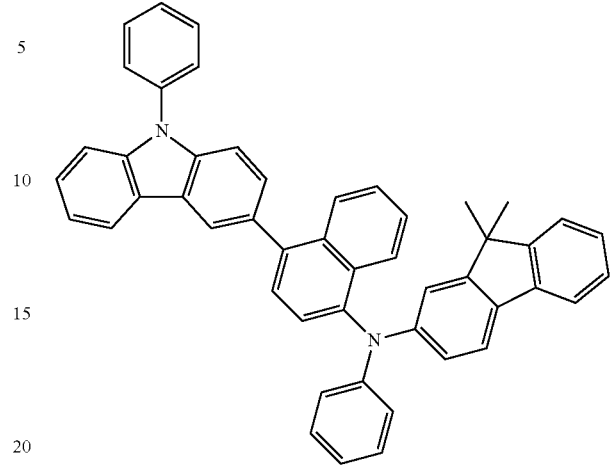
317
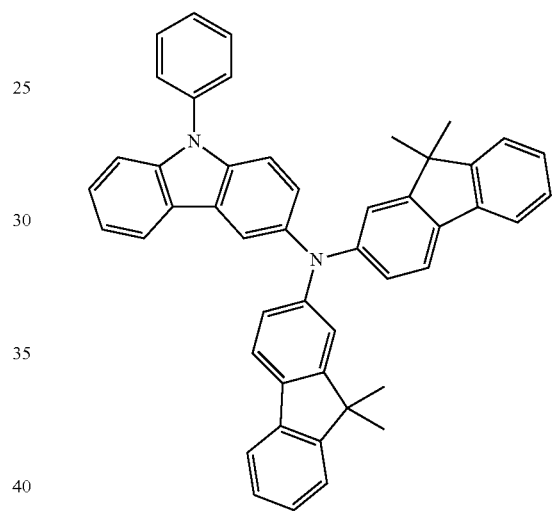
315
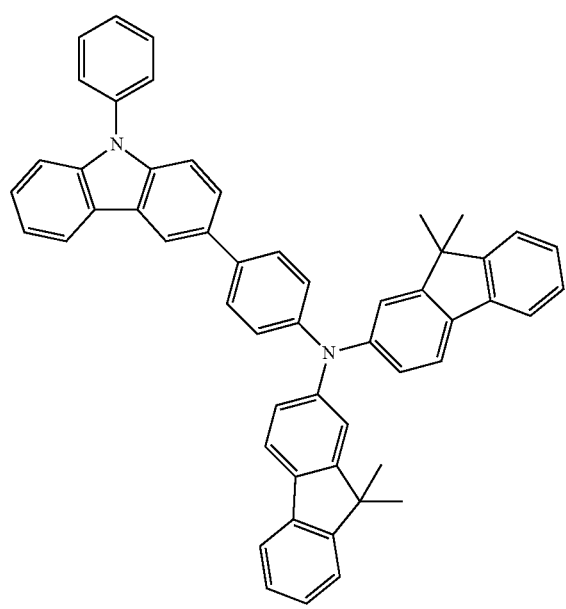
318
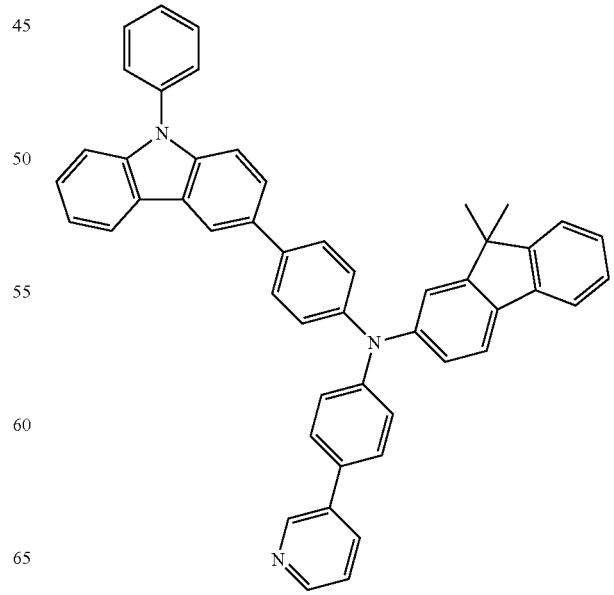

-continued

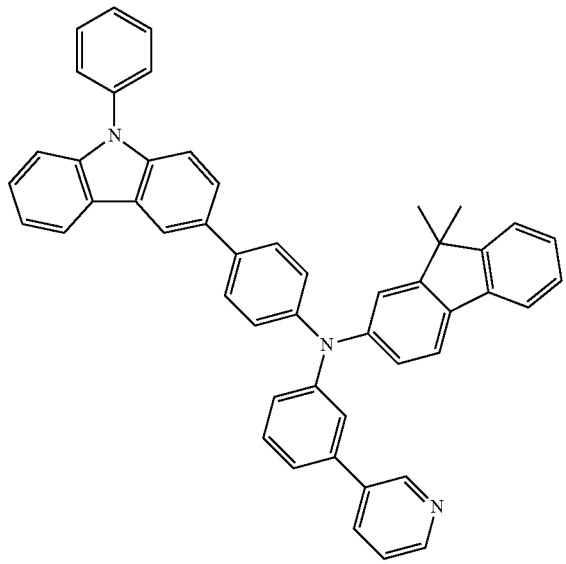
319

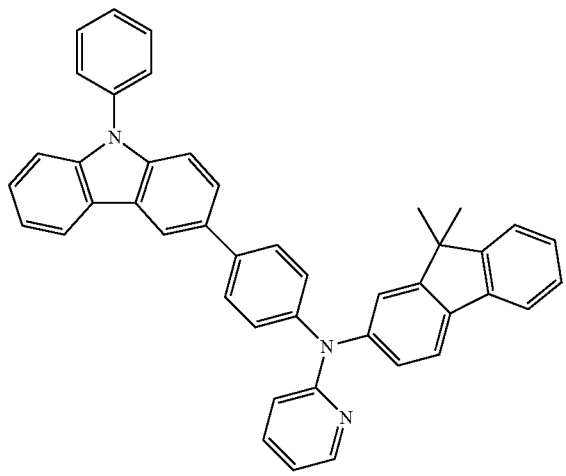
320

At least one of the HIL, HTL, and H-functional layers may further include a charge-generating material for improved layer conductivity, in addition to a known hole injecting material, a hole transport material, and/or a material having both hole injection and hole transport capabilities as described above.

The charge-generating material may be, for example, a p-dopant. The p-dopant may be one of a quinine derivative, a metal oxide and a cyano group-containing compound but is not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

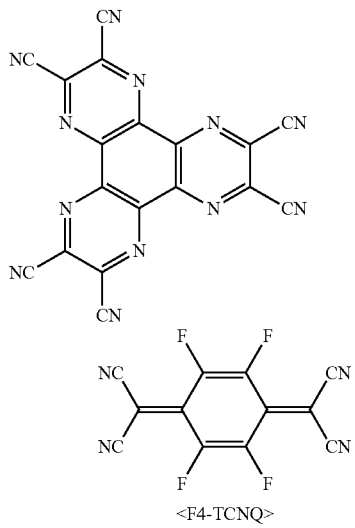
<Compound 200>

<F4-TCNQ>

When the hole injection layer, hole transport layer, or H-functional layer further includes a charge-generating material, the charge-generating material may be homogeneously dispersed or inhomogeneously distributed in the layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The buffer layer may include a hole injecting material or a hole transporting material. In some other embodiments, the buffer layer may include the same material as one of the materials included in the HIL, HTL, and H-functional layer that underly the buffer layer.

Then, an EML may be formed on the HTL, H-functional layer, or buffer layer by vacuum deposition, spin coating, casting, Langmuir-Blodget (LB) deposition, or the like. When the EML is formed using vacuum deposition or spin coating, the deposition and coating conditions may be similar to those for the formation of the HIL, though the conditions for deposition and coating may vary according to the material that is used to form the EML.

The emission layer may include a host and a dopant, and the host may include an anthracene-based compound represented by Formula 1 below.

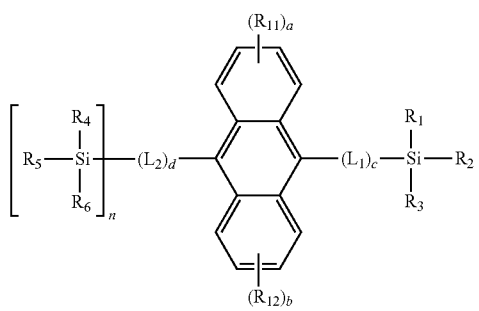
<Formula 1>

In Formula 1 above, n may be 0 or 1. If n is 0, the substituent —Si($R_4$)($R_5$)($R_6$) is not in Formula 1. In Formula 1, $R_1$ to $R_6$ may be each independently selected from a substituted or unsubstituted $C_1$-$C_{60}$ alkyl group, a 3- to 10-membered substituted or unsubstituted non-condensed ring group, and a substituted or unsubstituted condensed ring group in which at least two rings are fused to each other, at least one of $R_1$ to $R_3$ if n is 0, or at least one of $R_1$ to $R_6$ if n is 1 being each independently a substituted or unsubstituted condensed ring group in which at least two rings are fused to each other. The anthracene-based compound represented by Formula 1 should include "a substituted or unsubstituted condensed ring group in which at least two rings are fused to each other" as a Si substituent.

As used herein, the terms "the 3- to 10-membered substituted or unsubstituted non-condensed ring group" refers to a 3- to 10-membered cyclic group comprising one ring not fused to any other ring. Ring-member atoms of "the 3- to 10-membered substituted or unsubstituted non-condensed ring group" may be selected from C, N, O, P, S, and Si. This will be understood with reference to Formulae 2A to 2T, which are described below.

As used herein, the terms "substituted or unsubstituted condensed ring group in which at least two rings are fused to each other" refers to a group with at least two rings that are fused to each other. The "substituted or unsubstituted condensed ring group in which at least two rings are fused to each other" may be an aromatic or non-aromatic group and may include 3 to 60 ring-member atoms, the ring-member atoms being selected from among C, N, O, P, S, and Si. The "a substituted or unsubstituted condensed ring group in which at least two rings are fused to each other" will be understood with reference to, for example, Formulae 3A to 3R and Formulae 4A to 4J described below.

In some embodiments, in Formula 1 above, $R_1$ to $R_6$ may be each independently selected from a substituted or unsubstituted $C_1$-$C_{20}$ alkyl group, a substituted or unsubstituted cyclopropyl group, a substituted or unsubstituted cyclobutyl group, a substituted or unsubstituted cyclopentyl group, a substituted or unsubstituted cyclohexyl group, a substituted or unsubstituted cycloheptyl group, a substituted or unsubstituted cyclooctyl group, a substituted or unsubstituted cyclopentenyl group, a substituted or unsubstituted cyclopentadienyl group, a substituted or unsubstituted cyclohexcenyl group, a substituted or unsubstituted cyclohexadienyl group, a substituted or unsubstituted cycloheptadienyl group, a substituted or unsubstituted thiophenyl group, a substituted or unsubstituted furanyl group, a substituted or unsubstituted pyrrolyl group, a substituted or unsubstituted imidazolyl group, a substituted or unsubstituted pyrazolyl group, a substituted or unsubstituted isothiazolyl group, a substituted or unsubstituted isoxazolyl group, a substituted or unsubstituted thiazolyl group, a substituted or unsubstituted oxazolyl group, a substituted or unsubstituted oxadiazolyl group, a substituted or unsubstituted thiadiazolyl group, a substituted or unsubstituted triazolyl group, a substituted or unsubstituted phenyl group, a substituted or unsubstituted pyridinyl group, a substituted or unsubstituted pyridazinyl group, a substituted or unsubstituted pyrimidinyl group, a substituted or unsubstituted pyridazinyl group, a substituted or unsubstituted triazinyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted biphenylenyl group, a substituted or unsubstituted indacenyl group, a substituted or unsubstituted acenaphthylenyl group, a substituted or unsubstituted fluorenyl group, a substituted or unsubstituted spiro-fluorenyl group, a substituted or unsubstituted carbazolyl group, a substituted or unsubstituted anthryl group, a substituted or unsubstituted phenalenyl group, a substituted or unsubstituted phenanthrenyl group, a substituted or unsubstituted chrysenyl group, a substituted or unsubstituted triphenylenyl group, a substituted or unsubstituted pyrenyl group, a substituted or unsubstituted perylenyl group, a substituted or unsubstituted fluoranthenyl group, a substituted or unsubstituted naphthacenyl group, a substituted or unsubstituted picenyl group, a substituted or unsubstituted pentaphenyl group, a substituted or unsubstituted hexacenyl group, a substituted or unsubstituted dibenzofuranyl group, a substituted or unsubstituted dibenzothiophenyl group, a substituted or unsubstituted phenothiazinyl group, a substituted or unsubstituted phenoxazinyl group, a substituted or unsubstituted dihydrophenazinyl group, a substituted or unsubstituted phenoxathiinyl group, and a substituted or unsubstituted phenanthridinyl group; at least one of $R_1$ to $R_3$ if n is 0 or at least one of $R_1$ to $R_6$ if n is 1 may be each independently selected from a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted biphenylenyl group, a substituted or unsubstituted indacenyl group, a substituted or unsubstituted acenaphthylenyl group, a substituted or unsubstituted fluorenyl group, a substituted or unsubstituted spiro-fluorenyl group, a substituted or unsubstituted carbazolyl group, a substituted or unsubstituted anthryl group, a substituted or unsubstituted phenalenyl group, a substituted or unsubstituted phenanthrenyl group, a substituted or unsubstituted chrysenyl group, a substituted or unsubstituted triphenylenyl group, a substituted or unsubstituted pyrenyl group, a substituted or unsubstituted perylenyl group, a substituted or unsubstituted fluoranthenyl group, a substituted or unsubstituted naphthacenyl group, a substituted or unsubstituted picenyl group, a substituted or unsubstituted pentaphenyl group, a substituted or unsubstituted hexacenyl group, a substituted or unsubstituted dibenzofuranyl group, a substituted or unsubstituted dibenzothiophenyl group, a substituted or unsubstituted phenothiazinyl group, a substituted or unsubstituted phenoxazinyl group, a substituted or unsubstituted dihydrophenazinyl group, a substituted or unsubstituted phenoxathiinyl group, and a substituted or unsubstituted phenanthridinyl group but are not limited thereto.

In some embodiments, $R_1$ to $R_6$ in Formula 1 may be each independently one of a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexcenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthryl group, a phenalenyl group, a phenanthrenyl group, a perylenyl group, a fluoranthenyl group, a naphthacenyl group, a picenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{60}$ heteroaryl group, and —N($Q_{11}$)($Q_{12}$). $Q_{11}$ and $Q_{12}$ being each independently selected from a hydrogen atom, a $C_1$-$C_{10}$ alkyl group, a $C_6$-$C_{20}$ aryl group and a $C_2$-$C_{20}$ heteroaryl group; at least one of $R_1$ to $R_3$ if n is 0, or at least one of $R_1$ to $R_6$ if n is 1, being each independently one of a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthryl group, a phenalenyl group, a phenanthrenyl group, a perylenyl group, a fluoranthenyl group, a naphthacenyl group, a picenyl group, pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_6$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{60}$ heteroaryl group, and —N($Q_{11}$)($Q_{12}$), $Q_{11}$ and $Q_{12}$ being each independently selected from a hydrogen atom, a $C_1$-$C_{10}$ alkyl group, a $C_6$-$C_{20}$ aryl group, and a $C_2$-$C_{20}$ heteroaryl group.

In some other embodiments, $R_1$ to $R_6$ in Formula 1 may be each independently one of a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, any of which may be; substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{60}$ heteroaryl group, and —N($Q_{11}$)($Q_{12}$), $Q_{11}$ and $Q_{12}$ being each independently selected from a hydrogen atom, a $C_1$-$C_{10}$ alkyl group, a $C_6$-$C_{20}$ aryl group, and a $C_2$-$C_{20}$ heteroaryl group; $R_1$ to $R_6$ in Formula 1 may be each independently one of the groups represented by Formula 2A to 2T below; $R_1$ to $R_6$ in Formula 1 may be each independently one of the groups represented by Formulae 3A to 3R below; and at least one of $R_1$ to $R_3$ if n is 0, or at least one of $R_1$ to $R_6$ if n is 1, is one of the groups represented by Formulae 3A to 3R below.

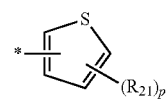

Formula 2A

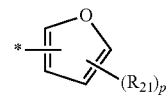

Formula 2B

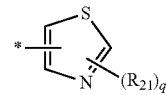

Formula 2C

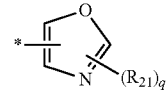

Formula 2D

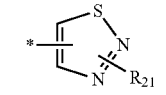

Formula 2E

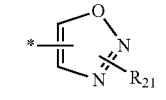

Formula 2F

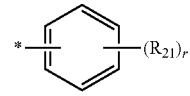

Formula 2G

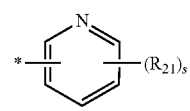

Formula 2H

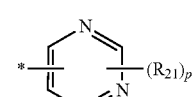

Formula 2I

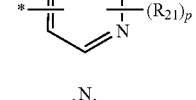

Formula 2J

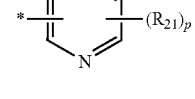

Formula 2K

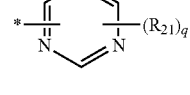

Formula 2L

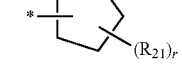

Formula 2M

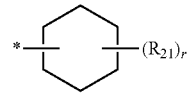

Formula 2N

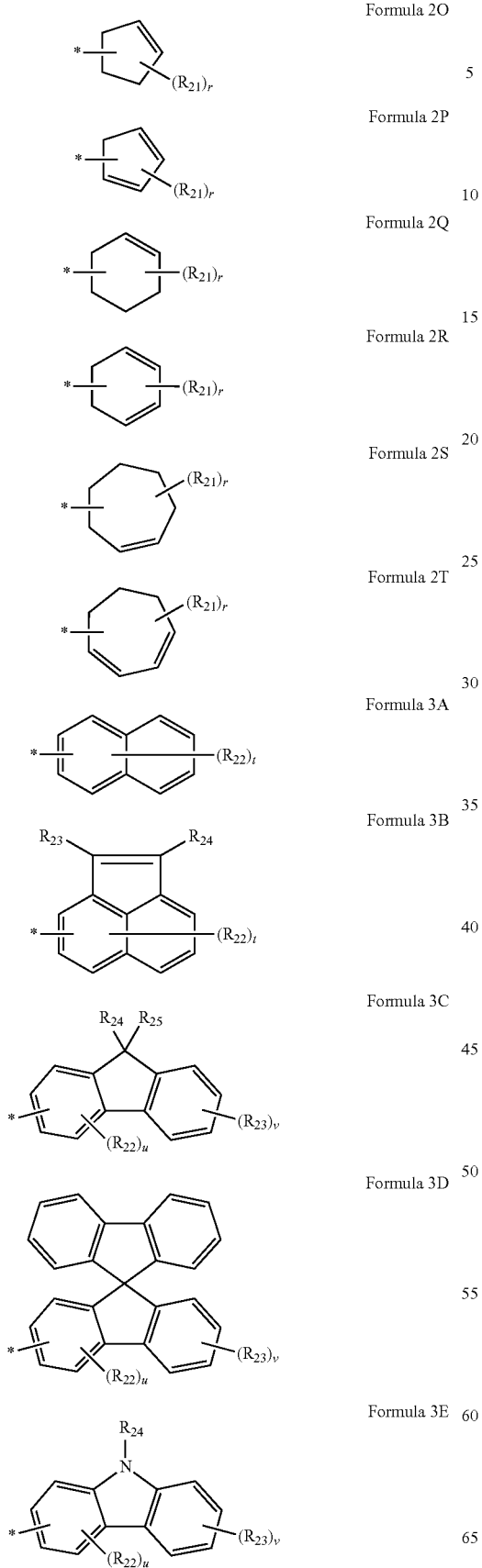
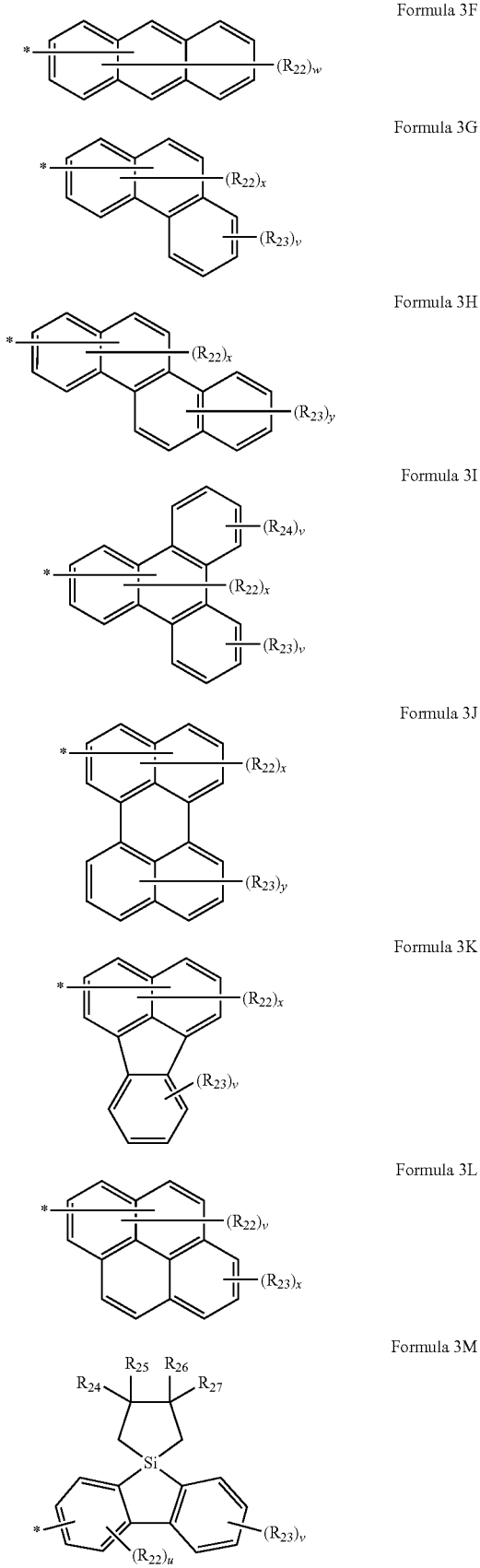

-continued

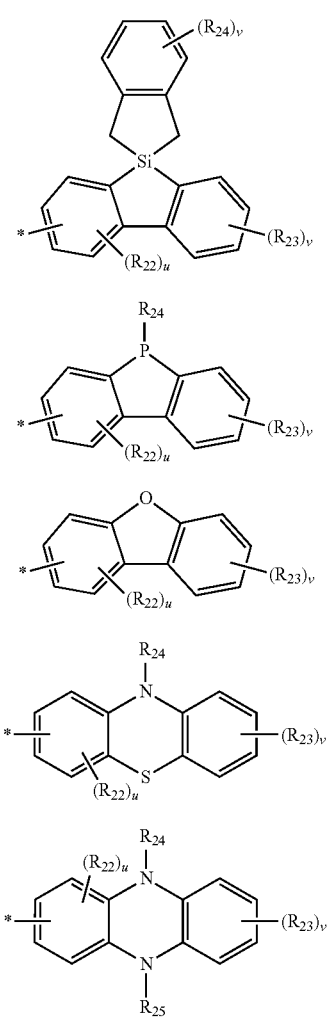

Formula 3N

Formula 3O

Formula 3P

Formula 3Q

Formula 3R

In Formulae 2A to 2T and in Formulae 3A to 3R, $R_{21}$ to $R_{27}$ may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{60}$ heteroaryl group, and —N($Q_{21}$)($Q_{22}$), $Q_{21}$ and $Q_{22}$ being each independently selected from a hydrogen atom, a $C_1$-$C_{10}$ alkyl group, a $C_6$-$C_{20}$ aryl group, and a $C_2$-$C_{20}$ heteroaryl group; p and u may be each independently an integer from 1 to 3; q may be 1 or 2; r and x may be each independently an integer from 1 to 5; s and v may be each independently an integer from 1 to 4; t may be an integer from 1 to 7; w may be an integer from 1 to 9; and y may be an integer from 1 to 6.

In some embodiments, in Formulae 2A to 2T, and Formulae 3A to 3R, $R_{21}$ to $R_{27}$ may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a dimethyl-fluorenyl group, a phenyl-carbazolyl group, a pyrenyl group, a chrysenyl group, a benzothiazolyl group, a benzoxazolyl group, a phenyl-benzoimidazolyl group, and —N($Q_{21}$)($Q_{22}$), $Q_{21}$ and $Q_{22}$ being each independently selected from a hydrogen atom, a $C_1$-$C_{10}$ alkyl group, a phenyl group, a naphthyl group, and an anthryl group but are not limited thereto.

In some other embodiments, $R_1$ to $R_6$ in Formula 1 may be each independently one of a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a phenyl group, a naphthyl group, and an anthryl group; $R_1$ to $R_6$ in Formula 1 may be each independently a group represented by Formula 20; and $R_1$ to $R_6$ in Formula 1 may be each independently one of the groups represented by Formulae 4A to 4J; and at least one of $R_1$ to $R_3$ if n is 0 or at least one of $R_1$ to $R_6$ if n is 1 may be each independently one of the groups represented by Formulae 4A to 4J below.

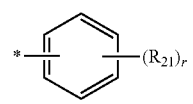

Formula 2G

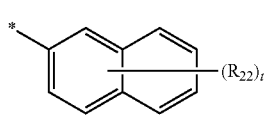

Formula 4A

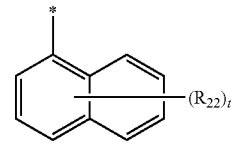

Formula 4B

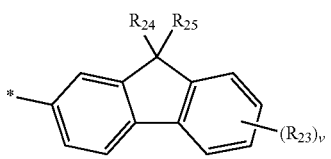

Formula 4C

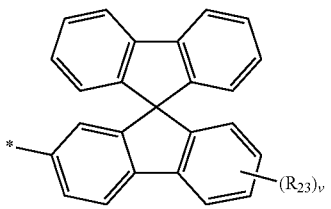

Formula 4D

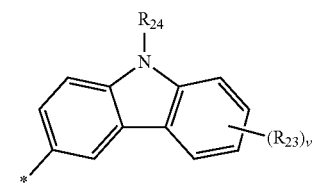

Formula 4E

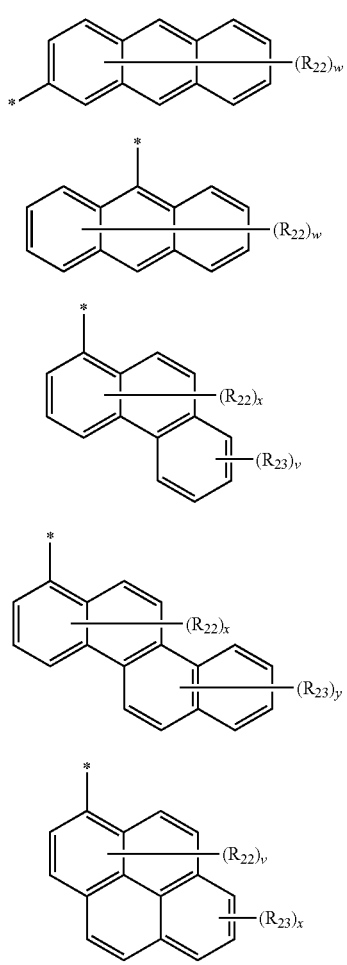

Formula 4F

Formula 4G

Formula 4H

Formula 4I

Formula 4J

In some embodiments, $R_{21}$ to $R_{25}$ in Formula 2G and Formulae 4A to 4J may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a dimethyl-fluorenyl group, a phenyl-carbazolyl group, a pyrenyl group, a chrysenyl group, a benzothiazolyl group, a benzoxazolyl group, a phenyl-benzoimidazolyl group, and —N($Q_{21}$)($Q_{22}$), $Q_{21}$ and $Q_{22}$ being each independently selected from a hydrogen atom, a $C_1$-$C_{10}$ alkyl group, a phenyl group, a naphthyl group, and an anthryl group; r and x may be each independently an integer from 1 to 5: v may be an integer from 1 to 4; t may be an integer from 1 to 7; w may be an integer from 1 to 9; and y may be an integer from 1 to 6.

In Formula 1 above, $L_4$ and $L_2$ may be each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group.

In some other embodiments, in Formula 1, $L_1$ and $L_2$ may be each independently one of a cyclopropylene group, a cyclobutylene group, a cyclopentylene group, a cyclohexylene group, a cycloheptylene group, a cyclooctylene group, a cyclopentenylene group, a cyclopentadienylene group, a cyclohexcenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, a naphthylene group, an azulenylene group, a heptalenylene group, a biphenylenylene group, an indacenylene group, an acenaphthylenylene group, a fluorenylene group, a spiro-fluorenylene group, a carbazolylene group, an anthrylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathiinylene group, and a phenanthridinylene group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{60}$ heteroaryl group, and —N($Q_{11}$)($Q_{12}$). $Q_{11}$ and $Q_{12}$ being each independently selected from a hydrogen atom, a $C_1$-$C_{10}$ alkyl group, a $C_6$-$C_{20}$ aryl group, and a $C_2$-$C_{20}$ heteroaryl group but are not limited thereto.

In some embodiments, in Formula 1 above, L and $L_2$ may be each independently selected from one of the groups represented by Formulae 5A to 5J below.

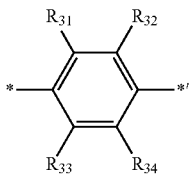

Formula 5A

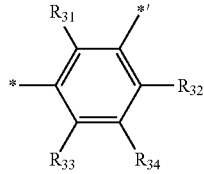

Formula 5B

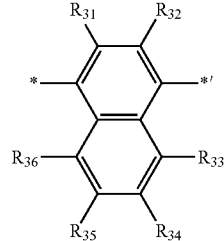

Formula 5C

-continued

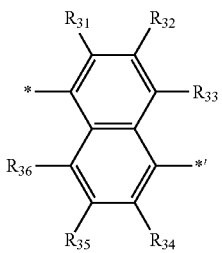

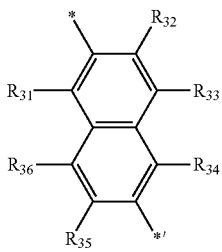

Formula 5F
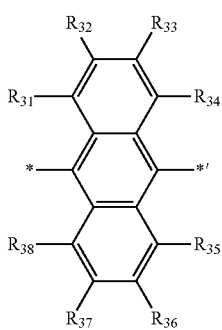

Formula 5G
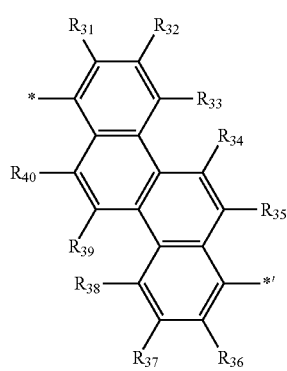

Formula 5H
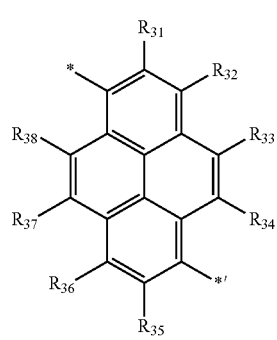

-continued

Formula 5D

Formula 5E

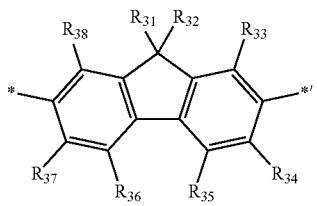 Formula 5I

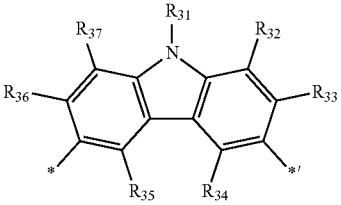 Formula 5J

In Formulae 5A to 5J, $R_{31}$ to $R_{40}$ may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{60}$ heteroaryl group, and —N($Q_{31}$)($Q_{32}$), $Q_{31}$ and $Q_{32}$ being each independently selected from a hydrogen atom, a $C_1$-$C_{10}$ alkyl group, a $C_6$-$C_{20}$ aryl group, and a $C_2$-$C_{20}$ heteroaryl group; and * indicates a binding site with an anthracene core in Formula 1.

In some embodiments, in Formulae 5A to 5J, $R_{31}$ to $R_{40}$ may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a dimethyl-fluorenyl group, a phenyl-carbazolyl group, a pyrenyl group, a chrysenyl group, a benzothiazolyl group, a benzoxazolyl group, a phenyl-benzoimidazolyl group, and —N($Q_{31}$)($Q_{32}$), $Q_{31}$ and $Q_{32}$ being each independently selected from a hydrogen atom, a $C_1$-$C_{10}$ alkyl group, a phenyl group, a naphthyl group, and an anthryl group.

In Formula 1 above, c and d may be each independently an integer from 1 to 3, and in some embodiments, c and d may be both 1. If c in Formula 1 is at least two, the at least two $L_1$'s may be the same or different. If d is at least two, the at least two $L_2$'s may be the same or different.

In Formula 1, $R_{11}$ and $R_{12}$ may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_6$ aryl group, a substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, —N($Q_1$)($Q_2$), and —Si($Q_3$)($Q_4$)($Q_5$), $Q_1$ to $Q_5$ each being independently selected from a hydrogen atom, a $C_1$-$C_{10}$ alkyl group, a $C_6$-$C_{20}$ aryl group, and a $C_2$-$C_{20}$ heteroaryl group.

In Formula 1 above, $R_1$ to $R_{12}$ may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a dimethyl-fluorenyl group, a phenyl-carbazolyl group, a pyrenyl group, and a chrysenyl group but are not limited thereto.

In Formula 1 above, a and b may be each independently an integer from 1 to 4. If a is 2 or greater, the at least two $R_1$ may be the same or different. If b is 2 or greater, the at least two $R_{12}$ may be the same or different.

In Formula 1 above, n may be 1; $R_1$, $R_2$, $R_4$ and $R_5$ may be each independently selected from a substituted or unsubstituted $C_1$-$C_{60}$ alkyl group and a 3- to 10-membered substituted or unsubstituted non-condensed ring group; $R_3$ may be a 3- to 10-membered substituted or unsubstituted non-condensed ring group; and $R_6$ may be selected from a unsubstituted non-condensed ring group and a substituted or unsubstituted condensed ring group in which at least two rings are fused to each other.

$R_1$ to $R_6$ are the same as described above.

In some other embodiments, $R_1$, $R_2$, $R_4$ and $R_5$ in Formula 1 may be each independently one of a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{60}$ heteroaryl group, and —N($Q_{11}$)($Q_{12}$), $Q_{11}$ and $Q_{12}$ being each independently selected from a hydrogen atom, a $C_1$-$C_{10}$ alkyl group, a $C_6$-$C_{20}$ aryl group, and a $C_2$-$C_{20}$ heteroaryl group; $R_1$, $R_2$, $R_4$ and $R_5$ in Formula 1 may be each independently one of the groups represented by Formula 2A to 2T above (for example, Formula 2G); $R_1$, $R_2$, $R_4$ and $R_5$ in Formula 1 may be each independently one of the groups represented by Formulae 3A to 3R above; $R_1$, $R_2$, $R_4$ and $R_5$ in Formula 1 may be each independently one of Formulae 4A to 4J; $R_3$ may be one of the groups represented by Formulae 2A to 2T (for example, Formula 2G); $R_6$ may be one of the groups represented by Formulae 3A to 3R; and $R_6$ may be one of the groups represented by Formulae 4A to 4J.

In some other embodiments, in Formula 1 above, n may be 1; $R_1$, $R_2$, $R_4$ and $R_5$ may be each independently selected from a substituted or unsubstituted $C_1$-$C_6$, alkyl group and a 3- to 10-membered substituted or unsubstituted non-condensed ring group; and $R_3$ and $R_6$ may be each independently selected from an unsubstituted non-condensed ring group and a substituted or unsubstituted condensed ring group in which at least two rings are fused to each other. $R_1$ to $R_6$ are the same as described above.

In some other embodiments, $R_1$ to $R_4$ in Formula 1 may be each independently one of a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{10}$ heteroaryl group, and —N($Q_{11}$)($Q_{12}$), $Q_{11}$ and $Q_{12}$ being each independently selected from a hydrogen atom, a $C_1$-$C_{10}$ alkyl group, a $C_6$-$C_{20}$ aryl group, and a $C_2$-$C_{20}$ heteroaryl group; $R_1$ to $R_4$ in Formula 1 may be each independently one of the groups represented by Formula 2A to 2T above (for example. Formula 2G); $R_1$ to $R_4$ in Formula 1 may be each independently one of the groups represented by Formulae 3A to 3R above; and $R_1$ to $R_4$ in Formula 1 may be each independently one of Formulae 4A to 4J. $R_3$ and $R_6$ may be each independently one of the groups represented by Formulae 3A to 3R; $R_3$ and $R_6$ may be each independently one of the groups represented by Formulae 4A to 4J.

In some embodiments, the anthracene-based compound of Formula 1 above may be one of the Compounds 1 to 24 below, but the anthracene-based compound of Formula 1 is not limited thereto.

1

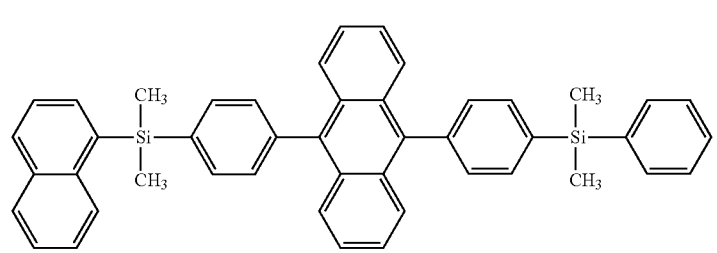

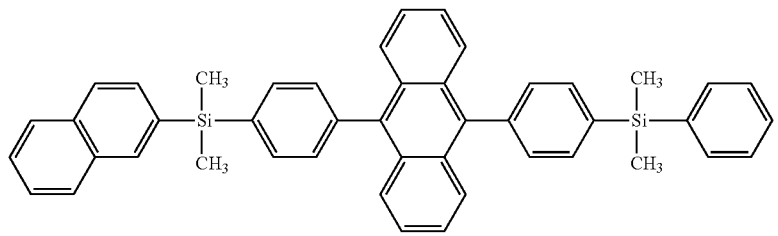
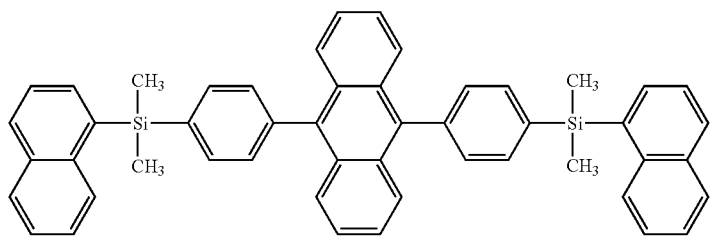
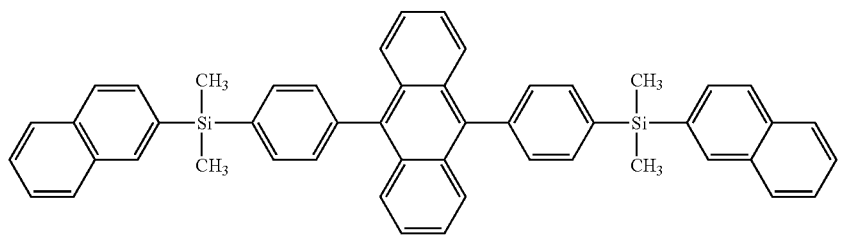
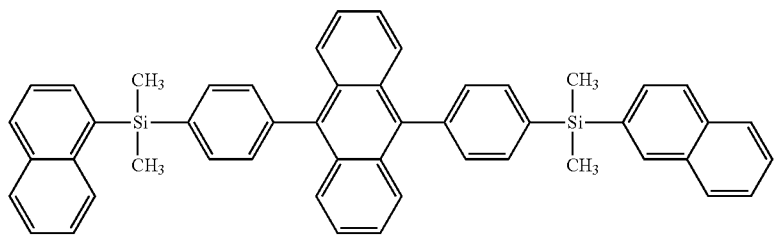
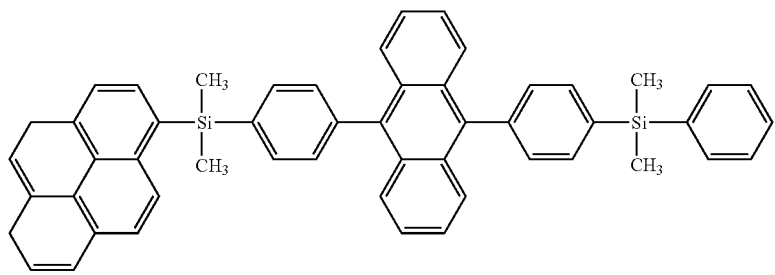
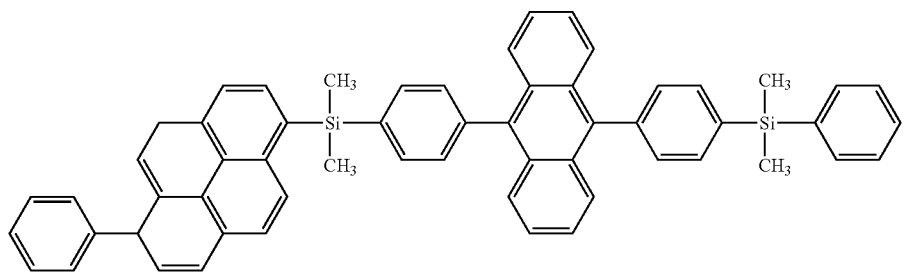

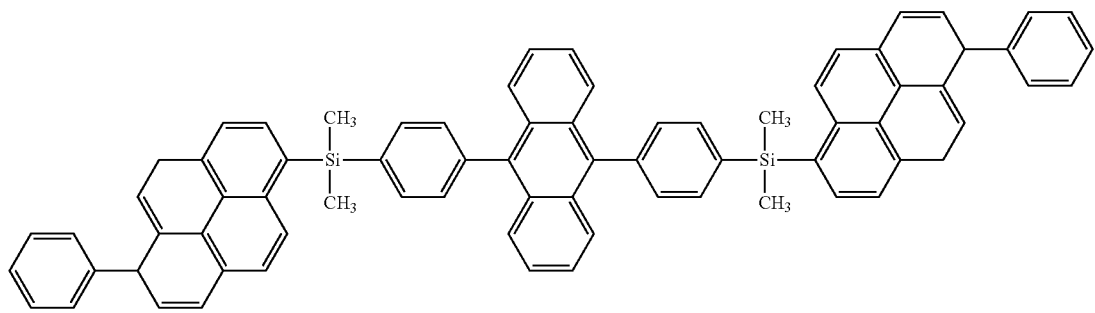
8
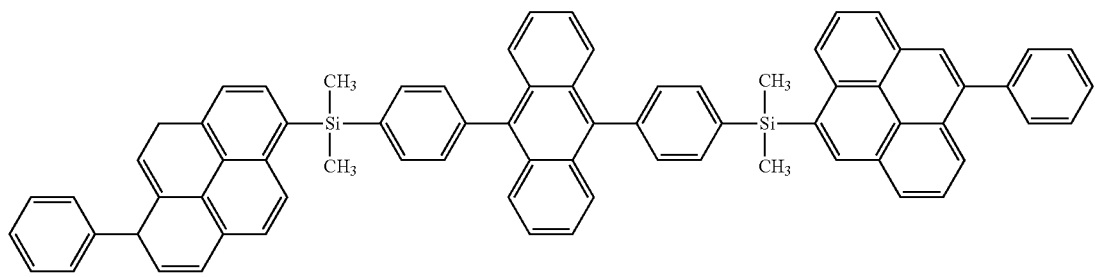
9
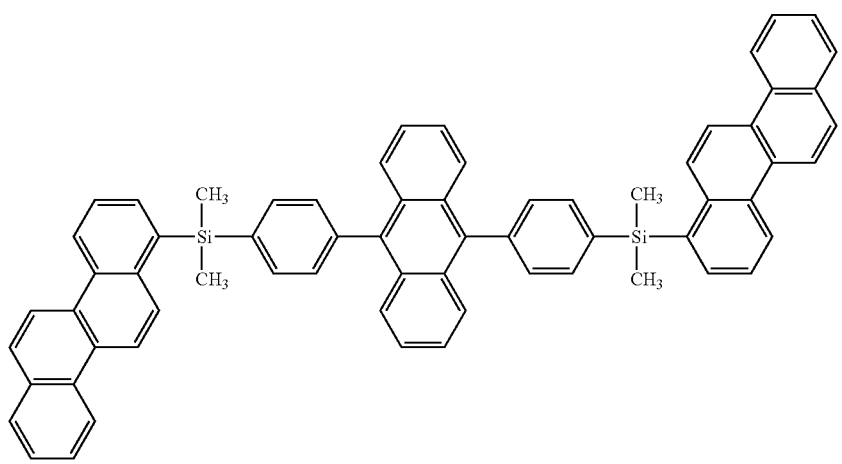
10
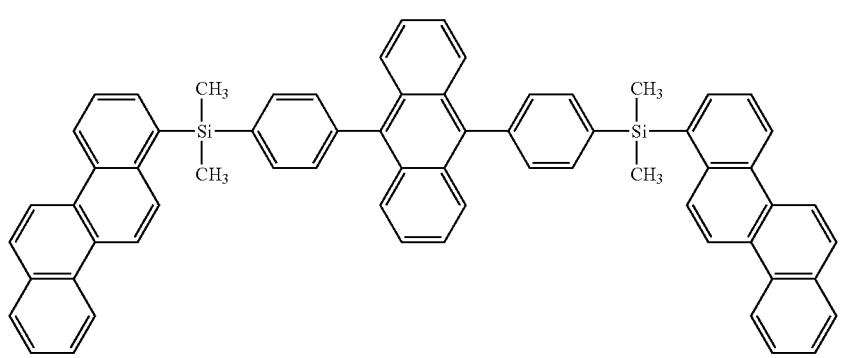
11
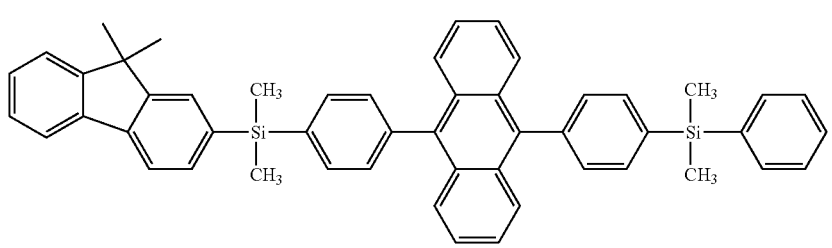
12

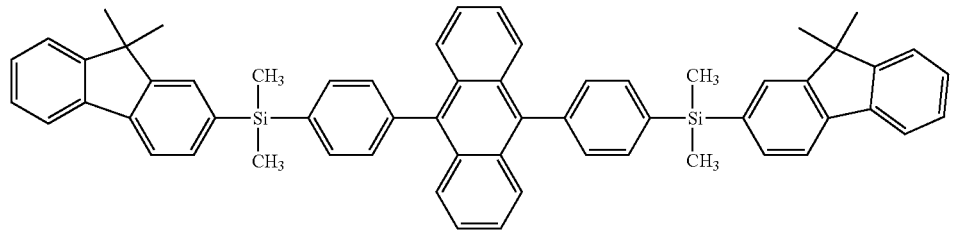
13
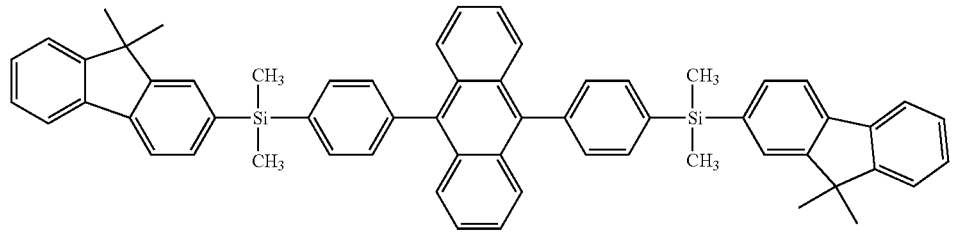
14
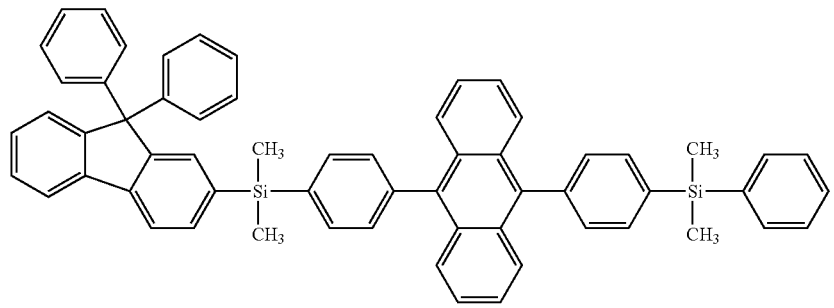
15
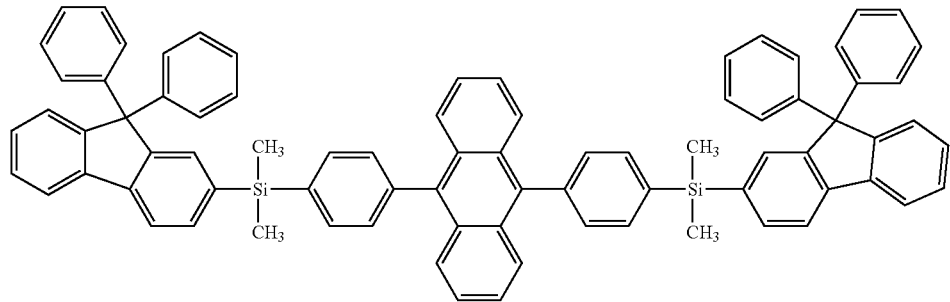
16
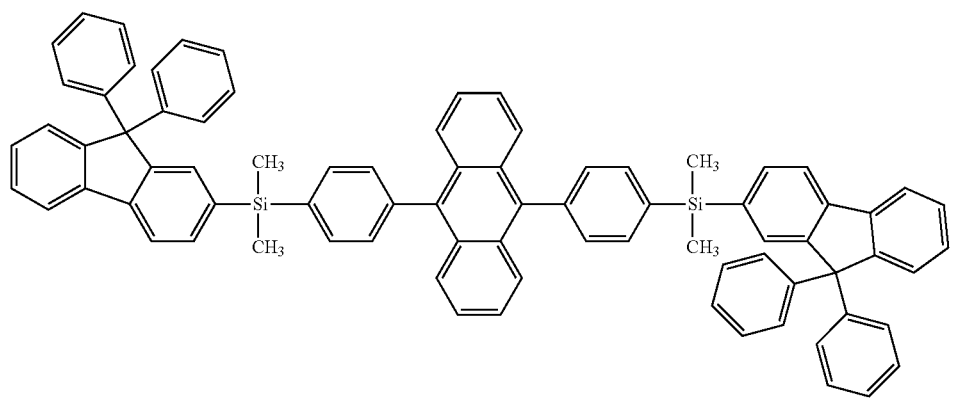
17

-continued
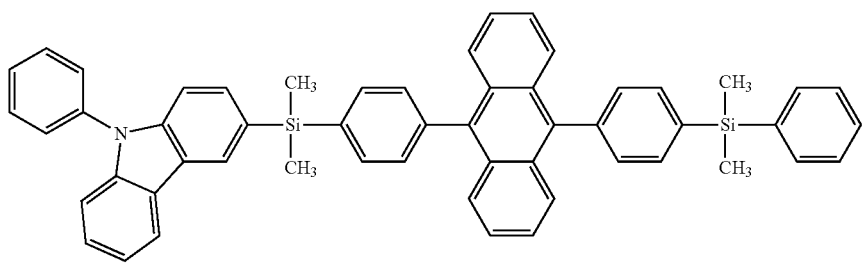
18
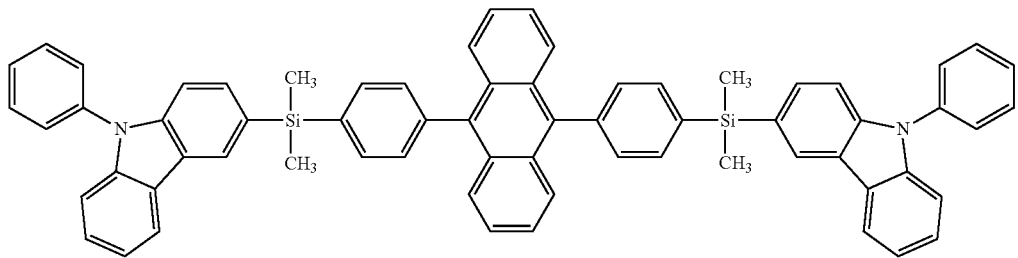
19
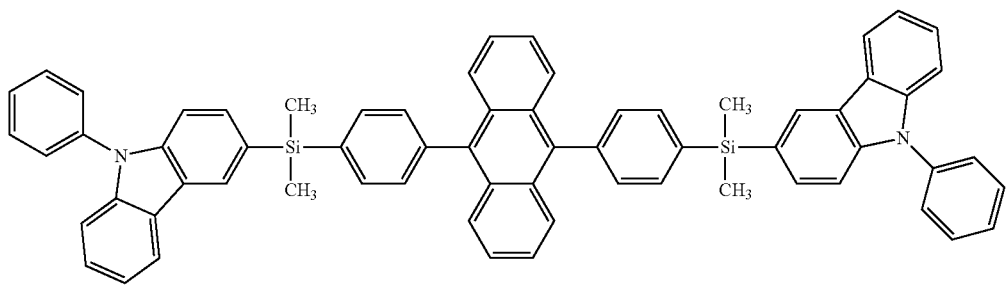
20
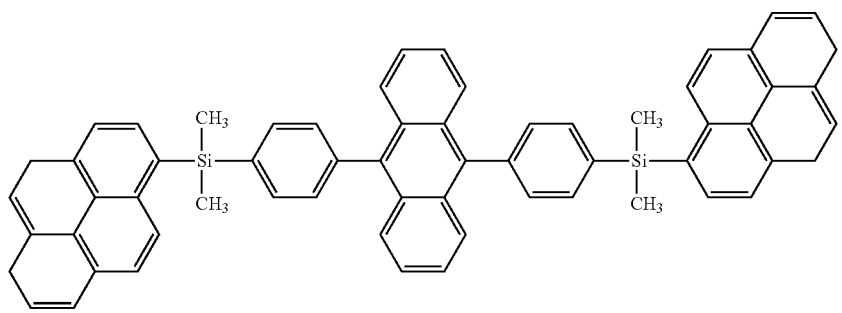
21
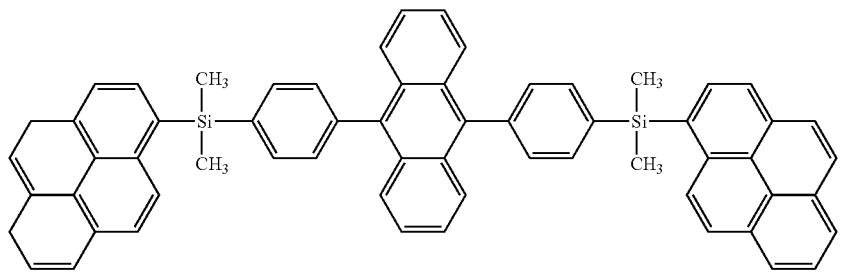
22

-continued

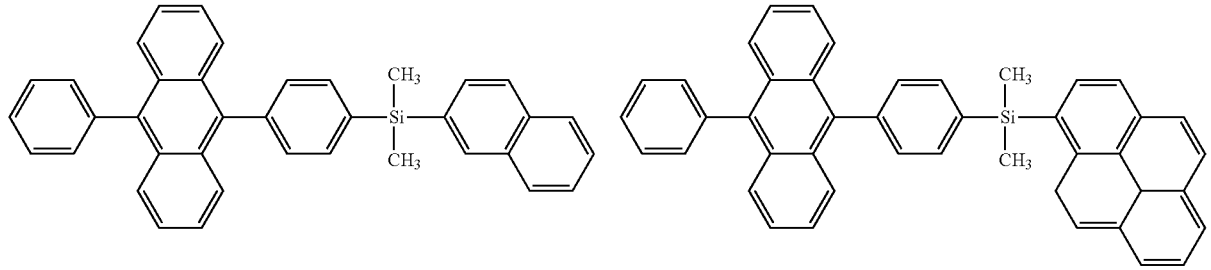

A dopant in the EML may be a blue dopant emitting blue light. For example, the dopant may be a blue dopant emitting blue light based on a fluorescence emission mechanism. In some embodiments, the dopant may be a blue fluorescent dopant including at least one diarylamino group (for example, including two di($C_6$-$C_{60}$ aryl)amino groups).

In some embodiments, the dopant may include a compound represented by Formula 20 below.

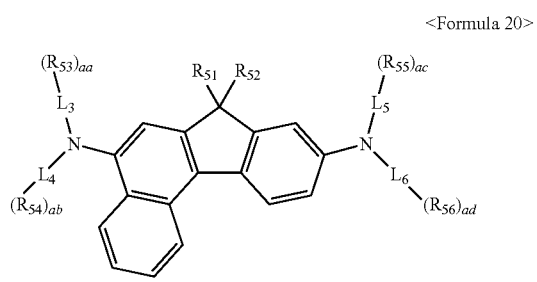

<Formula 20>

In Formula 20, $R_{51}$ and $R_{52}$ may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, and a substituted or unsubstituted $C_2$-$C_{60}$ heteroaryl group.

For example, $R_{51}$ and $R_{52}$ may be each independently one of a $C_1$-$C_{20}$ alkyl group, a $C_1$-$C_{20}$ alkoxy group, a phenyl group, a naphthyl group, an anthryl group, a pyrenyl group, and a chrysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group and a chrysenyl group.

In some embodiments, $R_{55}$ and $R_{52}$ may be linked via a single bond or a substituted or unsubstituted $C_1$-$C_{10}$ alkylene group. In some embodiments. $R_{51}$ and $R_{52}$ may be each independently one of a phenyl group, a naphthyl group, an anthryl group, a pyrenyl group, and a chrysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group and a chrysenyl group; and $R_{51}$ and $R_{52}$ may be linked to each other via a single bond (refer to Formulae 20C, 20C, and 20D below).

In Formula 20 above. $L_3$ to $L_6$ may be each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group.

In some embodiments, $L_3$ to $L_6$ in Formula 20 above may be each independently selected from a substituted or unsubstituted phenylene group, a substituted or unsubstituted naphthylene group, a substituted or unsubstituted anthrylene group, a substituted or unsubstituted pyrenylene group, a substituted or unsubstituted chrysenylene group, and a substituted or unsubstituted phenanthrenylene group.

In some embodiments, $L_3$ to $L_6$ in Formula 20 may be each independently one of a phenylene group, a naphthylene group, an anthrylene group, a pyrenylene group, a chrysenylene group, and a phenanthrenylene group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and an anthryl group, but substitutions are not limited thereto.

In Formula 20, $R_{53}$ to $R_{56}$ may be each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, substituted or unsubstituted $C_6$-$C_{60}$ aryloxy group, a substituted or unsubstituted $C_6$-$C_{60}$ arylthiol group, a substituted or unsubstituted $C_2$-$C_6$, heteroaryl group, —N($Q_{41}$)($Q_{42}$), and —Si($Q_{43}$)($Q_{44}$)($Q_{45}$), $Q_{41}$ to $Q_{45}$ being each independently selected from a hydrogen atom, a $C_1$-$C_{60}$ alkyl group, a $C_6$-$C_{60}$ aryl group, and a $C_2$-$C_6$ heteroaryl group.

In some embodiments, at least one of $R_{53}$ to $R_{56}$ in Formula 20 may be Si($Q_{43}$)($Q_{44}$)($Q_{45}$), $Q_{43}$ to $Q_{43}$ being each independently selected from a hydrogen atom, a $C_1$-$C_{60}$ alkyl group, a $C_6$-$C_{60}$ aryl group, and a $C_2$-$C_{60}$ heteroaryl group.

In Formula 20, $R_{53}$ to $R_{56}$ may be each independently a substituent selected from one of substituent Groups A, B and C, Group A comprising a hydrogen atom, a deuterium atom, a halogen atom, a hydroxyl group, a cyano group, a nitro group, an amino group, an amidino group, a hydrazine, a hydrazone, a carboxylic group or a salt thereof, sulfonic acid group or a salt thereof, a phosphoric acid group or a salt thereof. Group B comprising a $C_1$-$C_{20}$ alkyl group, a $C_1$-$C_{20}$ alkoxy group, a phenyl group, a naphthyl group, an anthryl group, a pyrenyl group, and a chrysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof a $C_1$-$C_{20}$ alkyl group, a $C_1$-$C_{20}$ alkoxy group, a phenyl group, a naphthyl group, an anthryl group, a pyrenyl group, and a chrysenyl group, and Group C comprising —N($Q_{41}$)($Q_{42}$) and —Si($Q_{43}$)($Q_{44}$)($Q_{45}$), $Q_{41}$ to $Q_{45}$ being each independently selected from a hydrogen atom, a $C_1$-$C_{20}$ alkyl group, a phenyl group, a naphthyl group, an anthryl group, a pyrenyl group, and a chrysenyl group but $R_{53}$ to $R_{56}$ are not limited thereto.

In Formula 20 above, aa, ab, ac and ad may be each independently an integer from 0 to 5. If aa is 2 or greater, the at least two $R_{53}$ may be the same or different. If ab is 2 or greater, the at least two $R_{54}$ may be the same or different. If ac is 2 or greater, the at least two $R_{55}$ may be the same or different. If ad is 2 or greater, the at least two $R_{56}$ may be the same or different.

The dopant may include a compound represented by one of Formulae 20A to 20D below.

<Formula 20A>

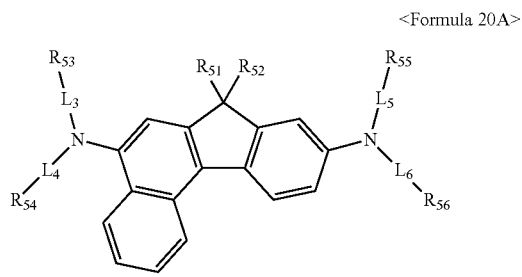

<Formula 20B>

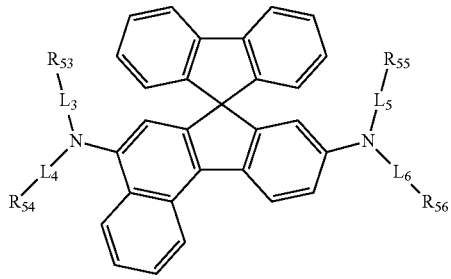

<Formula 20C>

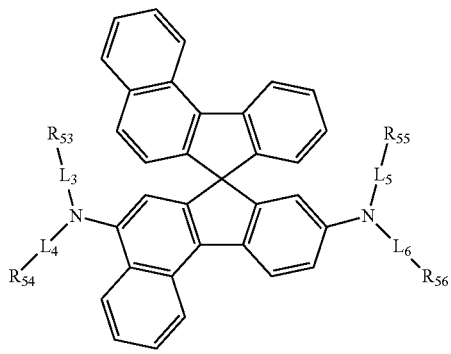

<Formula 20D>

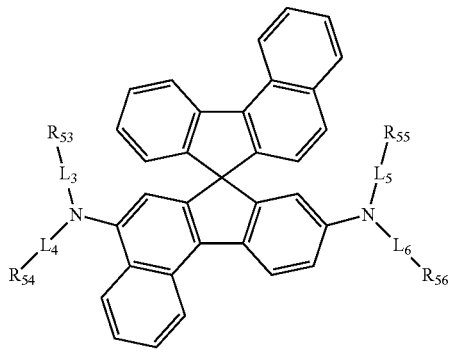

In Formulae 20A to 20D, $R_{51}$ and $R_{52}$ may be each independently one of a $C_1$-$C_{20}$ alkyl group, a $C_1$-$C_{20}$ alkoxy group, a phenyl group, a naphthyl group, an anthryl group, a pyrenyl group, and a chrysenyl group, any of which may be substituted with at least one of a deuterium atom, a halogen atom, a hydroxyl group, a cyano group, a nitro group, an amino group, an amidino group, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group and a chrysenyl group; $L_3$ to $L_6$ are each independently one of a phenylene group, a naphthylene group, an anthrylene group, and a phenanthrenylene group, any of which may be substituted with at least one of a deuterium atom, a halogen atom, a hydroxyl group, a cyano group, a nitro group, an amino group, an amidino group, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and an anthryl group; $R_{53}$ to $R_{56}$ being each independently a substituent selected from one of substituent Groups A, B and C, Group A comprising a hydrogen atom, a deuterium atom, a halogen atom, a hydroxyl group, a cyano group, a nitro group, an amino group, an amidino group, hydrazine, hydrazone, a carboxylic group or a salt thereof, sulfonic acid group or a salt thereof, and a phosphoric acid group or a salt thereof, Group B comprising a $C_1$-$C_{20}$ alkyl group, a $C_1$-$C_{20}$ alkoxy group, a phenyl group, a naphthyl group, an anthryl group, a pyrenyl group, and a chrysenyl group, any of which may be substituted with at least one of a deuterium atom, a halogen atom, a hydroxyl group, a cyano group, a nitro group, an amino group, an amidino group, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group, and a chrysenyl group, and Group C comprising —$N(Q_{41})(Q_{42})$ and —$Si(Q_{43})(Q_{44})(Q_{45})$, $Q_{41}$ to $Q_{45}$ being each independently selected from a hydrogen atom, a $C_1$-$C_{20}$ alkyl group, a phenyl group, a naphthyl group, an anthryl group, a pyrenyl group, and a chrysenyl group.

In an embodiment, the dopant may be represented by Formula 20(1) below but is not limited thereto.

<Formula 20(1)>

$R_{51}$ to $R_{56}$ in Formula 20(1) are the same as described above.

In some embodiments, $R_{51}$ and $R_{52}$ in Formula 20(1) may be each independently one of a $C_1$-$C_{20}$ alkyl group, a $C_1$-$C_{20}$ alkoxy group, a phenyl group, a naphthyl group, an anthryl group, a pyrenyl group, and a chrysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group and a chrysenyl group.

$R_{53}$ to $R_{56}$ in Formula 20(1) may be each independently a substituent selected from one of substituent Groups A, B and C, Group A comprising a hydrogen atom, a deuterium atom, a halogen atom, a hydroxyl group, a cyano group, a nitro group, an amino group, an amidino group, a hydrazine, a hydrazone, a carboxylic group or a salt thereof, sulfonic acid group or a salt thereof, and a phosphoric group or a salt thereof, Group B comprising a $C_1$-$C_{20}$ alkyl group, a $C_1$-$C_{20}$ alkoxy group, a phenyl group, a naphthyl group, an anthryl group, a pyrenyl group, and a chrysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group, and a chrysenyl group, and Group C comprising —$N(Q_{41})(Q_{42})$ and —$Si(Q_{43})(Q_{44})(Q_{45})$, $Q_{41}$ to $Q_{45}$ being each independently selected from a hydrogen atom, a $C_1$-$C_{20}$ alkyl group, a phenyl group, a naphthyl group, an anthryl group, a pyrenyl group and a chrysenyl group but $R_{53}$ to $R_{56}$ are not limited thereto.

In some embodiments, the dopant may include one of the compounds D1 to D68 below.

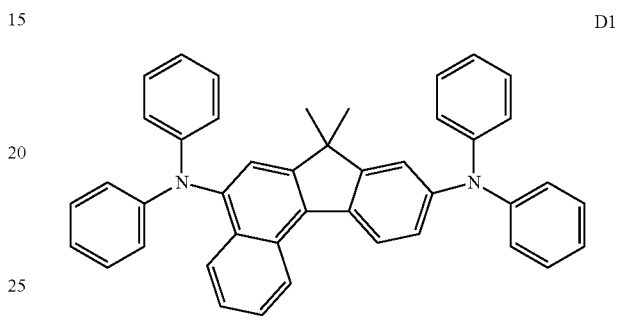

D1

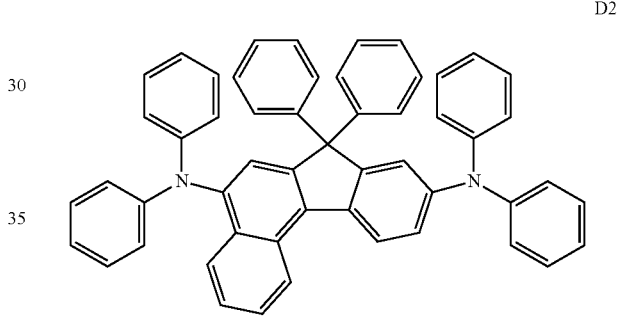

D2

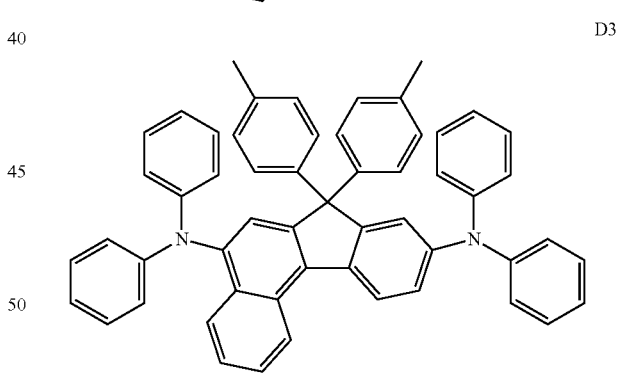

D3

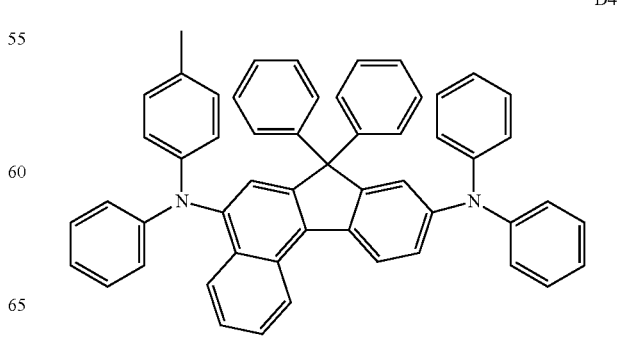

D4

D5
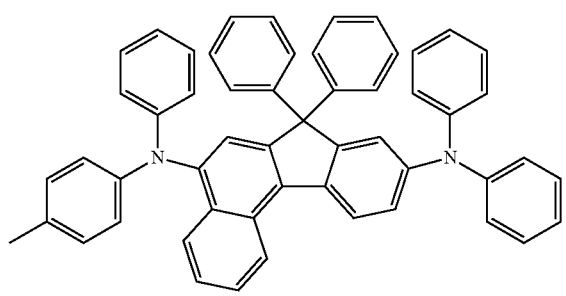
D6
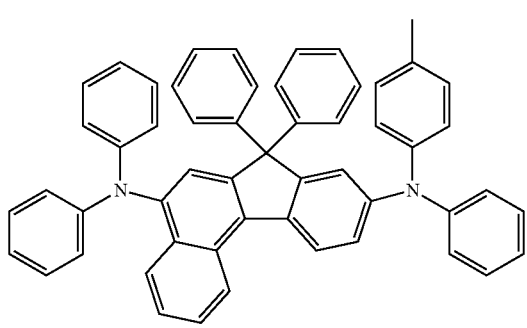
D7
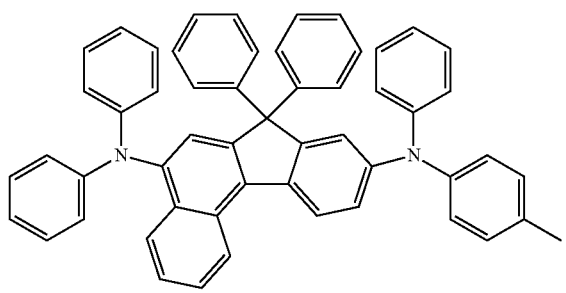
D8
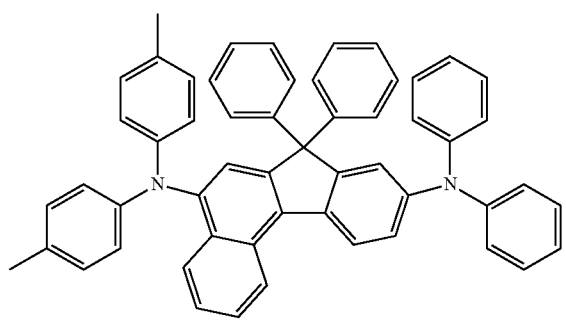
D9
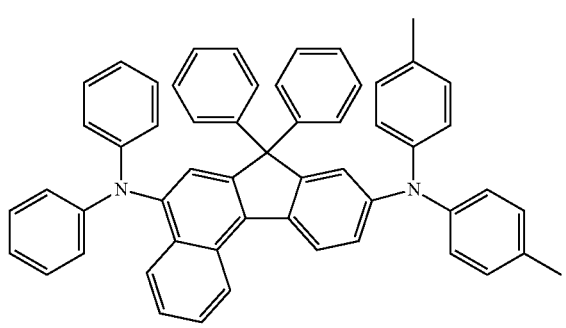
D10
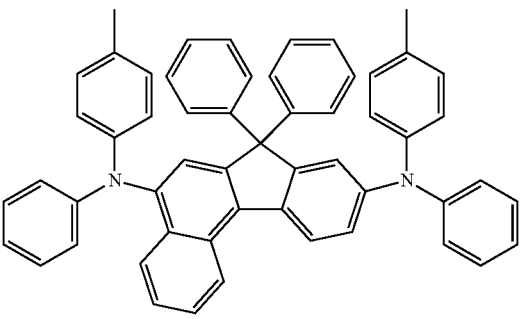
D11
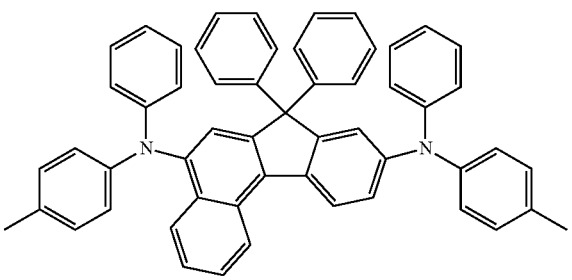
D12
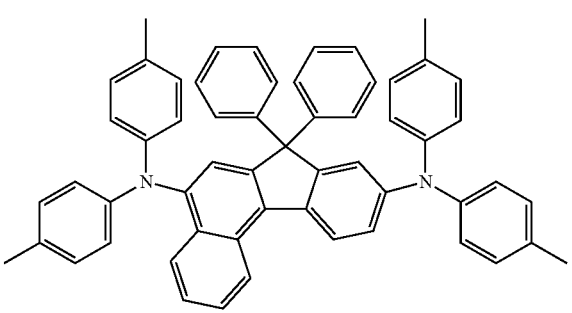
D13
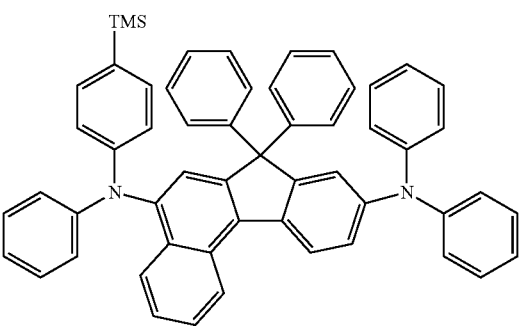
D14
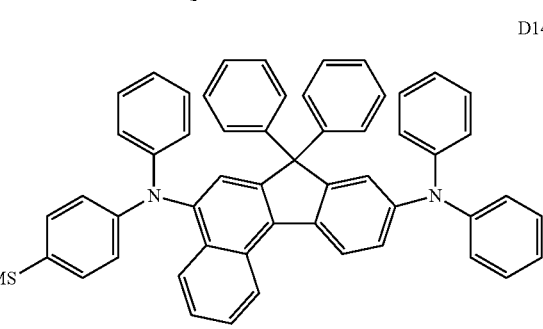

D15
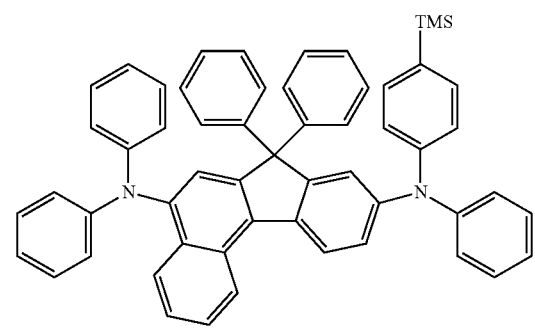
D16
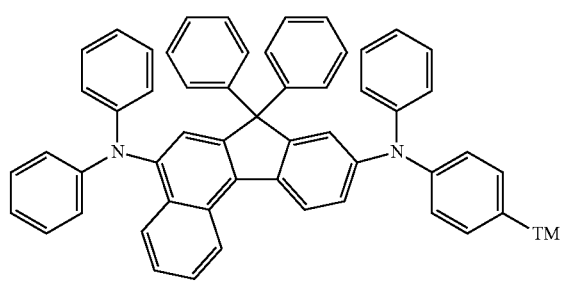
D17
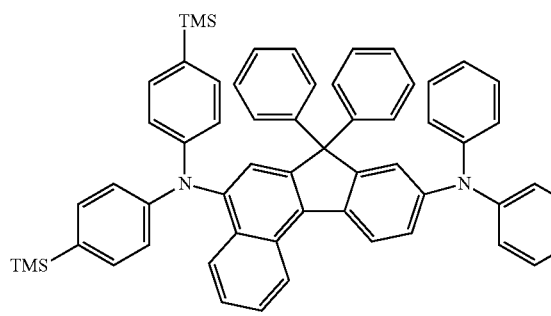
D18
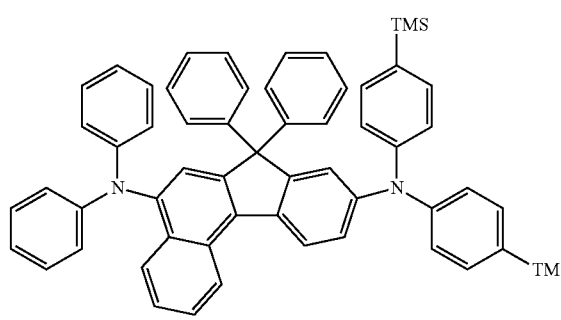
D19
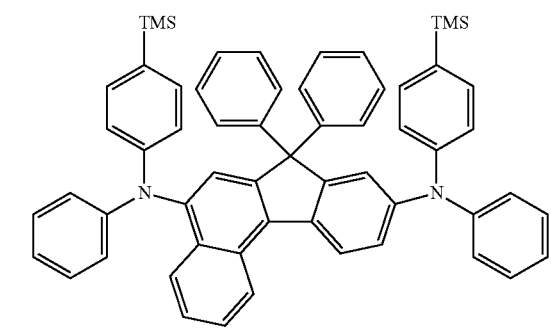
D20
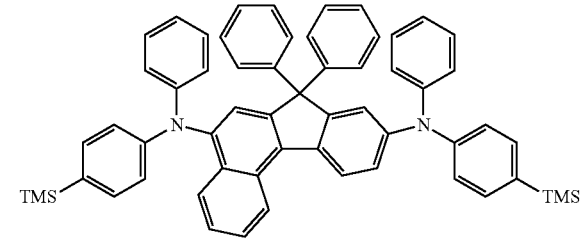
D21
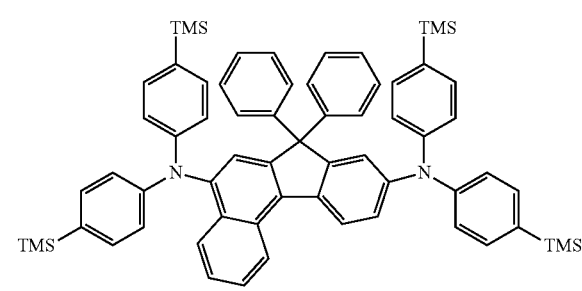
D22
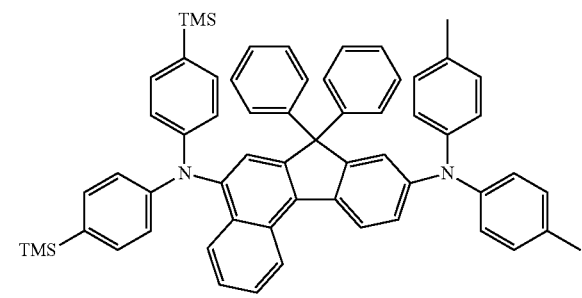
D23
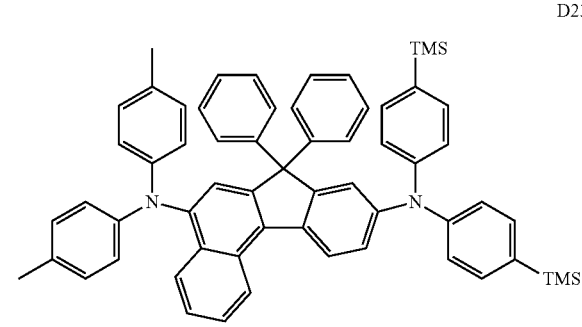
D24
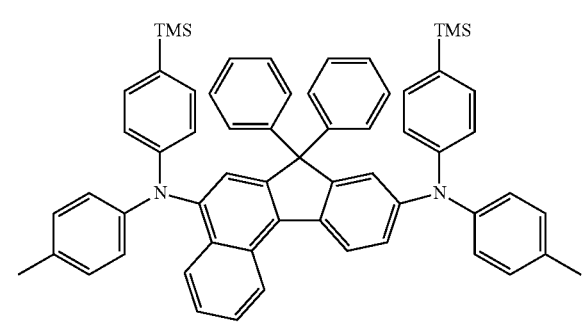

D25
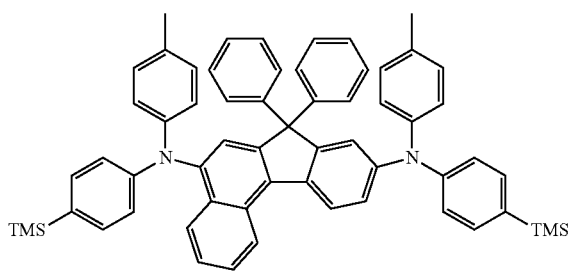
D26
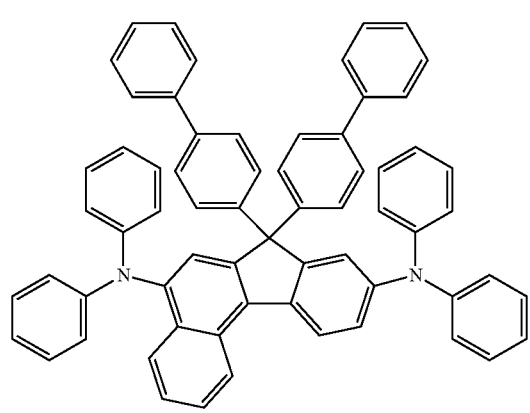
D27
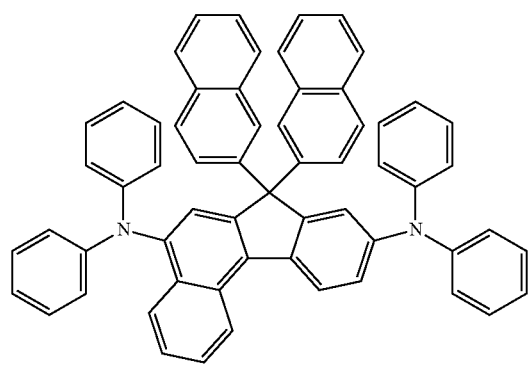
D28
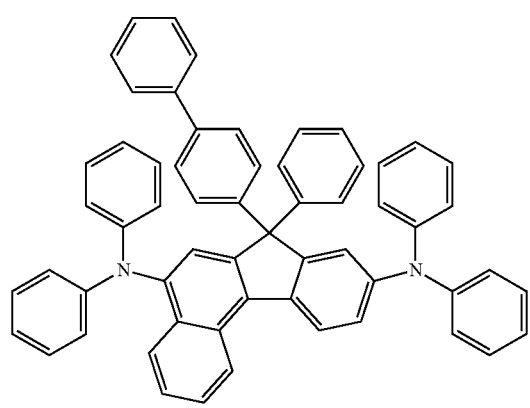
D29
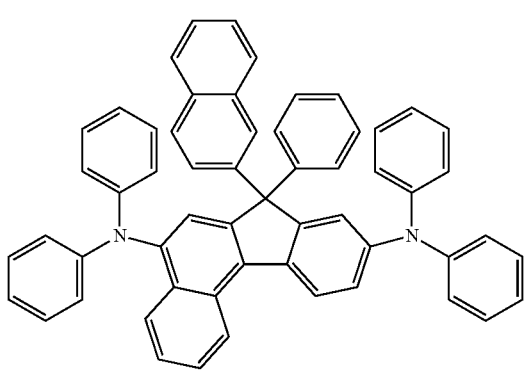
D30
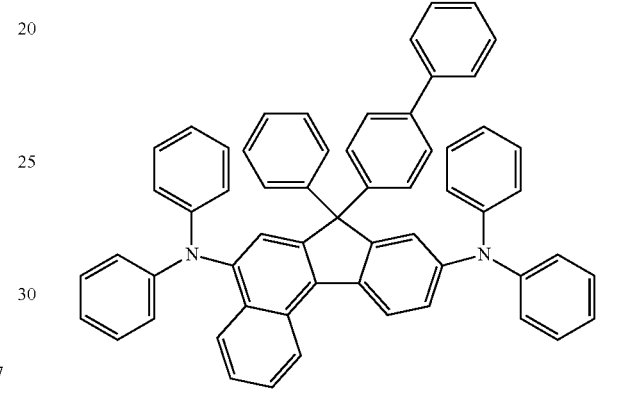
D31
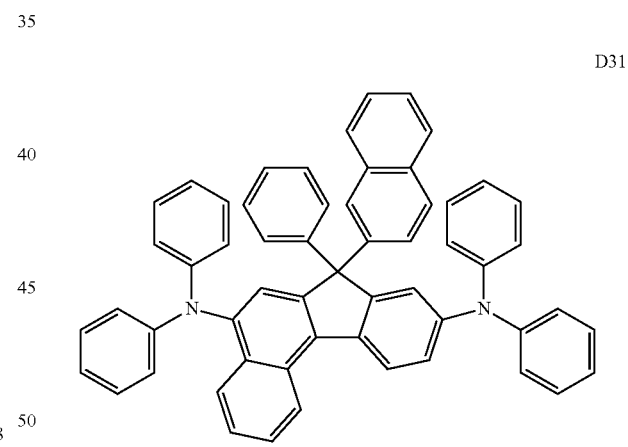
D32
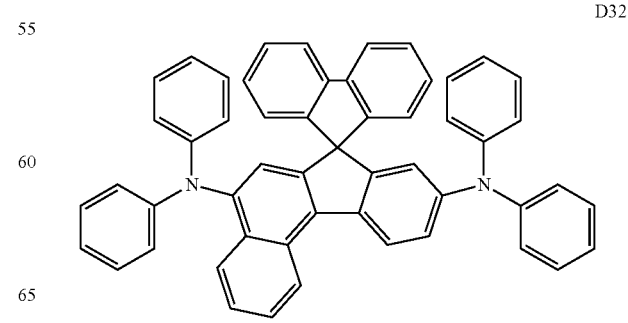

D33
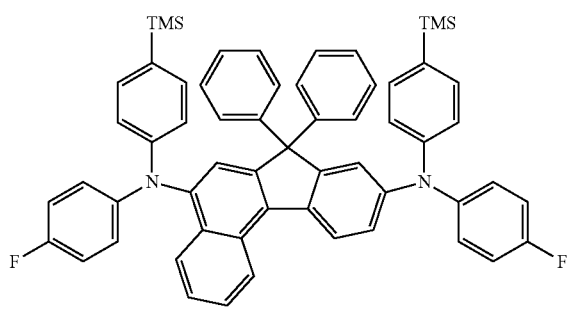
D34
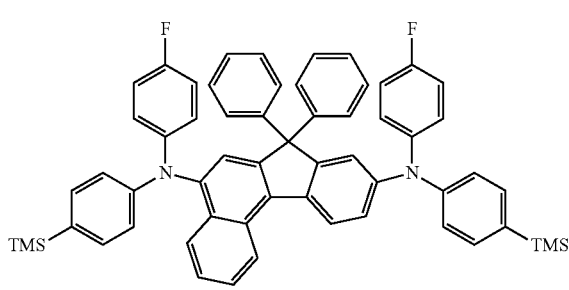
D35
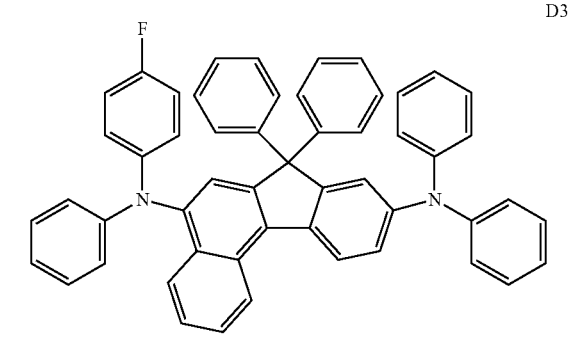
D36
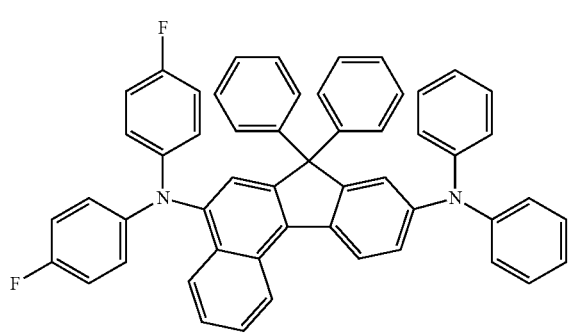
D37
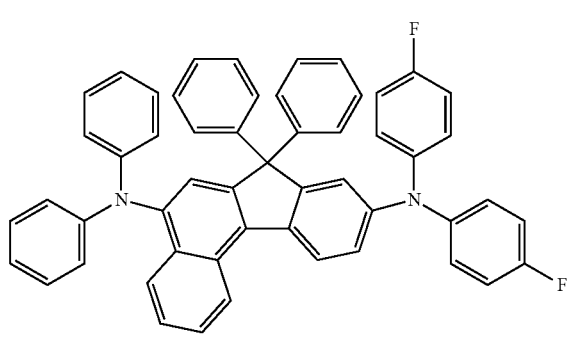
D38
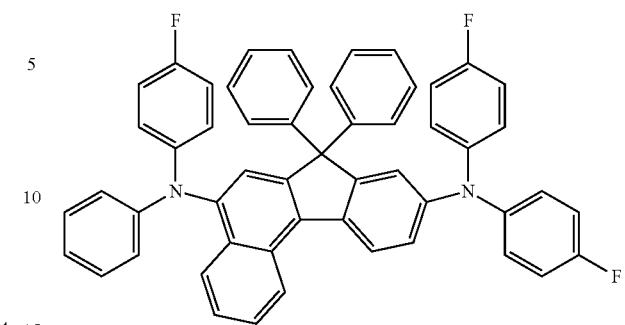
D39
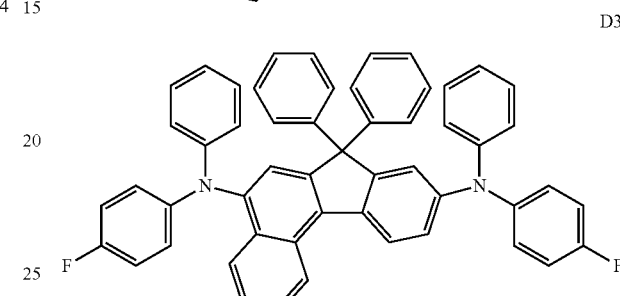
D40
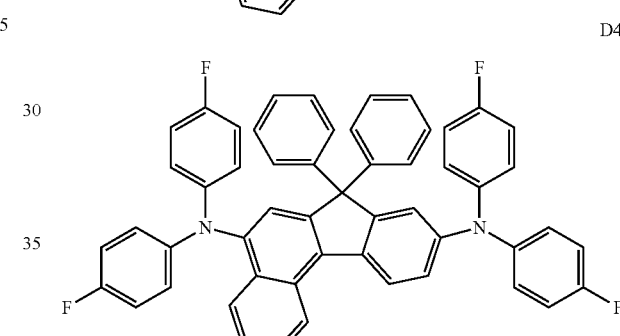
D41
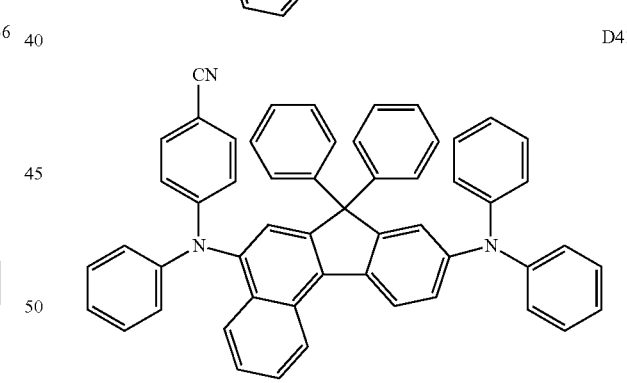
D42
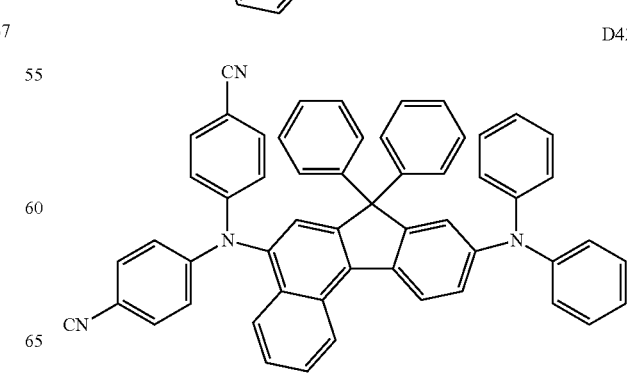

D43
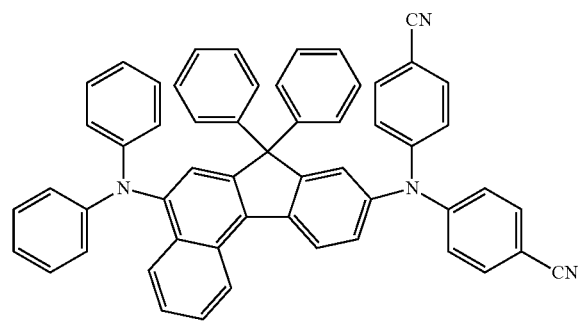
D44
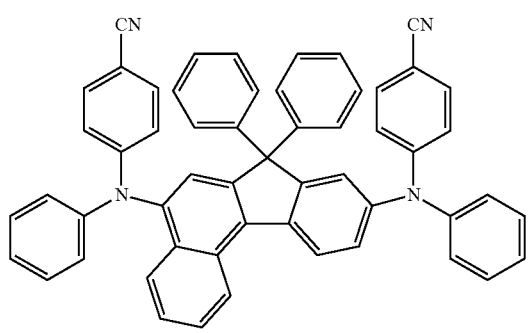
D45
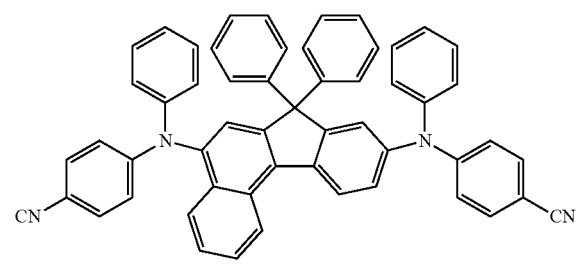
D46
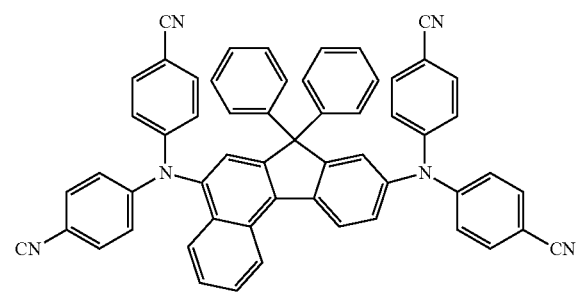
D47
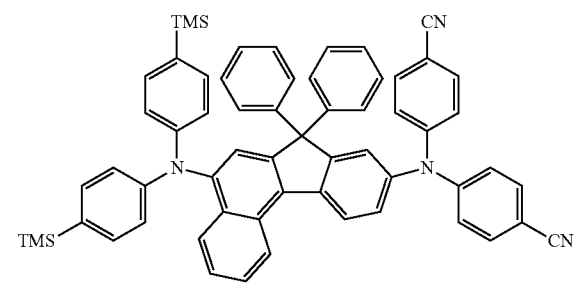
D48
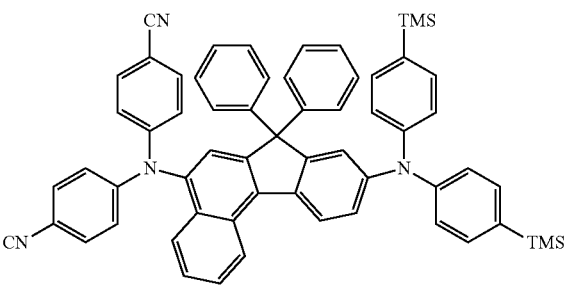
D49
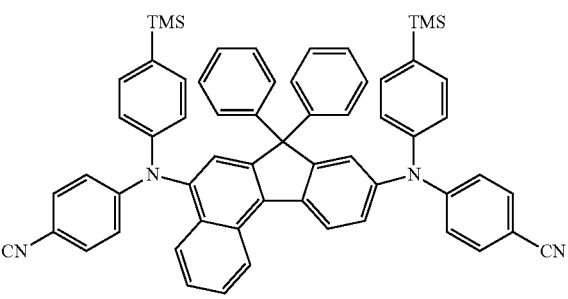
D50
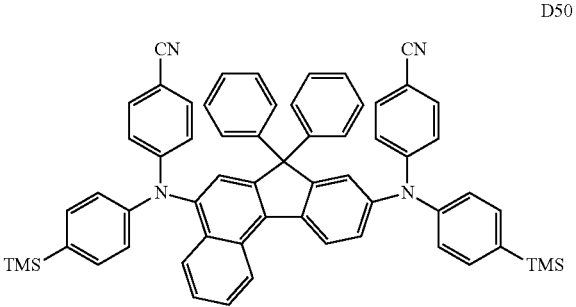
D51
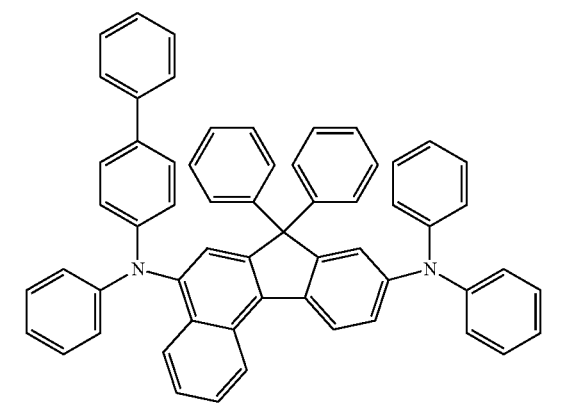

-continued
D52
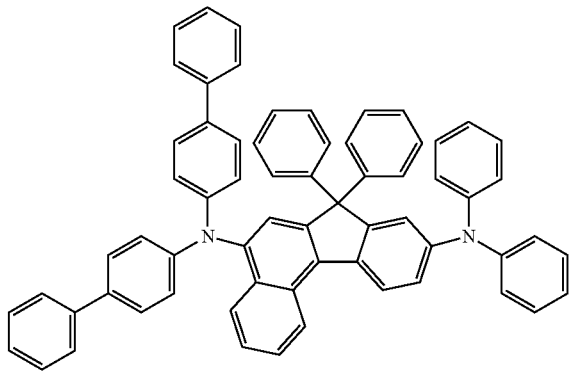
D53
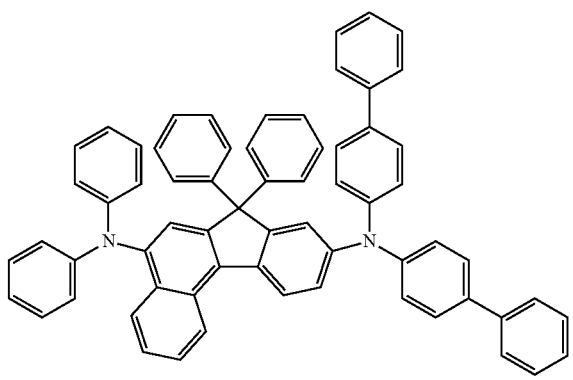
D54
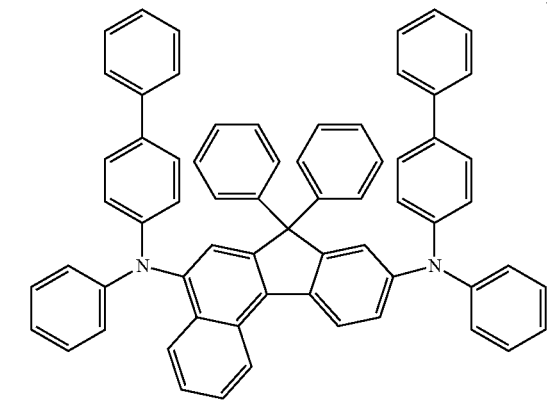
D55
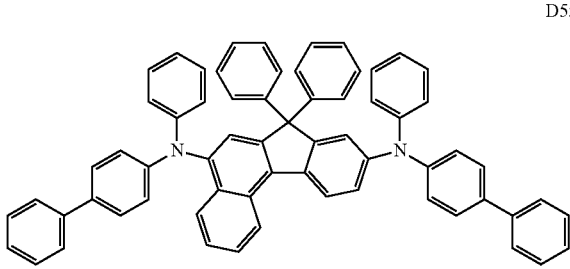
-continued
D56
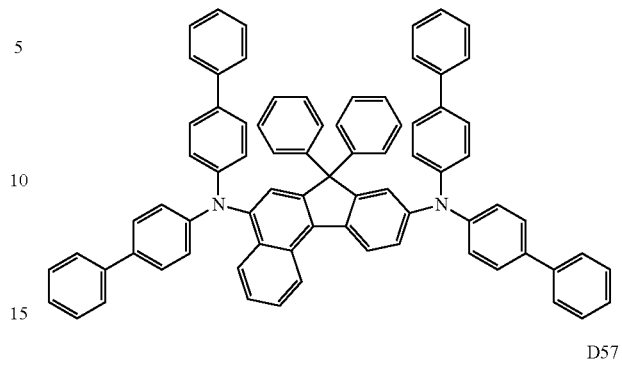
D57
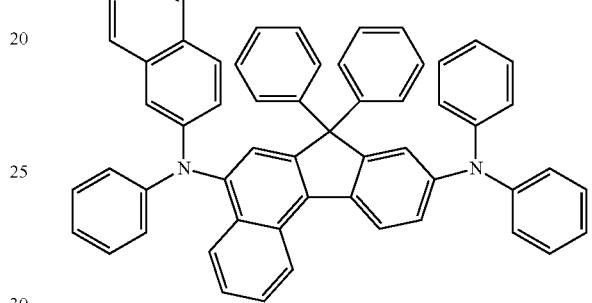
D58
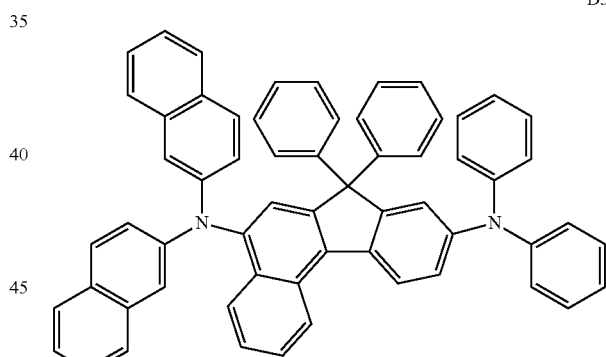
D59
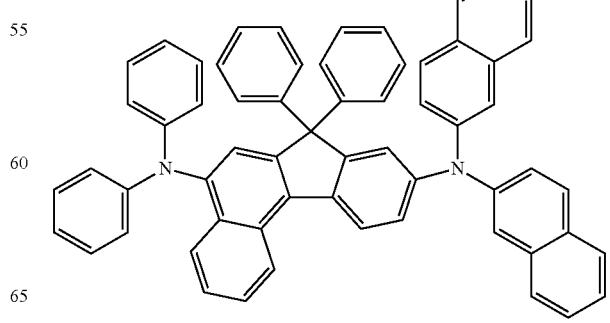

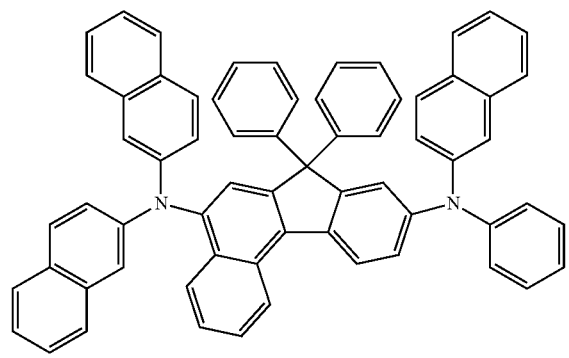
D60
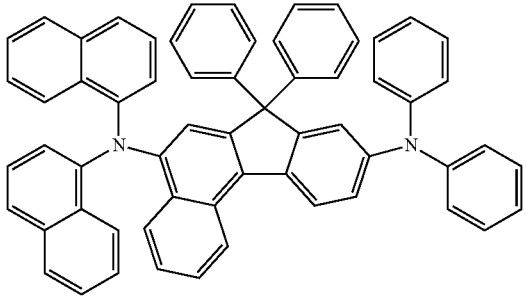
D64
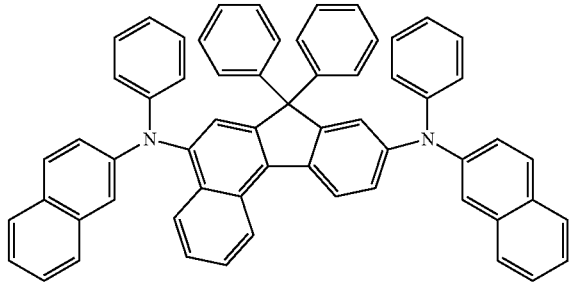
D61
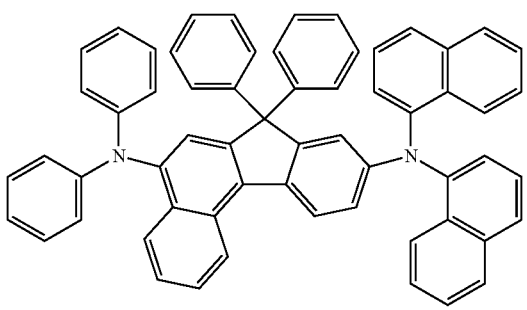
D65
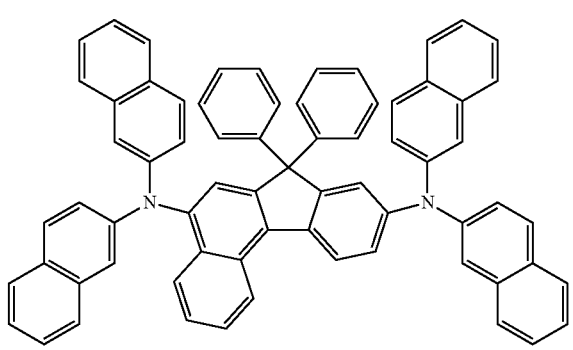
D62
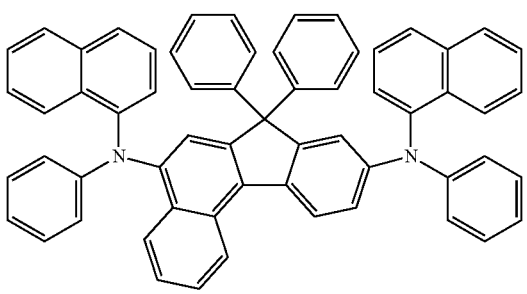
D66
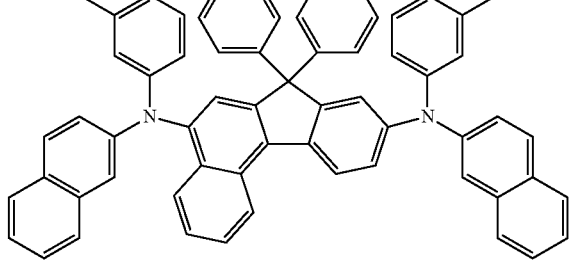
D63
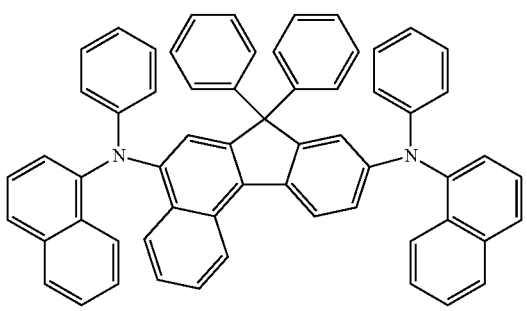
D67
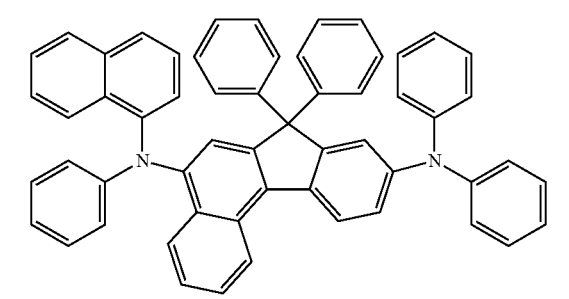
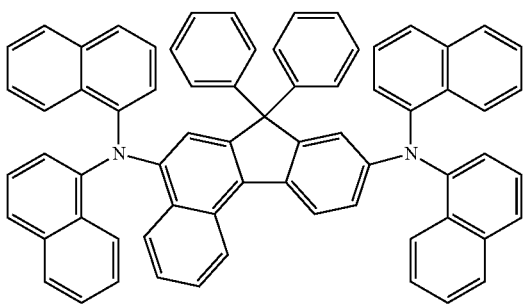
D68

A weight ratio of the weight of the host in the emission layer to the weight of the entire emission layer may be from about 0.1:99.9 (0.1%) to about 20:80 (25%). If the weight ratio is within this range, improved light-emitting efficiency may be obtained.

The anthracene-based compound represented by Formula 1 includes essentially "a substituted or unsubstituted condensed ring group in which at least two rings are fused to each other" as a Si substituent and thus may have a cascade structure with high light-emitting efficiency. Therefore, when the anthracene-based compound of Formula 1 above is used as a host in an emission layer of an organic light-emitting device, the organic light-emitting device may have a high efficiency and a long lifetime. When the anthracene-based compound of Formula 1 above is used as a host and the compound of Formula 20 above is used as a dopant, these two compounds may have very high energy transfer efficiency, and thus this host/dopant combination may provide a high light-emitting efficiency and improve the lifetime characteristics of an organic light-emitting device when used in the emission layer of the organic light-emitting device.

When the organic light-emitting device is a full color organic light-emitting device, the emission layer may be patterned into a red emission layer, a green emission layer, and a blue emission layer. In some embodiments, the emission layer may include at least two of the red emission layer, the green emission layer and the blue emission layer, the at least two emission layers being stacked upon one another, and the combination of the at least two emission layers may emit white light. The blue emission layer may include a host and a dopant as described above.

At least one of the red emission layer and the green emission layer may include a dopant, which may be one of the following compounds. Non-limiting examples of the red dopant are compounds represented by the following formulae.

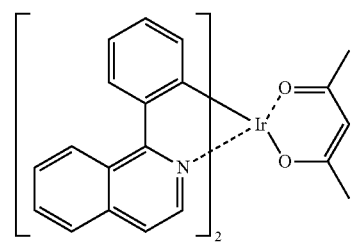

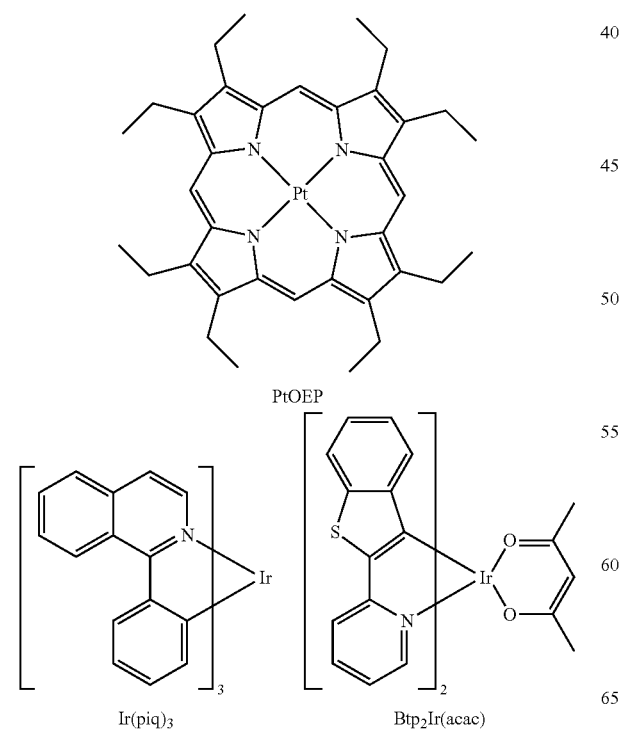

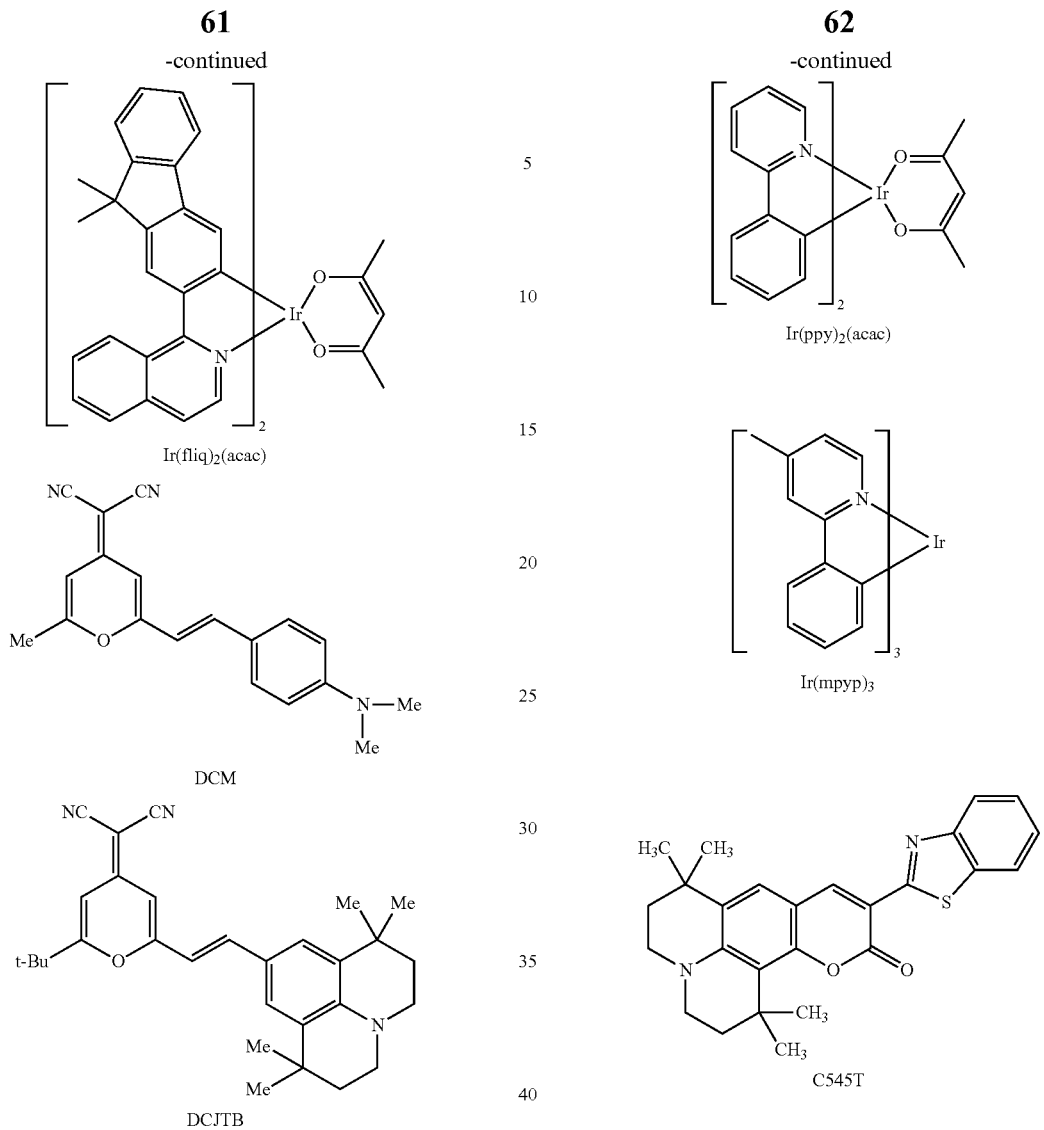

Non-limiting examples of the green dopant are compounds represented by the following formulae (ppy=phenylpyridine). In an embodiment, the green dopant may be C545T, as represented below.

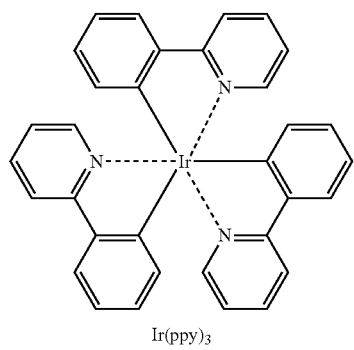

The thickness of the EML may be from about 100 Å to about 1000 Å, and, in some embodiments, may be from about 200 Å to about 600 Å. When the thickness of the EML is within these ranges, the EML may have good light emitting ability without imparting a high driving voltage to the organic light-emitting device.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary according to a compound that is used to form the ETL.

A material for forming the ETL may be any material that can stably transport electrons injected from an electron injecting electrode (cathode). Non-limiting examples of materials for forming the ETL are a quinoline derivative, such as tris(8-quinolinorate)aluminum (Alq3), 3-(4-biphenylyl)-4-phenyl-5-(4-tert-butylphenyl)-1,2,4-triazole (TAZ), aluminum(III) bis(2-methyl-8-quinolinato) 4-phenylphenolate (BAlq), beryllium bis(benzoquinolin-10-olate (Bebq$_2$), 9,10-di(naphthalene-2-yl)anthracene (ADN), Compound 201, and Compound 202 but are not limited thereto.

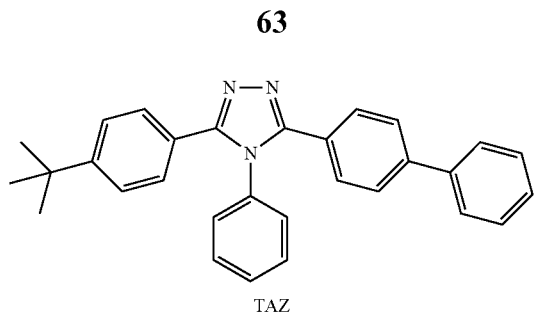

TAZ

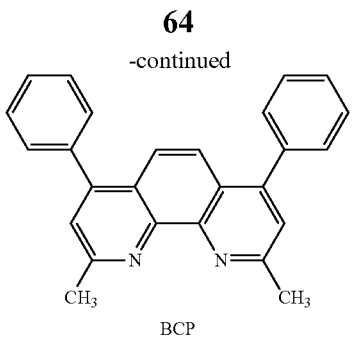

BCP

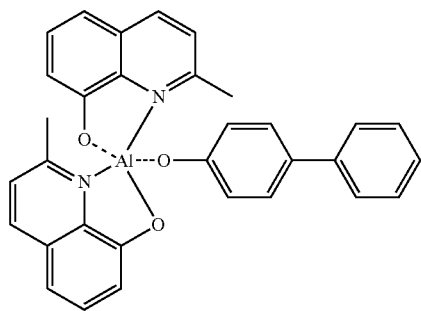

BAlq

The thickness of the ETL may be from about 100 Å to about 1,000 Å, and, in some embodiments, may be from about 150 Å to about 500 Å. When the thickness of the ETL is within these ranges, the ETL may have satisfactory electron transporting ability without imparting a high driving voltage to the light emitting device.

In some embodiments the ETL may further include a metal-containing material in addition to an electron-transporting organic compound.

The metal-containing material may include a lithium (Li) complex. Non-limiting examples of the Li complex are lithium quinolate (LiQ) and Compound 203 below.

<Compound 201>

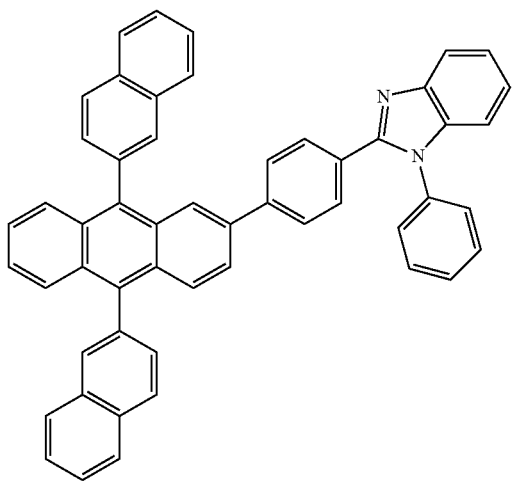

<Compound 203>

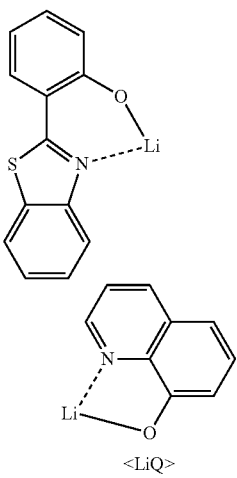

<LiQ>

<Compound 202>

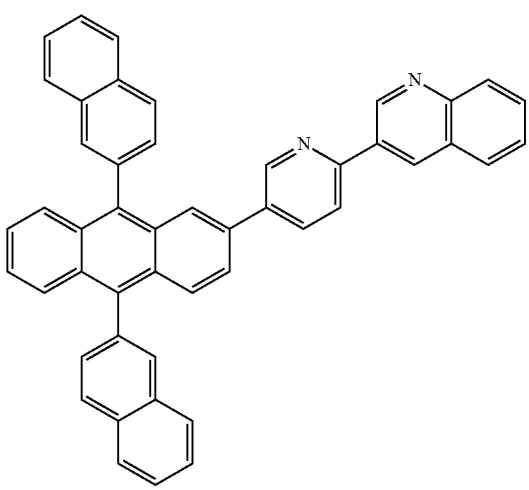

Then, an EIL, which facilitates injection of electrons from the cathode, may be formed on the ETL. Any suitable electron-injecting material may be used to form the EIL.

Non-limiting examples of materials for forming the EIL are LiF, NaCl, CsF, $Li_2O$, and BaO, which are known in the art.

The deposition and coating conditions for forming the EIL may be similar to those for the formation of the HIL, though the deposition and coating conditions may vary according to the material that is used to form the EIL.

The thickness of the EIL may be from about 1 Å to about 100 Å, and, in some embodiments, may be from about 3 Å to about 90 Å. When the thickness of the EIL is within these ranges, the EIL may have satisfactory electron injection ability without imparting a high driving voltage to the organic light-emitting device.

The second electrode 17 is disposed on the organic layer 15. The second electrode 17 may be a cathode that is an electron injection electrode. A material for forming the second electrode 17 may be selected from a metal, an alloy, an electro-conductive compound that has a low work function, and a mixture thereof. In this regard, the second electrode 17 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, in order to manufacture a top-emission light-emitting device, the transmission electrode may be formed of indium tin oxide (ITO) or indium zinc oxide (IZO).

Although the organic light-emitting device of FIG. 1 is described above, the present invention is not limited thereto.

When a phosphorescent dopant is used in the EML, a hole buffer layer (HBL) may be formed between the HTL and the EML or between the H-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. Any hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

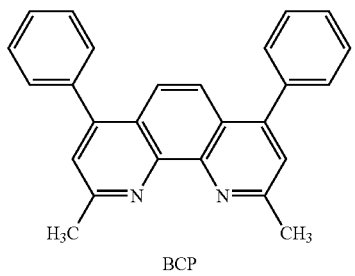

BCP

The thickness of the HBL may be from about 20 Å to about 1000 Å, and, in some embodiments, may be from about 30 Å to about 300 Å. When the thickness of the HBL is within these ranges, the HBL may have improved hole blocking ability without imparting a high driving voltage to the organic light-emitting device.

Hereinafter, the present invention will be described in detail with reference to the following synthesis examples and other examples. However, these examples are for illustrative purposes only and are not intended to limit the scope of the present invention.

Examples of the unsubstituted $C_1$-$C_{60}$ alkyl group used herein are linear or branched $C_1$-$C_6$ alkyl groups, such as methyl, ethyl, propyl, isobutyl, sec-butyl, pentyl, iso-amyl, hexyl, or the like. In the substituted $C_1$-$C_{60}$ alkyl group, at least one hydrogen atom of the unsubstituted $C_1$-$C_{60}$ alkyl group described above is substituted with one of a deuterium atom, a halogen atom, a hydroxyl group, a nitro group, a cyano group, an amino group, an amidino group, a hydrazine, a hydrazone, a carboxyl group or salts thereof, a sulfonic acid group or salts thereof, a phosphoric acid group or salts thereof, a $C_1$-$C_{60}$ alkyl group, a $C_2$-$C_{60}$ alkenyl group, a $C_2$-$C_{60}$ alkynyl group, a $C_6$-$C_{60}$ aryl group, a $C_2$-$C_{60}$ heteroaryl group, —N($Q_{11}$)($Q_{12}$), and —Si($Q_{13}$)($Q_{14}$)($Q_{15}$), $Q_1$ to $Q_{15}$ being each independently selected from a hydrogen atom, a $C_1$-$C_{60}$ alkyl group, a $C_2$-$C_{60}$ alkenyl group, a $C_2$-$C_{60}$ alkynyl group, a $C_5$-$C_{60}$ aryl group, and a $C_2$-$C_{60}$ heteroaryl group.

The unsubstituted $C_1$-$C_{60}$ alkoxy group may be a group represented by —OA, wherein A is an unsubstituted $C_1$-$C_{60}$ alkyl group described above. Examples of the unsubstituted $C_1$-$C_{60}$ alkoxy group are a methoxy group, an ethoxy group, and an isopropyloxy group. At least one of the hydrogen atoms in the alkoxy group may be substituted with the substituents described above in conjunction with the substituted $C_1$-$C_{60}$ alkyl group.

As used herein, the unsubstituted $C_2$-$C_{60}$ alkenyl group is a hydrocarbon chain having a carbon-carbon double bond in the center or at a terminal of the unsubstituted $C_2$-$C_6$ alkyl group. Examples of the unsubstituted $C_2$-$C_{60}$ alkenyl group are ethenyl, propenyl, and butenyl groups.

At least one hydrogen atom in the unsubstituted $C_2$-$C_{60}$ alkenyl group may be substituted with the substituents described in conjunction with the substituted $C_1$-$C_{60}$ alkyl group.

The unsubstituted $C_2$-$C_{60}$ alkynyl group is a hydrocarbon chain having at least one carbon-carbon triple bond in the center or at a terminal thereof. Examples of the unsubstituted $C_2$-$C_{60}$ alkynyl group are an ethenyl group, a propenyl group, a butenyl group, and the like. At least one hydrogen atom in the alkynyl group may be substituted with the substituents described above in conjunction with the $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a bivalent group having a carbocyclic aromatic system having 6 to 60 carbon atoms including at least one aromatic ring. When the aryl group and the arylene group have at least two rings, they may be fused to each other via a single bond. At least one hydrogen atom in the aryl group and the arylene group may be substituted with the substituents described above in conjunction with the $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinonyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group. Examples of the substituted $C_5$-$C_{60}$ aryl group may be inferred based on those of the unsubstituted C5-$C_{60}$ aryl group and the substituted $C_1$-$C_{60}$ alkyl group described above. Examples of the substituted or unsubstituted $C_5$-$C_{60}$ arylene group may be inferred based on those examples of the substituted or unsubstituted $C_5$-$C_{60}$ aryl group described above.

The unsubstituted $C_2$-$C_{60}$ heteroaryl group is a monovalent group having at least one aromatic ring having at least one of the heteroatoms selected from N, O, P, and S. The unsubstituted $C_2$-$C_{60}$ heteroarylene group is a divalent group having at least one aromatic ring having at least one of the heteroatoms selected from N, O, P, and S. In this regard, when the heteroaryl group and the heteroarylene group have at least two rings, they may be fused to each other via a single bond. At least one hydrogen atom in the heteroaryl group and the heteroarylene group may be substituted with those substituents described above in conjunction with the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the unsubstituted $C_2$-$C_{10}$ heteroarylene group may be inferred based on those examples of the substituted or unsubstituted $C_2$-$C_{60}$ arylene group described above.

The substituted or unsubstituted $C_6$-$C_{60}$ aryloxy group indicates —$OA_2$ (wherein $A_2$ is a substituted or unsubstituted $C_6$-$C_{60}$ aryl group described above). The substituted or unsubstituted $C_5$-$C_{60}$ arylthiol group indicates —$SA_3$ (wherein $A_3$ is a substituted or unsubstituted $C_6$-$C_{60}$ aryl group described above).

EXAMPLES

Synthesis Example 1: Synthesis of Compound 2

<Synthesis of Compound 2-1>

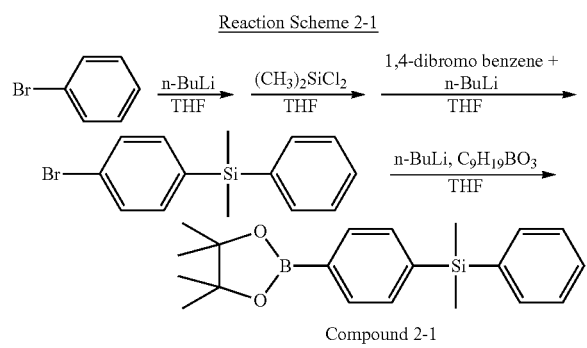

Compound 2-1

After 12 g (58.25 mmol) of bromobenzene was dissolved in 200 ml of THF in a 500-ml 3-necked round bottomed flask (flask 1) in a nitrogen atmosphere, 23.65 ml (58.25 mmol) of 2.5M n-BuLi was slowly dropped into the solution at −78° C. and stirred for about 20 minutes while the temperature was maintained. Afterward, 6.93 g (54.17 mmol) of it dimethyldichlorosilane was very slowly dropwise added into the mixture at −80° C. or less, and the temperature was then slowly increased to about −10° C. or less, after which the mixture was further stirred for about 2 hours. After 18.97 g (80.39 mmol) of 1,4-dibromobenzene was dissolved in 200 ml of THF in a 250-ml 3-necked round flask (flask 2) under a nitrogen atmosphere, 32.63 ml (80.39 mmol) of n-BuLi was slowly dropped into the solution at −78° C. and stirred for about 20 minutes while the temperature was maintained. While the temperatures of the reaction products in flasks 1 and 2 were maintained at about −78° C., the reaction product in flask 2 was taken using a syringe, dropwise added into flask 1, and then stirred for about 12 hours. After termination of the reaction using water, the reaction product was extracted using chloroform and purified by using a silica gel column with hexane eluent, then recrystallized using hexane to obtain (4-bromo-phenyl)-dimethyl-phenyl-1-yl-silane. After (4-bromo-phenyl)-dimethyl-phenyl-1-yl-silane and 250 ml of THF were put in a 500-ml 3-necked round bottomed flask, 14.21 ml (35 mmol) of 2.5M n-BuLi was slowly dropped into the solution at −78° C. and stirred for about 40 minutes while the temperature was maintained. Afterward, 6.55 g (35 mmol) of 2-isopropoxy-4,4,5,5-tetramethyl-1,3,2-dioxaborane was slowly added into the mixture at −78° C. or less and stirred for about 30 minutes, then further stirred for about 12 hours after the temperature was allowed to slowly increase to room temperature. After termination of the reaction with 10% HCl, the reaction product was extracted using ethyl acetate. An extracted organic layer was collected and purified using a silica gel column with hexane eluent, then recrystallized using ethyl acetate and hexane to obtain 3.94 g (12.65 mmol) of a white solid Compound 2-1 (Yield: 20%).

1H NMR (300 MHz, CDCl3) δ; 7.85 (2H), 7.55 (1H), 7.46 (4H), 7.37 (2H), 1.24 (12H), 0.66 (6H)

<Synthesis of Compound 2-2>

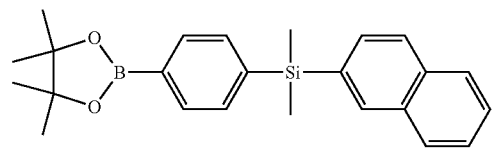

Compound 2-2

Compound 2-2 was synthesized in the same manner as in the synthesis of Compound 2-1, except that 2-bromonaphthalene, instead of bromobenzene, was used (white solid, Yield: 22%).

1H NMR (300 MHz, CDCl3) δ; 8.10 (1H), 8.00 (2H), 7.95 (1H), 7.85 (2H), 7.60 (1H), 7.59 (2H), 7.46 (2H), 1.24 (21H), 0.66 (6H)

<Synthesis of Compound 2>

Reaction Scheme 2

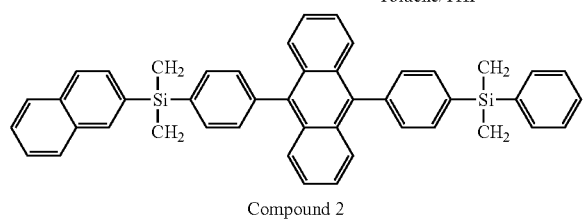

Compound 2

After 5 g (14.79 mmol) of Compound 2-1, 5.74 g (14.79 mmol) of Compound 2-2, and 4.28 g (12.86 mmol) of 9,10-dibromoanthracene were added to 300 ml of toluene in a 250-ml 3-necked flask with addition of 100 ml of 2M NaOH, and the mixture was stirred under a nitrogen atmosphere for about 30 minutes to reduce the level of dissolved oxygen. A catalytic amount of tetrakis (triphenylphosphine)palladium(0) was added thereto and the mixture was allowed to react at about 100° C. for about 36 hours. After termination of the reaction with HCl, the reaction product was filtered, washed several times with acetone, then dried. The resulting product was subjected to soxhlet extraction with toluene to obtain Compound 2 (white solid, 4.10 g, 6.36 mmol, Yield: 43%).

1H NMR (300 MHz, CDCl3) δ; 8.10 (1H), 8.00 (2H), 7.95 (1H), 7.91 (4H), 7.89 (4H), 7.60 (1H), 7.59 (2H), 7.55 (1H), 7.52 (4H), 7.46 (2H), 7.39 (4H), 7.37 (2H), 0.66 (12H).

HRMS (FAB); calcd for C46H36Si2; 644.24. found; 644.95.

Synthesis Example 2: Synthesis of Compound 6

<Synthesis of Compound 6-1>

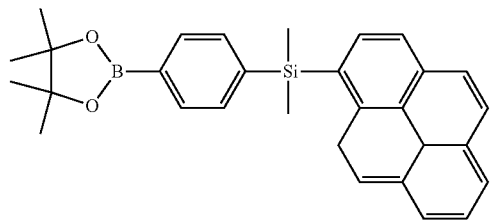

Compound 6-1

Compound 6-1 was synthesized in the same manner as in the synthesis of Compound 172-1, except that 1-bromopyrene, instead of bromobenzene, was used (white solid, Yield: 20%).

1H NMR (300 MHz, CDCl3) δ; 7.91 (1H), 7.85 (1H), 7.81 (1H), 7.46 (2H), 7.17 (1H), 7.10 (1H), 6.58 (1H), 6.44 (1H), 6.19 (1H), 6.00 (1H), 1.24 (12H), 0.66 (6H).

<Synthesis of Compound 6>

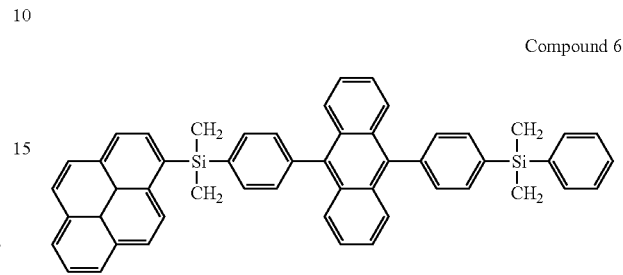

Compound 6

Compound 6 was synthesized in the same manner as in the synthesis of Compound 2, except that Compound 6-1, instead of Compound 2-2, was used (Yield: 41%).

1H NMR (300 MHz, CDCl3) δ; 7.98 (9H), 7.91 (4H), 7.89 (2H), 7.79 (2H), 7.55 (1H), 7.52 (2H), 7.46 (2H), 7.39 (4H), 7.37 (2H), 7.24 (2H), 4.82 (2H), 0.66 (12H).

HRMS (FAB); calcd for C52H40Si2; 720.27. found; 721.04.

Synthesis Example 3: Synthesis of Compound 13

<Synthesis of Compound 13-1>

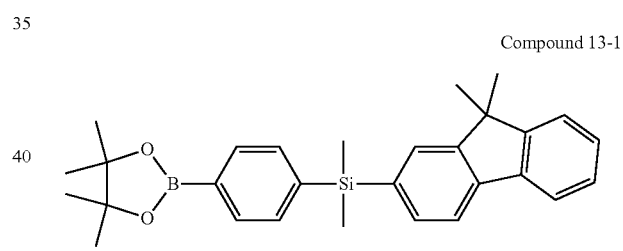

Compound 13-1

Compound 13-1 was synthesized in the same manner as in the synthesis of Compound 2-1, except that 2-bromo-(9,9'-dimethyl)fluorene, instead of bromobenzene, was used (white solid, Yield: 18%).

1H NMR (300 MHz, CDCl3) δ; 7.97 (1H), 7.87 (1H), 7.85 (2H), 7.83 (1H), 7.66 (1H), 7.55 (1H), 7.46 (2H), 7.38 (1H), 7.28 (1H), 1.72 (6H), 1.24 (12H), 0.66 (6H).

<Synthesis of Compound 13>

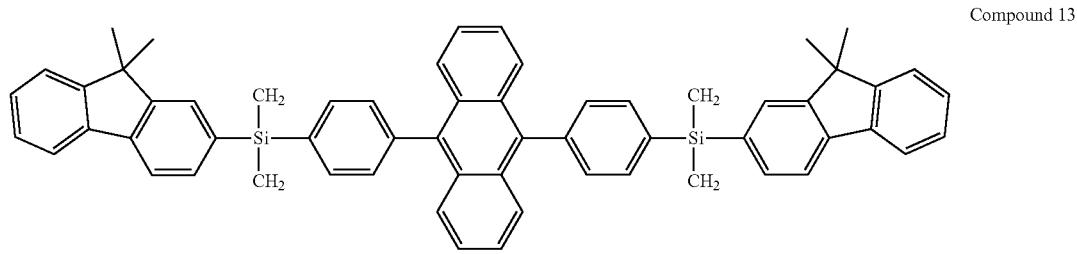 [SMILES: CC1(C)c2ccccc2-c2ccc([Si](C)(C)c3ccc(-c4c5ccccc5c(-c5ccc([Si](C)(C)c6ccc7c(c6)C(C)(C)c6ccccc6-7)cc5)c5ccccc45)cc3)cc21]

Compound 13

Compound 13 was synthesized in the same manner as in the synthesis of Compound 2, except that Compound 13-1, instead of Compound 2-1 and Compound 2-2, was used (Yield: 38%).

1H NMR (300 MHz, CDCl3) δ; 7.97 (2H), 7.91 (4H), 7.89 (4H), 7.87 (2H), 7.83 (2H), 7.66 (2H), 7.55 (2H), 7.52 (4H), 7.39 (4H), 7.38 (2H), 7.28 (2H), 1.72 (12H), 0.66 (12H).

HRMS (FAB); calcd for C60H50Si2; 826.35. found; 827.21.

Synthesis Example 4: Synthesis of Compound 19

<Synthesis of Compound 19-1>

Compound 19-1

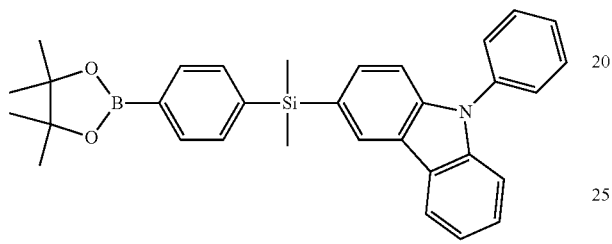

Compound 19-1 was synthesized in the same manner as in the synthesis of Compound 2-1, except that 3-bromo-(9-phenyl)carbazole, instead of bromobenzene, was used (white solid. Yield: 20%).

1H NMR (300 MHz, CDCl3) δ; 8.55 (1H), 7.94 (1H), 7.85 (2H), 7.83 (1H), 7.73 (1H), 7.58 (2H), 7.50 (2H), 7.46 (2H), 7.45 (1H), 7.36 (1H), 7.33 (1H), 7.25 (1H), 1.24 (12H), 0.66 (6H).

<Synthesis of Compound 19>

Compound 19

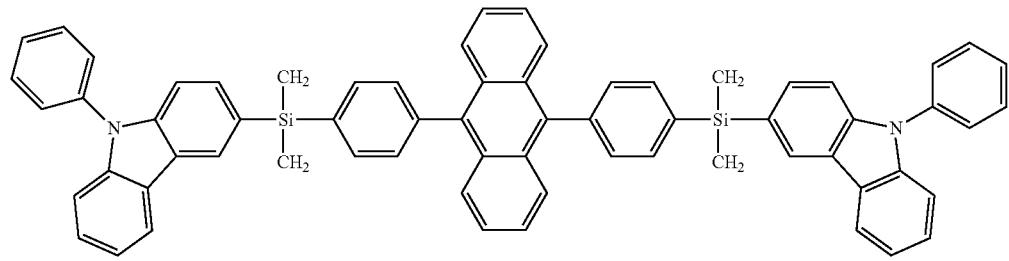

Compound 19 was synthesized in the same manner as in the synthesis of Compound 2, except that Compound 19-1, instead of Compound 2-1 and Compound 2-2, was used (Yield: 39%).

1H NMR (300 MHz, CDCl3) δ; 8.55 (2H), 7.94 (2H), 7.91 (4H), 7.89 (4H), 7.83 (2H), 7.73 (2H), 7.58 (4H), 7.52 (4H), 7.50 (4H), 7.45 (2H), 7.39 (4H), 7.36 (2H), 7.33 (2H), 7.25 (2H), 0.66 (12H).

HRMS (FAB); calcd for C66H48N2Si2; 924.34. found; 925.27.

Synthesis Example 5: Synthesis of Compound 21

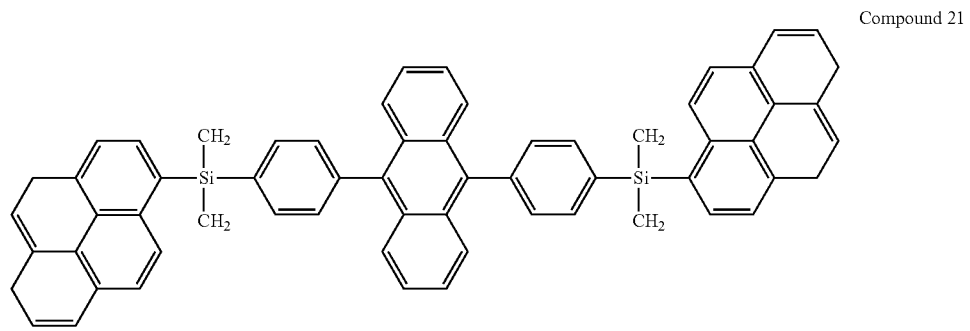 [SMILES: C[Si](C)(c1ccc(-c2c3ccccc3c(-c3ccc([Si](C)(C)c4ccc5c6c7c(ccc46)C=CCC7=CC5)cc3)c3ccccc23)cc1)c1ccc2c3c4c(ccc13)C=CCC4=CC2]

Compound 21

Compound 21 was synthesized in the same manner as in the synthesis of Compound 2, except that Compound 6-1, instead of Compound 2-1 and Compound 2-2, was used (Yield: 42%).

1H NMR (300 MHz, CDCl3) δ; 8.37 (4H), 8.24 (6H), 8.12 (6H), 8.03 (2H), 7.81 (4H), 7.72 (4H), 7.46 (4H), 7.33 (4H), 0.98 (12H)

HRMS (FAB); calcd for C62H46Si2; 846.31. found; 847.20.

Synthesis Example 6: Synthesis of Compound 24

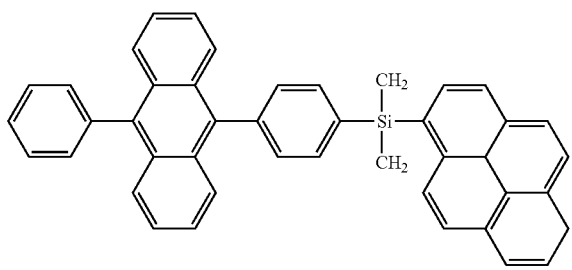

Compound 24

Compound 24 was synthesized in the same manner as in the synthesis of Compound 2, except that 10-bromo-9-phenylanthracene, instead of 9,10-dibromoanthracene, and Compound 66-1, instead of Compound 2-1, were used, and Compound 2-2 was not used (Yield: 47%).

1H NMR (300 MHz, CDCl3) δ; 7.98 (6H), 7.91 (4H), 7.79 (2H), 7.39 (4H), 7.24 (2H), 5.34 (1H), 3.22 (2H), 2.05 (6H), 0.66 (6H).

HRMS (FAB); calcd for C44H32Si; 588.23. found; 588.81.

Synthesis Example 7: Synthesis of Compound D24

Reaction Scheme 3

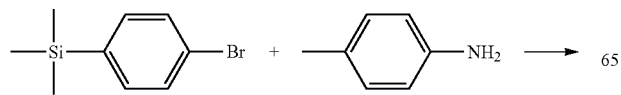

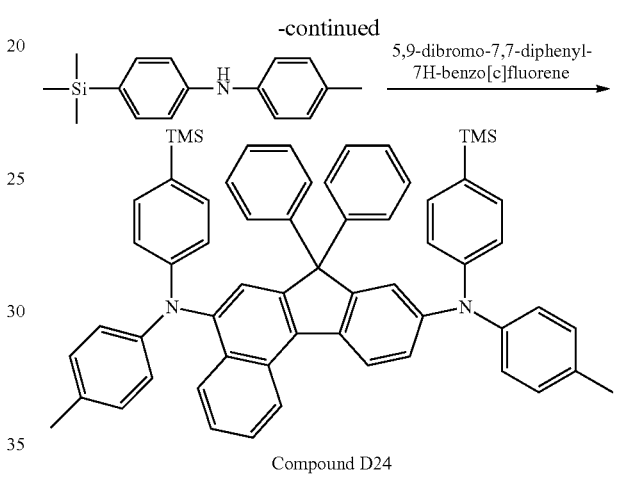

Compound D24

22.8 g (100 mmol) of 1-bromo-4-(trimethylsilyl)benzene and 10.71 g (100 mmol) of p-toluidine were dissolved in 150 ml of toluene in a nitrogen atmosphere, and 45 mg of palladium acetate, 12.5 g of sodium t-butoxide, and 1.2 g of tris(t-butyl)phosphine were added thereto, then heated at about 100° C. for 8 hours. After termination of the reaction, the reaction mixture was washed with water, and the organic layer was concentrated. The concentrated organic layer was purified with a silica gel column to obtain 4-methyl-N-(4-trimethylsilyl)phenyl)aniline. Then, 20.7 g (81.1 mmol) of 4-methyl-N-(4-(trimethylsilyl)phenyl)aniline and 21.25 g (40.55 mmol) of 5,9-dibromo-7,7-diphenyl-7H-benzo[c]fluorene were dissolved in 150 ml of toluene under a nitrogen atmosphere. To this solution, 32 mg of palladium acetate, 10.4 g of sodium t-butoxide, and 0.6 g of tris(t-butyl)phosphine were added, and the mixture was then heated at about 80° C. for about 1 hour. After termination of the reaction, the reaction product was purified with a silica gel column to obtain Compound D24 (40.40 g, 46.23 mmol, Yield: 46%).

1H NMR (300 MHz, CDCl$_3$) δ; 8.70 (1H), 8.11 (1H), 7.99 (1H), 7.52 (1H), 7.33-6.84 (30H), 2.31 (3H), 2.24 (3H), 0.24 (9H), 0.20 (9H).

HRMS (FAB); calcd for C61H58N2Si2; 874.41. found: 875.30.

Example 1

As a substrate and an anode, a coming 15 Ω/cm² (1200 Å) ITO glass substrate was cut to a size of 50 mm×50 mm×0.7 mm, then sonicated in isopropyl alcohol and pure water each for five minutes, and then cleaned by irradiation with ultraviolet rays for 30 minutes and exposure to ozone. The resulting glass substrate was loaded into a vacuum deposition device, 2-TNATA was deposited on the ITO glass substrate (anode) to form an HIL having a thickness of 600 Å on the anode, and then 4,4'-bis[N-(1-naphthyl)-N-phenylamino]biphenyl (NPB) was deposited on the HIL, to form a HTL having a thickness of 300 Å. Compound 2 (host) and Compound D24 (dopant) were co-deposited on the HTL in a weight ratio of about 95:5 to form an EML having a thickness of about 400 Å. Then, Compound 201 was deposited on the EML to form an ETL having a thickness of about 300 Å, and then LiF was deposited on the ETL to form an EIL having a thickness of about 10 Å. Then, Al was deposited on the EIL to form a second electrode (cathode) having a thickness of about 1100 Å, thereby completing the manufacture of an organic light-emitting device.

Example 2

An organic light-emitting device was manufactured in the same manner as in Example 1, except that Compound 6, instead of Compound 2, was used to form the EML.

Example 3

An organic light-emitting device was manufactured in the same manner as in Example 1, except that Compound 13, instead of Compound 2, was used to form the EML.

Example 4

An organic light-emitting device was manufactured in the same manner as in Example 1, except that Compound 19, instead of Compound 2, was used to form the EML.

Example 5

An organic light-emitting device was manufactured in the same manner as in Example 1, except that Compound 21, instead of Compound 2, was used to form the EML.

Example 6

An organic light-emitting device was manufactured in the same manner as in Example 1, except that Compound 24, instead of Compound 2, was used to form the EML.

Comparative Example 1

An organic light-emitting device was manufactured in the same manner as in Example 1, except that host A below, instead of Compound 2, was used to form the EML.
<Host A>

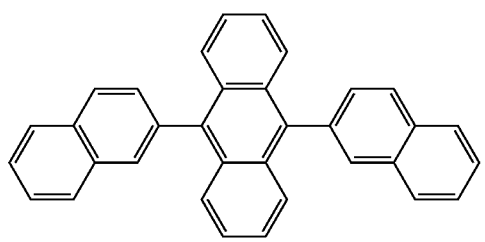 [SMILES: c1ccc2cc(-c3c4ccccc4c(-c4ccc5ccccc5c4)c4ccccc34)ccc2c1]

Comparative Example 2

An organic light-emitting device was manufactured in the same manner as in Example 5, except that dopant A below, instead of Compound D24, was used to form the EML.
<Dopant A>

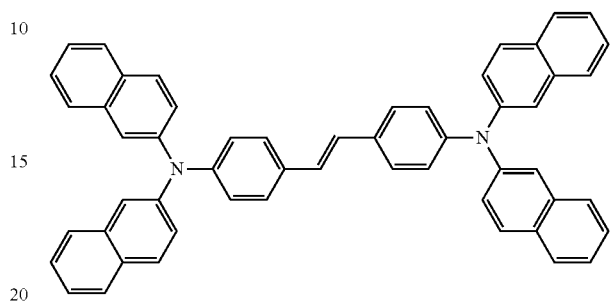

Comparative Example 3

An organic light-emitting device was manufactured in the same manner as in Example 5, except that dopant B below, instead of Compound D24, was used to form the EML.
<Dopant B>

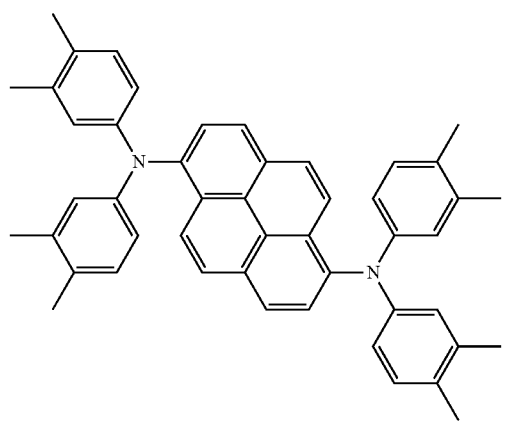

Evaluation Example

Driving voltages, current densities, efficiencies, color purity of the organic light-emitting devices of Examples 1 to 6 and Comparative Examples 1 to 3 were measured using a PR650 (Spectroscan) Source Measurement Unit (available from Photo Research, Inc.) while supplying power using a Keithley Source-Measure Unit (SMU 236). The results are shown in Table 1. (T95 lifetime indicates the time taken until an initial brightness (assumed as 100%) measured at a current density of about 10 mA/cm$^2$ is reduced to 95%.)

TABLE 1

|  | Host | Dopant | Driving voltage (V) | Current density (mA/cm$^2$) | Efficiency (cd/A) | Color coordinates CIE x | Color coordinates CIE y | T95 lifetime (hr) |
|---|---|---|---|---|---|---|---|---|
| Example 1 | Compound 2 | Compound D24 | 3.6 | 10 | 2.8 | 0.148 | 0.041 | 170 |
| Example 2 | Compound 6 | Compound D24 | 3.8 | 10 | 3.2 | 0.147 | 0.045 | 210 |
| Example 3 | Compound 13 | Compound D24 | 3.4 | 10 | 2.8 | 0.149 | 0.043 | 160 |
| Example 4 | Compound 19 | Compound D24 | 3.4 | 10 | 2.9 | 0.148 | 0.043 | 170 |
| Example 5 | Compound 21 | Compound D24 | 3.8 | 10 | 3.3 | 0.148 | 0.045 | 230 |
| Example 6 | Compound 24 | Compound D24 | 3.7 | 10 | 3.1 | 0.149 | 0.044 | 190 |
| Comparative Example 1 | Host A | Compound D24 | 4.4 | 10 | 2.7 | 0.148 | 0.054 | 120 |
| Comparative Example 2 | Compound 21 | Dopant A | 4.6 | 10 | 2.5 | 0.152 | 0.061 | 60 |
| Comparative Example 3 | Compound 21 | Dopant B | 4.5 | 10 | 2.8 | 0.150 | 0.052 | 110 |

Referring to Table 1, the organic light-emitting devices of Examples 1 to 6 are found to have lower driving voltages, higher efficiencies, and improved lifetimes as compared with the organic light-emitting devices of Comparative Examples 1 to 3.

As described above, the organic light-emitting device may have a low driving voltage, a high efficiency, and a long lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting device comprising: a substrate; a first electrode; a second electrode disposed opposite to the first electrode; and an emission layer disposed between the first electrode and the second electrode and comprising a host and a dopant, the host comprising an anthracene-based compound represented by Formula 1 below:

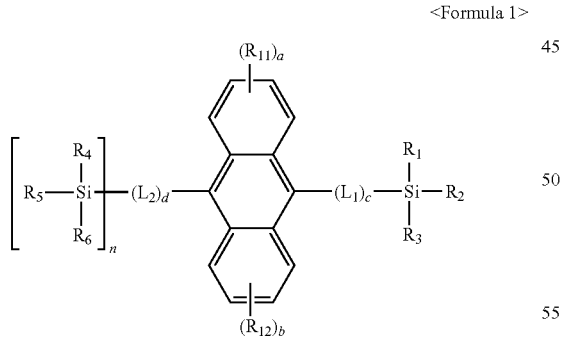

<Formula 1> n in Formula 1 being 0 or 1;

$R_1$, $R_2$, $R_4$ and $R_5$ are a substituted or unsubstituted $C_1$-$C_{60}$ alkyl group, and $R_3$ and $R_6$ are each independently selected from a 3- to 10-membered substituted or unsubstituted non-condensed ring group, and a substituted or unsubstituted condensed ring group in which at least two rings are fused to each other, if n is 0, $R_3$ is a substituted or unsubstituted condensed ring group in which at least two rings are fused to each other, and if n is 1, at least one of $R_3$ and $R_6$ is a substituted or unsubstituted condensed ring group in which at least two rings are fused to each other;

$L_1$ are $L_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group;

c and d are each independently an integer from 1 to 3;

$R_{11}$ and $R_{12}$ are each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), and —Si($Q_3$)($Q_4$)($Q_5$), $Q_1$ to $Q_5$ being each independently selected from a hydrogen atom, a $C_1$-$C_{10}$ alkyl group, a $C_6$-$C_{20}$ aryl group, and a $C_2$-$C_{20}$ heteroaryl group; and a and b are each independently an integer from 1 to 4.

2. The organic light-emitting device of claim 1, n being equal to 1.

3. The organic light-emitting device of claim 1, $R_1$, $R_2$, $R_4$ and $R_5$ being each independently one of a $C_1$-$C_{20}$ alkyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N(Q$_{11}$)(Q$_{12}$), R$_3$ and R$_6$ being each independently one of a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthryl group, a phenalenyl group, a phenanthrenyl group, a perylenyl group, a fluoranthenyl group, a naphthacenyl group, a picenyl group, a pentaphenyl group, a hexacenyl group, a dibenzofuranyl group, a dibenzothiophenyl group, a phenothiazinyl group, a phenoxazinyl group, a dihydrophenazinyl group, a phenoxathinyl group, and a phenanthridinyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_3$-C$_{10}$ cycloalkenyl group, a C$_3$-C$_{10}$ heterocycloalkyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthiol group, a C$_2$-C$_{60}$ heteroaryl group, and —N(Q$_{11}$)(Q$_{12}$), Q$_{11}$ and Q$_{12}$ being each independently selected from a hydrogen atom, a C$_1$-C$_{10}$ alkyl group, a C$_6$-C$_{20}$ aryl group and a C$_2$-C$_{20}$ heteroaryl group; and R$_3$ if n is 0 or at least one of R$_3$ and R$_6$ if n is 1 is one of a pentalenyl group, an indenyl group, a naphthyl group, an azulenyl group, a heptalenyl group, a biphenylenyl group, an indacenyl group, an acenaphthylenyl group, a fluorenyl group, a spiro-fluorenyl group, a carbazolyl group, an anthryl group, a phenalenyl group, a phenanthrenyl group, a perylenyl group, a fluoranthenyl group, a naphthacenyl group, a picenyl group, pentaphenyl group, a hexacenyl group, a dibenzofuranyl group, a dibenzothiophenyl group, a phenothiazinyl group, a phenoxazinyl group, a dihydrophenazinyl group, a phenoxathiinyl group, and a phenanthridinyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_3$-C$_{10}$ cycloalkenyl group, a C$_3$-C$_{10}$ heterocycloalkyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthiol group, a C$_2$-C$_{60}$ heteroaryl group, and —N(Q$_{11}$)(Q$_{12}$), Q$_{11}$ and Q$_{12}$ being each independently selected from a hydrogen atom, a C$_1$-C$_{10}$ alkyl group, a C$_6$-C$_{20}$ aryl group, and a C$_2$-C$_{20}$ heteroaryl group.

4. The organic light-emitting device of claim 1, R$_3$ and R$_6$ being: each independently one of one of the groups represented by Formula 2A to 2T below, one of the groups represented by Formulae 3A to 3R below, R$_3$ if n is 0 or at least one of R$_3$ to R$_6$ if n is 1 is each independently one of the groups represented by Formulae 3A to 3R:

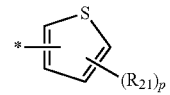

Formula 2A

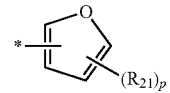

Formula 2B

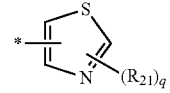

Formula 2C

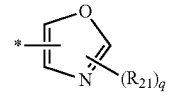

Formula 2D

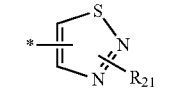

Formula 2E

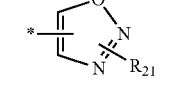

Formula 2F

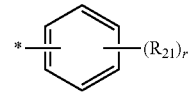

Formula 2G

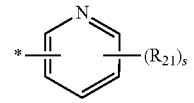

Formula 2H

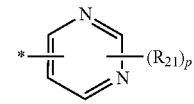

Formula 2I

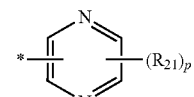

Formula 2J

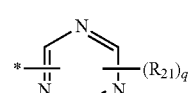

Formula 2K

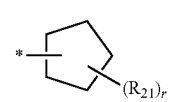

Formula 2L

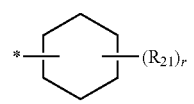

Formula 2M

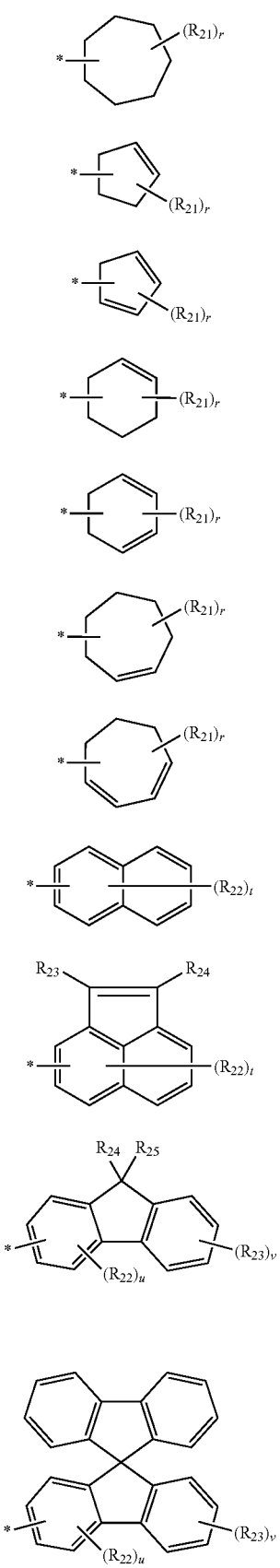
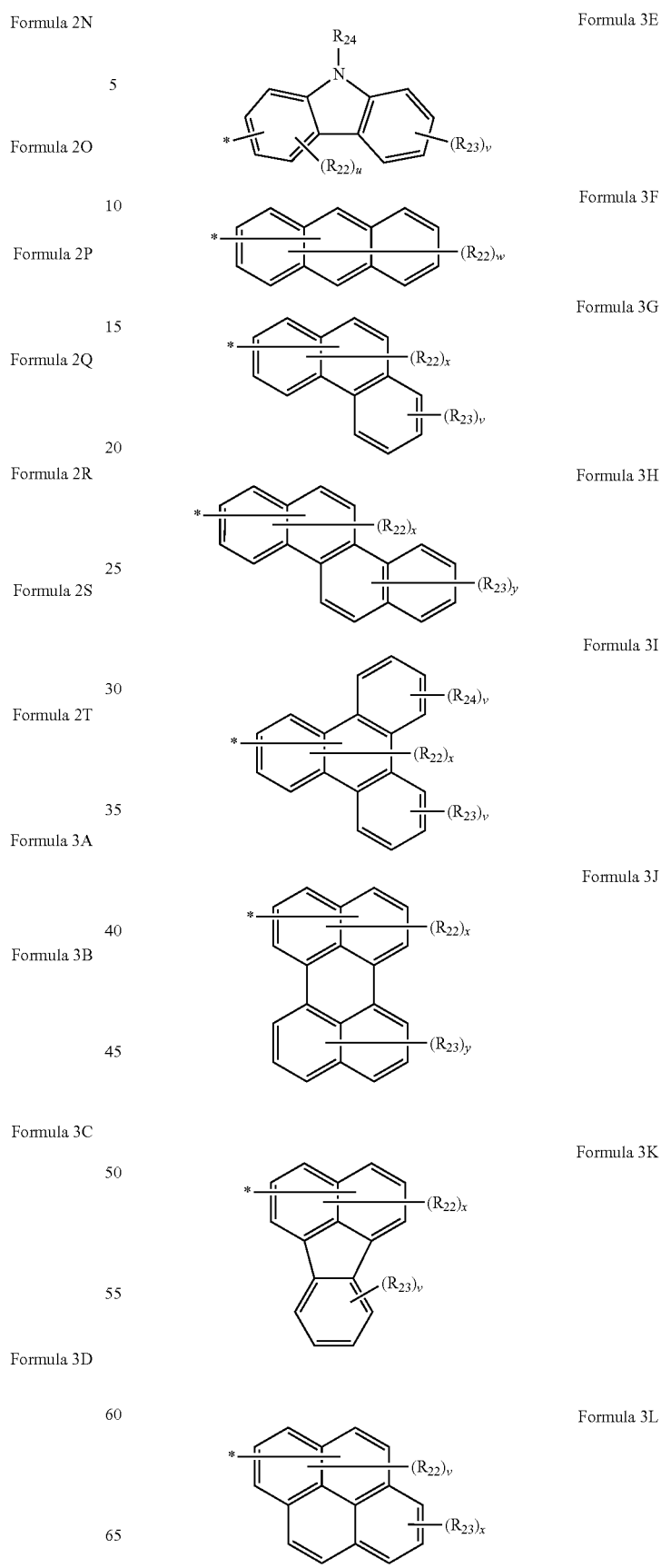

-continued

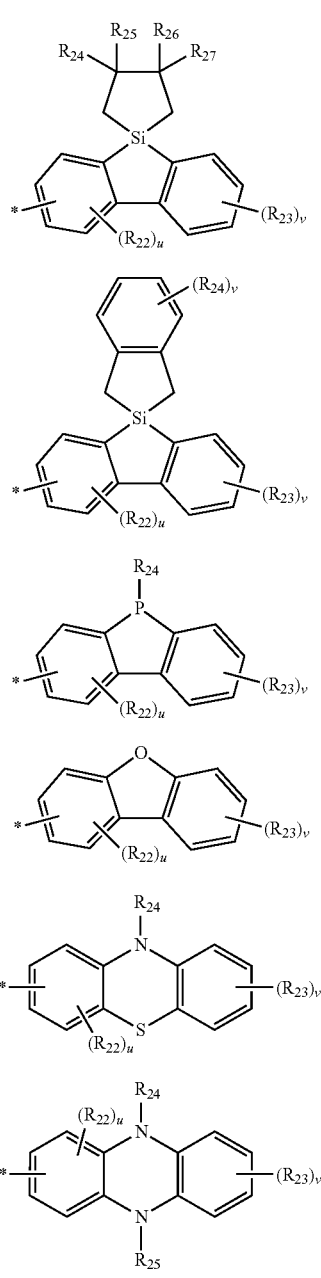

R$_{21}$ to R$_{27}$ in Formulae 2A to 2T and Formulae 3A to 3R being each independently being selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_3$-C$_{10}$ cycloalkenyl group, a C$_3$-C$_{10}$ heterocycloalkyl group, a C$_3$-C$_{10}$ heterocycloalkenyl group, a C$_6$-C$_{60}$ aryl group, a C$_6$-C$_{60}$ aryloxy group, a C$_6$-C$_{60}$ arylthiol group, a C$_2$-C$_{60}$ heteroaryl group, and —N(Q$_{21}$)(Q$_{22}$), Q$_{21}$ and Q$_{22}$ being each independently selected from a hydrogen atom, a C$_1$-C$_{10}$ alkyl group, a C$_6$-C$_{20}$ aryl group, and a C$_2$-C$_{20}$ heteroaryl group;

p and u are each independently an integer from 1 to 3;
q is 1 or 2;
r and x are each independently an integer from 1 to 5;
s and v are each independently an integer from 1 to 4;
t is an integer from 1 to 7;
w is an integer from 1 to 9; and
y is an integer from 1 to 6.

5. The organic light-emitting device of claim 1, R$_3$ and R$_6$ being each independently one of the group represented by Formula 2G, one of the groups represented by Formulae 4A to 4J, R$_3$ if n is 0, or at least one of R$_3$ to R$_6$ if n is 1, being one of the groups represented by Formulae 4A to 4J below:

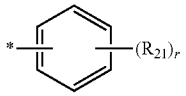
Formula 2G

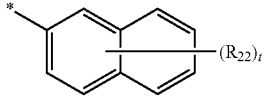
Formula 4A

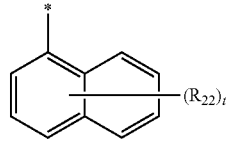
Formula 4B

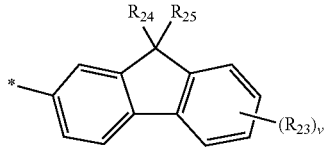
Formula 4C

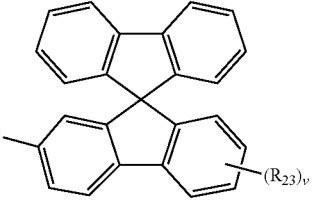
Formula 4D

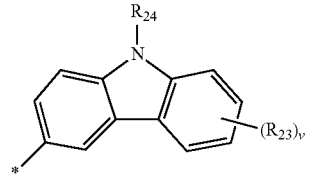
Formula 4E

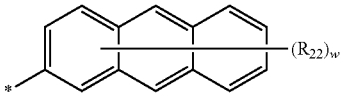
Formula 4F

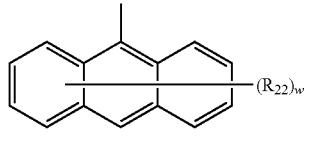
Formula 4G

-continued

Formula 4H

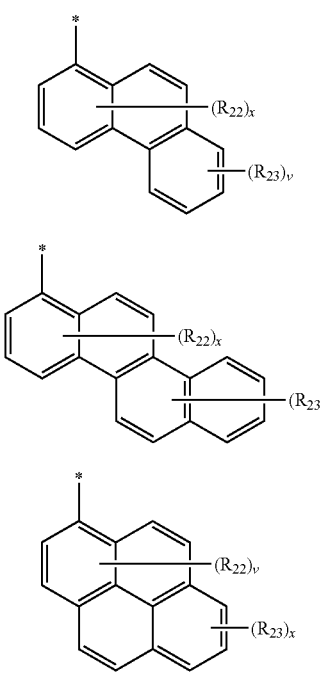

Formula 4I

Formula 4J

R$_{21}$ to R$_{25}$ in Formula 2G and Formulae 4A to 4J being each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a dimethyl-fluorenyl group, a phenyl-carbazolyl group, a pyrenyl group, a crysenyl group, a benzothiazolyl group, a benzoxazolyl group, a phenyl-benzoimidazolyl group, and —N(Q$_{21}$)(Q$_{22}$), Q$_{21}$ and Q$_{22}$ being each independently selected from a hydrogen atom, a $C_1$-$C_{10}$ alkyl group, a phenyl group, a naphthyl group, and an anthryl group;

r and x are each independently an integer from 1 to 5;
v is an integer from 1 to 4;
t is an integer from 1 to 7;
w is an integer from 1 to 9; and
y is an integer from 1 to 6.

6. The organic light-emitting device of claim 1, L$_1$ and L$_2$ being each independently one of a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, a naphthylene group, an azulenylene group, a heptalenylene group, a biphenylenylene group, an indacenylene group, an acenaphthylenylene group, a fluorenylene group, a spiro-fluorenylene group, a carbazolylene group, an anthrylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathinylene group, and a phenanthridinylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, an naphthylene group, an azulenylene group, a heptalenylene group, a biphenylenylene group, an indacenylene group, an acenaphthylenylene group, a fluorenylene group, a spiro-fluorenylene group, a carbazolylene group, an anthrylene group, a phenalenylene group, a phenanthrenylene group, a perylenylene group, a fluoranthenylene group, an naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxathinylene group, and a phenanthridinylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_2$-$C_{60}$ heteroaryl group, —N(Q$_{11}$)(Q$_{12}$), Q$_{11}$ and Q$_{12}$ being each independently selected from a hydrogen atom, a $C_1$-$C_{10}$ alkyl group, a $C_6$-$C_{20}$ aryl group, and a $C_2$-$C_{20}$ heteroaryl group.

7. The organic light-emitting device of claim 1, L$_1$ and L$_2$ being each independently one of the groups represented by Formulae 5A to 5J:

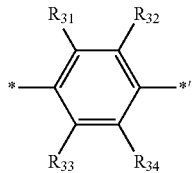

Formula 5A

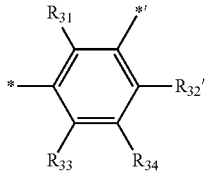

Formula 5B

-continued

Formula 5C

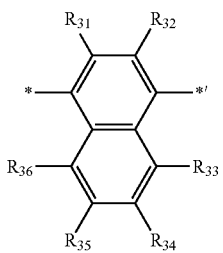

Formula 5D

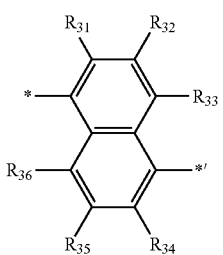

Formula 5E

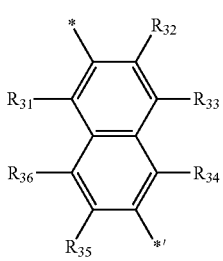

Formula 5F

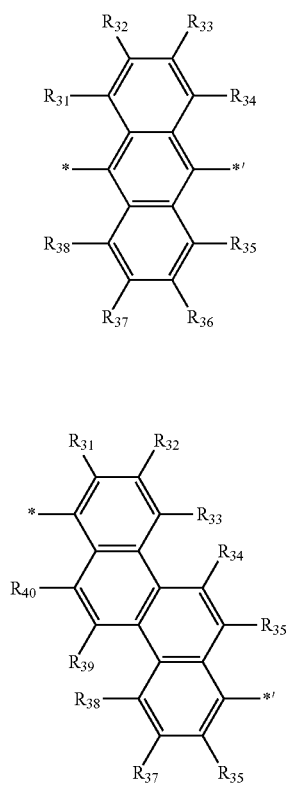

Formula 5G

-continued

Formula 5H

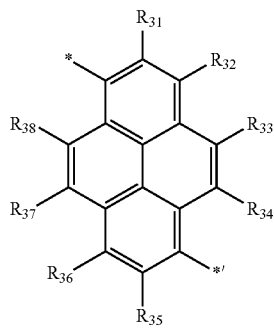

Formula 5I

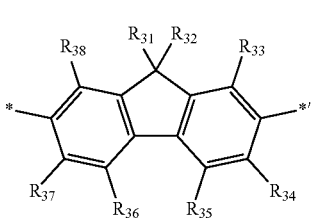

Formula 5J

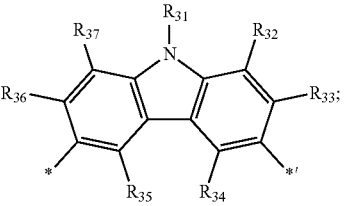

$R_{31}$ to $R_{40}$ in Formulae 5A to 5J being each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{31}$)($Q_{32}$), $Q_{31}$ and $Q_{32}$ being each independently selected from a hydrogen atom, a $C_1$-$C_{10}$ alkyl group, a $C_6$-$C_{20}$ aryl group, and a $C_2$-$C_{20}$ heteroaryl group; and

* indicates a binding site with an anthracene core in Formula 1.

8. The organic light-emitting device of claim 1, n being 1; $R_1$, $R_2$, $R_4$ and $R_5$ being a substituted or unsubstituted $C_1$-$C_{60}$ alkyl group; $R_3$ is a 3- to 10-membered substituted or unsubstituted non-condensed ring group; and $R_6$ is selected from an unsubstituted non-condensed ring group and a substituted or unsubstituted condensed ring group in which at least two rings are fused to each other.

9. The organic light-emitting device of claim 1, the anthracene-based compound being one of the compounds 1 to 24 below:

1
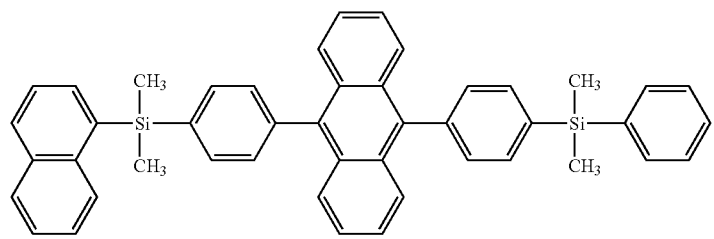
2
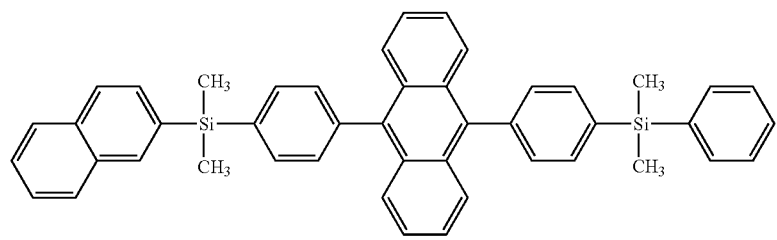
3
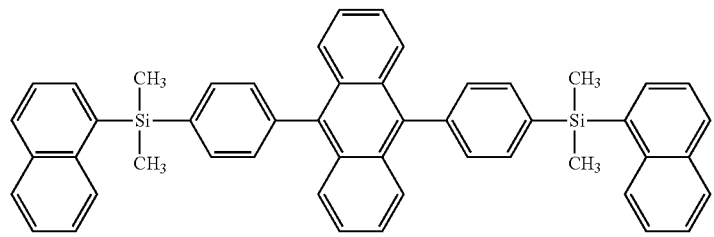
4
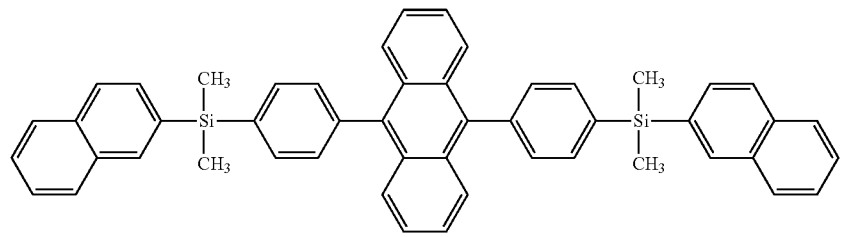
5
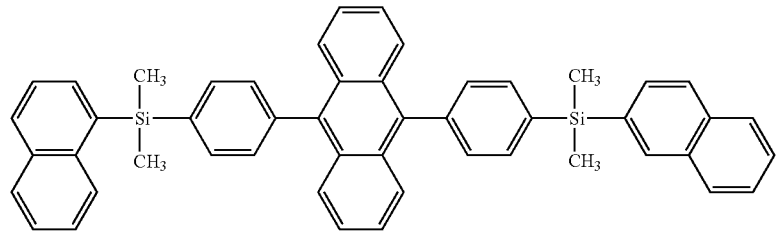
6
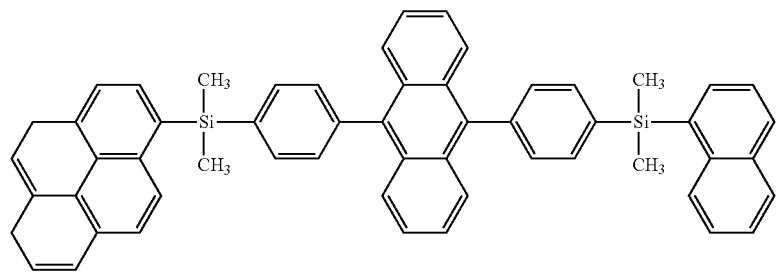

-continued
7
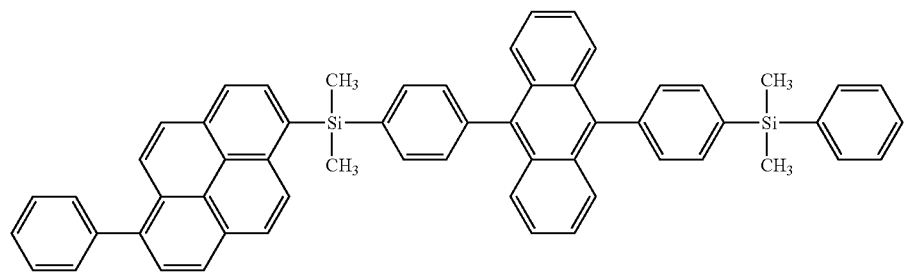
8
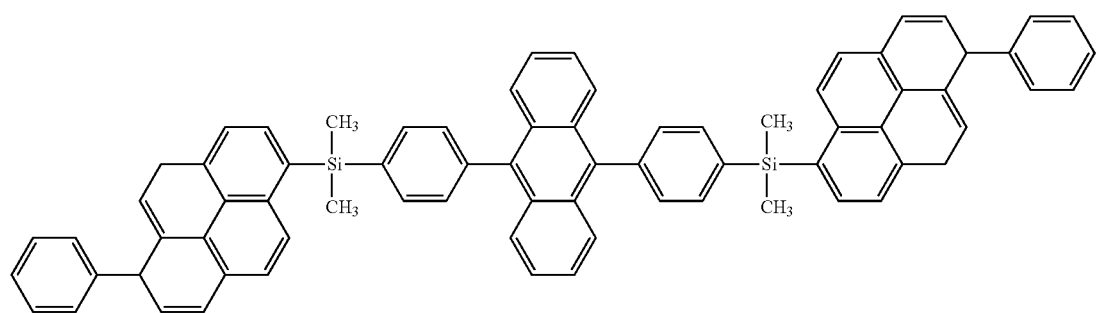
9
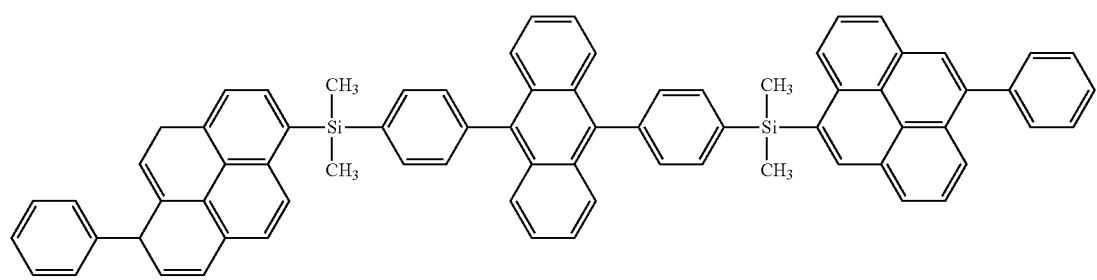
10
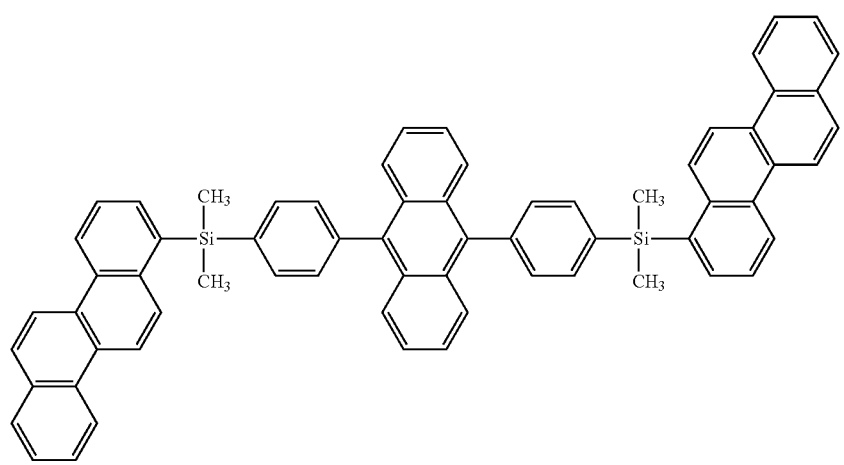

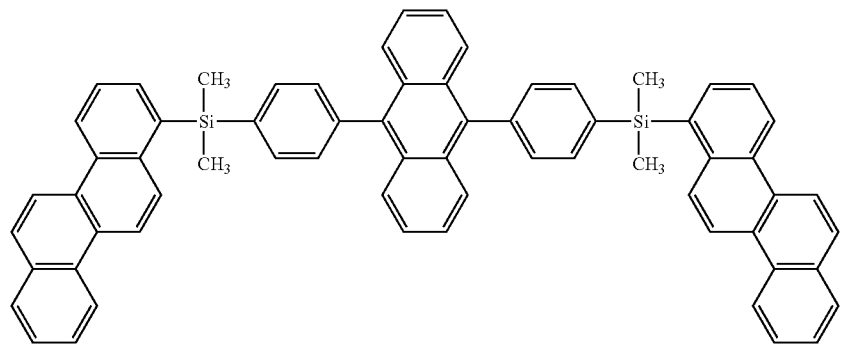
11
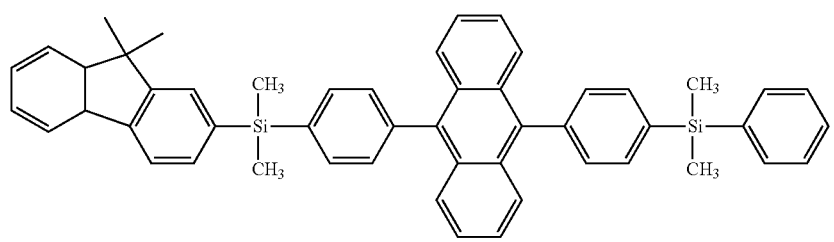
12
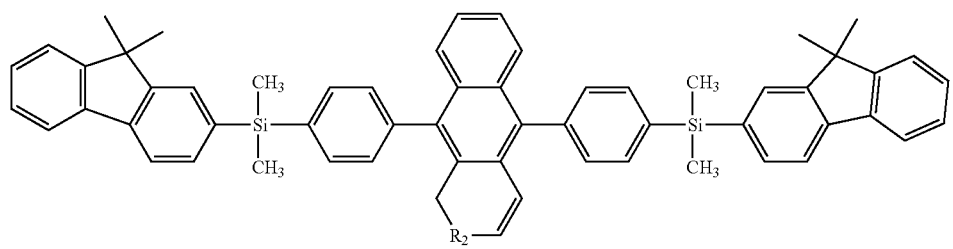
13
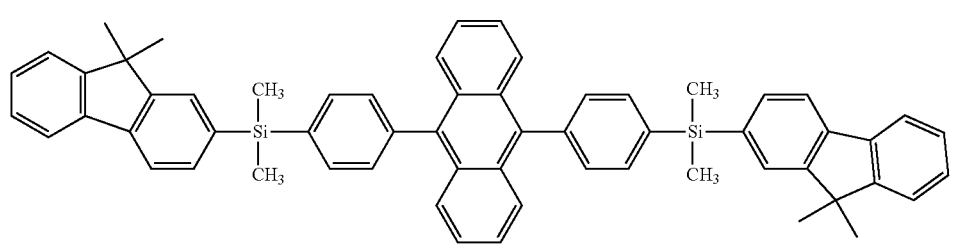
14
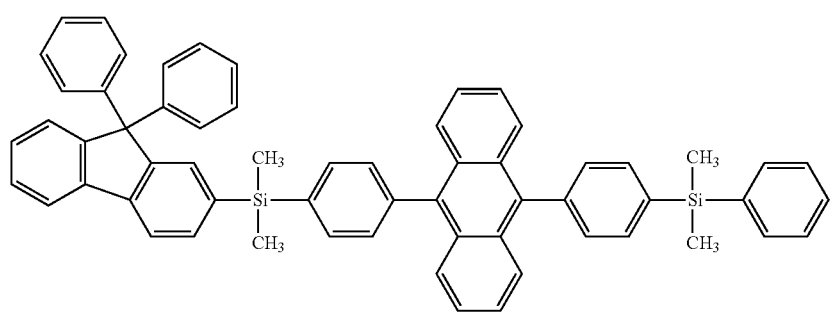
15

16
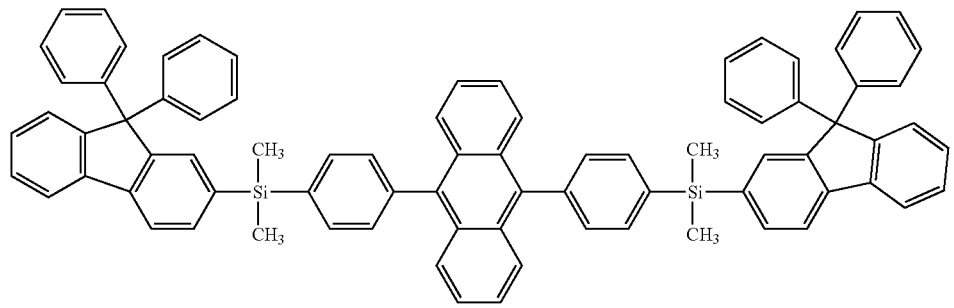
17
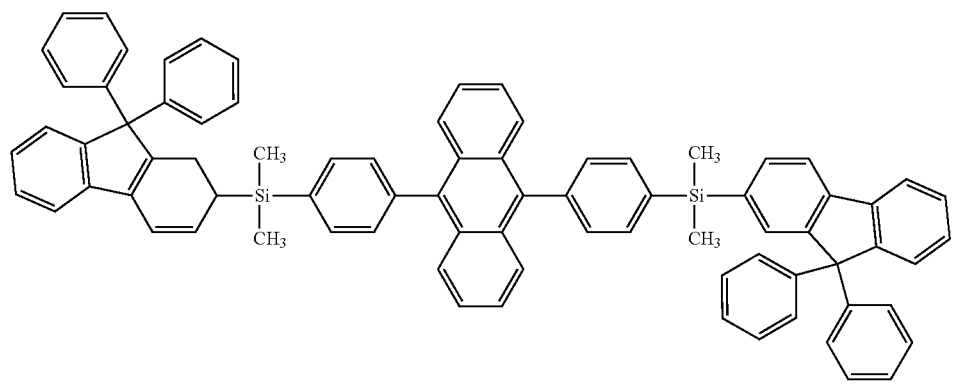
18
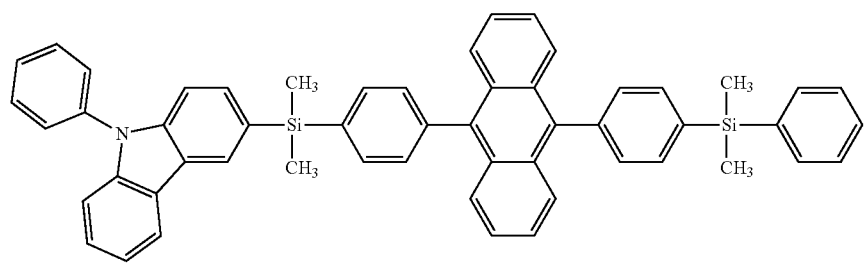
19
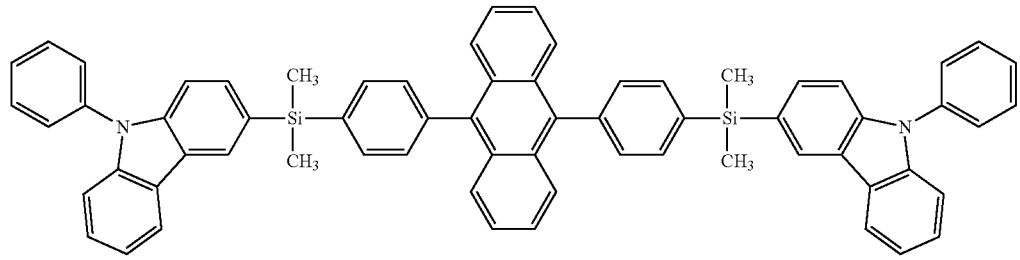
20
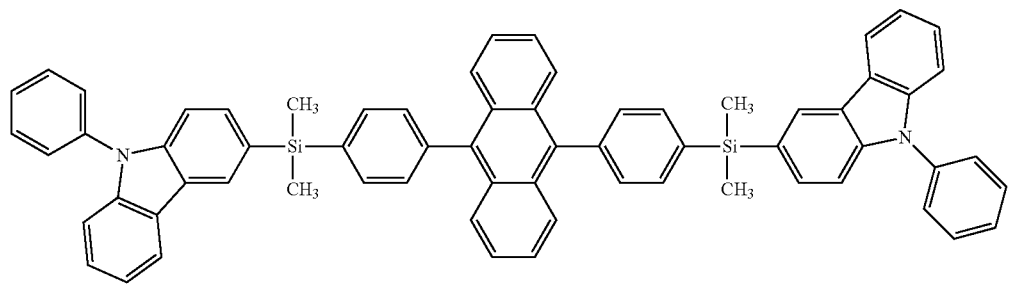

-continued

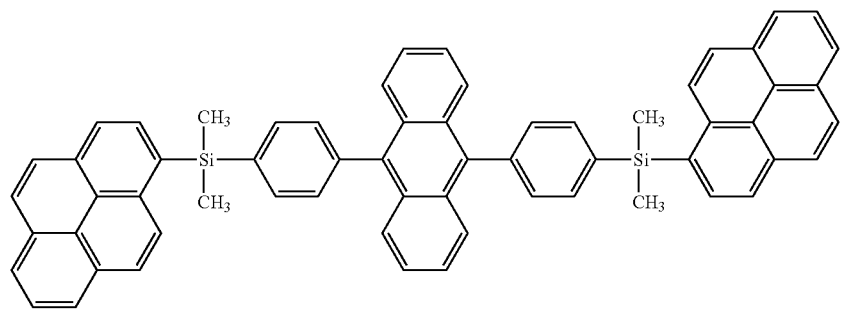

21

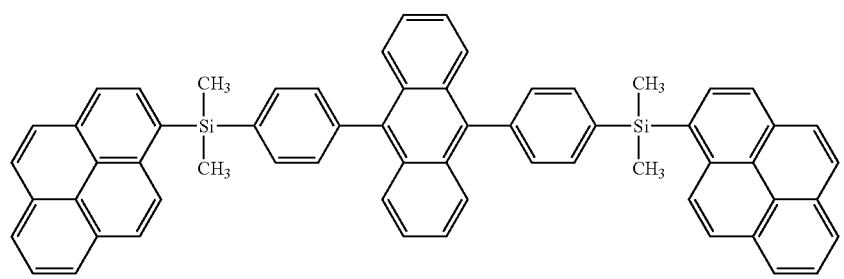

22

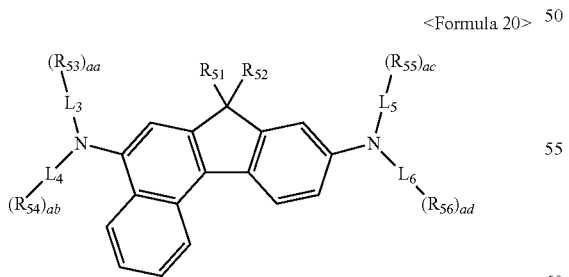

23

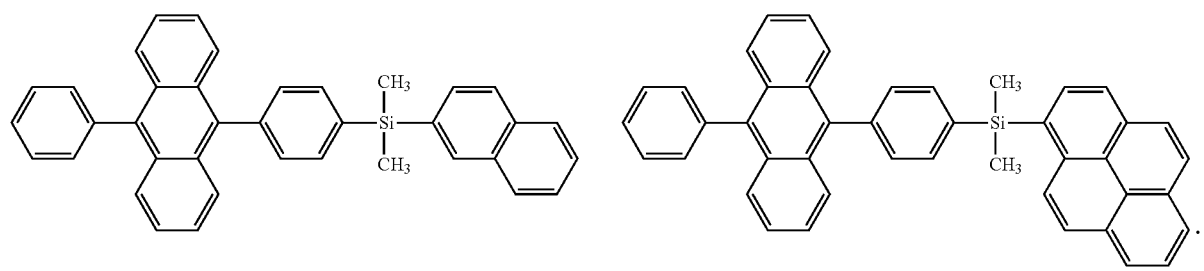

24

10. The organic light-emitting device of claim 1, the dopant being a blue dopant emitting blue light based on a fluorescence emission mechanism.

11. The organic light-emitting device of claim 1, the dopant being a blue fluorescent dopant comprising at least one diarylamino group.

12. The organic light-emitting device of claim 1, the dopant comprising a compound represented by Formula 20 below:

<Formula 20>

$R_{51}$ and $R_{52}$ in Formula 20 being each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, substituted or unsubstituted $C_3$-$C_{10}$ cycloalkenyl group, substituted or unsubstituted $C_3$-$C_{10}$ heterocycloalkyl group, substituted or unsubstituted $C_3$-$C_{10}$ heterocycloalkenyl group, substituted or unsubstituted $C_6$-$C_{60}$ aryl group, substituted or unsubstituted $C_6$-$C_{60}$ aryloxy group, substituted or unsubstituted $C_6$-$C_{60}$ arylthiol group, and a substituted or unsubstituted $C_2$-$C_{60}$ heteroaryl group;

$L_3$ to $L_6$ being each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group;

$R_{53}$ to $R_{56}$ being each independently selected from a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, substituted or unsubstituted $C_6$-$C_{60}$ aryloxy group, a substituted or unsubstituted $C_6$-$C_{60}$ arylthiol group, a substituted or unsubstituted $C_2$-$C_{60}$ heteroaryl group, —N($Q_{41}$)($Q_{42}$), and —Si($Q_{43}$)($Q_{44}$)($Q_{45}$), $Q_{41}$ to $Q_{45}$ being each independently selected from a hydrogen atom, a $C_1$-$C_{60}$ alkyl group, a $C_6$-$C_{60}$ aryl group, and a $C_2$-$C_{60}$ heteroaryl group; and aa to ad are each independently an integer from 0 to 5.

13. The organic light-emitting device of claim 12, $R_{51}$ and $R_{52}$ being each independently one of a $C_1$-$C_{20}$ alkyl group, a $C_1$-$C_{20}$ alkoxy group, a phenyl group, a naphthyl group, an anthryl group, a pyrenyl group, and a crysenyl group; and a $C_1$-$C_{20}$ alkyl group, a $C_1$-$C_{20}$ alkoxy group, a phenyl group, a naphthyl group, an anthryl group, a pyrenyl group, and a crysenyl group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group and a crysenyl group.

14. The organic light-emitting device of claim 12, wherein $R_{51}$ and $R_{52}$ are linked via a single bond or a substituted or unsubstituted $C_1$-$C_{10}$ alkylene group.

15. The organic light-emitting device of claim 12, $L_3$ to $L_6$ being each independently selected from a substituted or unsubstituted phenylene group, a substituted or unsubstituted naphthylene group, a substituted or unsubstituted anthrylene group, a substituted or unsubstituted pyrenylene group, a substituted or unsubstituted chrysenylene group, and a substituted or unsubstituted phenanthrenylene group.

16. The organic light-emitting device of claim 12, $R_{53}$ to $R_{56}$ being each independently a substituent selected from one of substituent Groups A, B and C, Group A comprising a hydrogen atom, a deuterium atom, a halogen atom, a hydroxyl group, a cyano group, a nitro group, an amino group, an amidino group, a hydrazine, a hydrazone, a carboxylic group or a salt thereof, sulfonic acid group or a salt thereof, a phosphoric acid group or a salt thereof, Group B comprising a $C_1$-$C_{20}$ alkyl group, a $C_1$-$C_{20}$ alkoxy group, a phenyl group, a naphthyl group, an anthryl group, a pyrenyl group, and a crysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group, and a crysenyl group, and Group C comprising —N($Q_{41}$)($Q_{42}$) and —Si($Q_{43}$)($Q_{44}$)($Q_{45}$), $Q_{41}$ to $Q_{45}$ being each independently selected from a hydrogen atom, a $C_1$-$C_{20}$ alkyl group, a phenyl group, a naphthyl group, an anthryl group, a pyrenyl group, and a crysenyl group.

17. The organic light-emitting device of claim 1, the dopant comprising a compound represented by one of Formulae 20A to 20D below:

<Formula 20A>

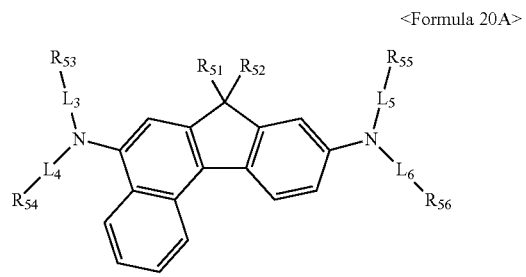

<Formula 20B>

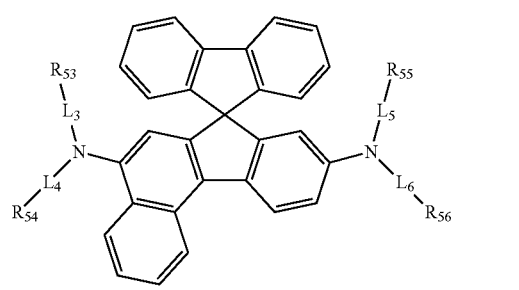

<Formula 20C>

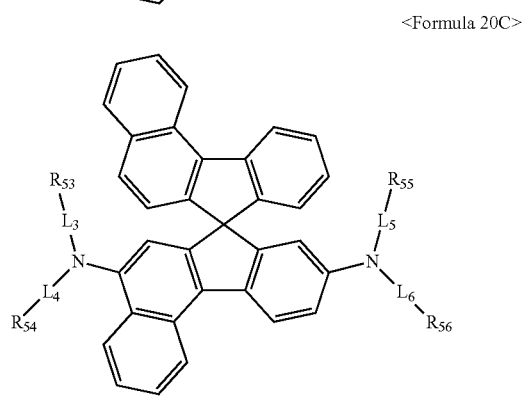

<Formula 20D>

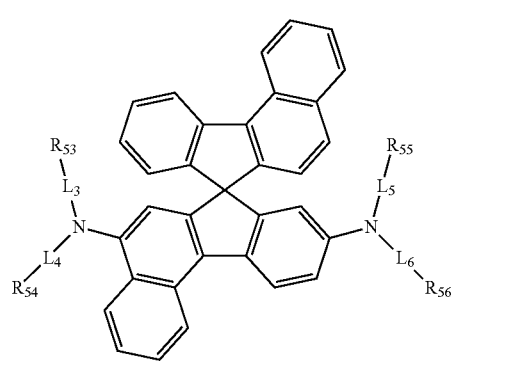

$R_{51}$ and $R_{52}$ in Formulae 20A to 20D being each independently one of a $C_1$-$C_{20}$ alkyl group, a $C_1$-$C_{20}$ alkoxy group, a phenyl group, a naphthyl group, an anthryl group, a pyrenyl group, and a crysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group and a crysenyl group;

$L_3$ to $L_6$ being each independently one of a phenylene group, a naphthylene group, an anthrylene group, a pyrenylene group, a chrysenylene group, and a phenanthrenylene group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and an anthryl group; and $R_{53}$ to $R_{56}$ being each independently a substituent selected from one of substituent Groups A, B and C, Group A comprising a hydrogen atom, a deuterium atom, a halogen atom, a hydroxyl group, a cyano group, a nitro group, an amino group, an amidino group, a hydrazine, a hydrazone, a carboxylic group or a salt thereof, sulfonic acid group or a salt thereof, a phosphoric acid group or a salt thereof, Group B comprising a $C_1$-$C_{20}$ alkyl group, a $C_1$-$C_{20}$ alkoxy group, a phenyl group, a naphthyl group, an anthryl group, a pyrenyl group, and a crysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group, and a crysenyl group, and Group C comprising —$N(Q_{41})(Q_{42})$ and —$Si(Q_{43})(Q_{44})(Q_{45})$, $Q_{41}$ to $Q_{45}$ being each independently selected from a hydrogen atom, a $C_1$-$C_{20}$ alkyl group, a phenyl group, a naphthyl group, an anthryl group, a pyrenyl group, and a crysenyl group.

18. The organic light-emitting device of claim 1, the dopant being represented by Formula 20(1) below:

<Formula 20(1)>

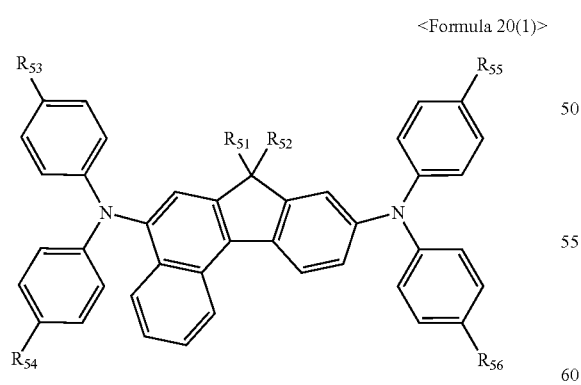

$R_{51}$ and $R_{52}$ in Formula 20(1) being each independently one of a $C_1$-$C_{20}$ alkyl group, a $C_1$-$C_{20}$ alkoxy group, a phenyl group, a naphthyl group, an anthryl group, a pyrenyl group, and a crysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group and a crysenyl group; and $R_{53}$ to $R_{56}$ are each independently a substituent selected from one of the substituent Groups A, B and C, Group A comprising a hydrogen atom, a deuterium atom, a halogen atom, a hydroxyl group, a cyano group, a nitro group, an amino group, an amidino group, a hydrazine, a hydrazone, a carboxylic group or a salt thereof, sulfonic acid group or a salt thereof, a phosphoric acid group or a salt thereof, Group B comprising a $C_1$-$C_{20}$ alkyl group, a $C_1$-$C_{20}$ alkoxy group, a phenyl group, a naphthyl group, an anthryl group, a pyrenyl group, and a crysenyl group, any of which may be substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a pyrenyl group, and a crysenyl group, and Group C comprising —$N(Q_{41})(Q_{42})$ and —$Si(Q_{43})(Q_{44})(Q_{45})$, $Q_{41}$ to $Q_{45}$ being each independently selected from a hydrogen atom, a $C_1$-$C_{20}$ alkyl group, a phenyl group, a naphthyl group, an anthryl group, a pyrenyl group, and a crysenyl group.

19. The organic light-emitting device of claim 1, the dopant comprising one of compounds D1 to D68:

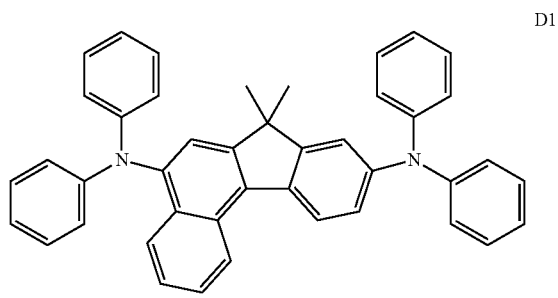

D1

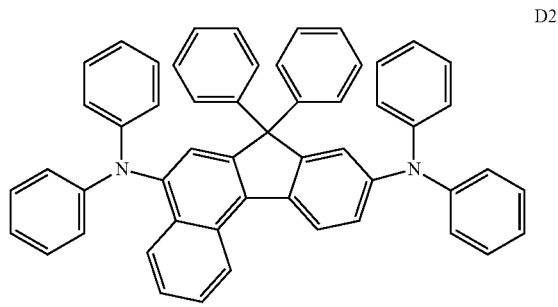

D2

103
-continued
D3
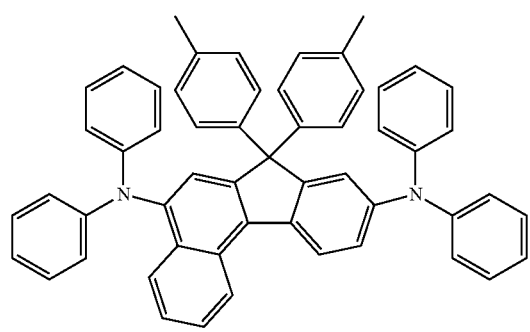
D4
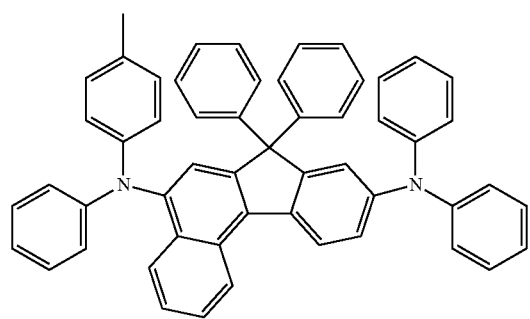
D5
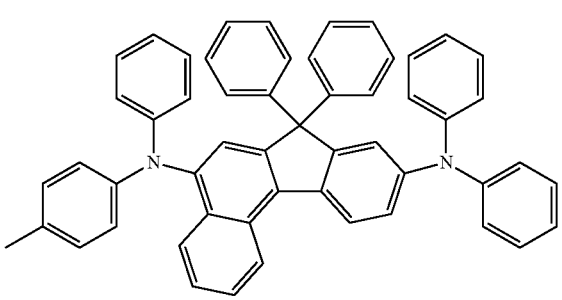
D6
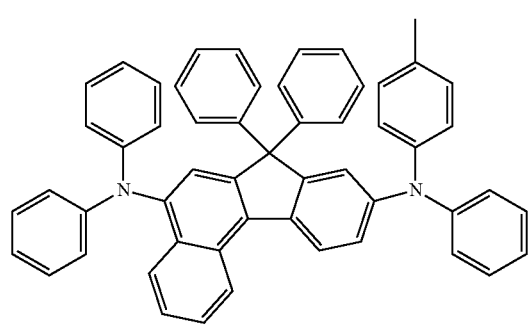
D7
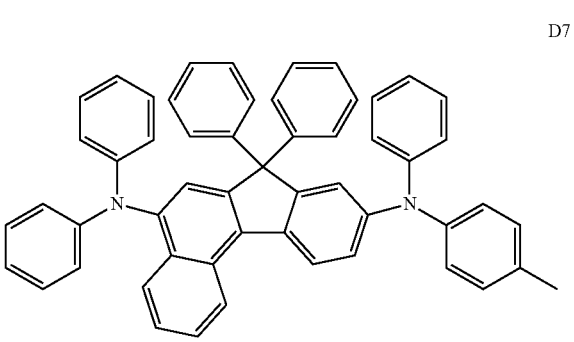
104
-continued
D8
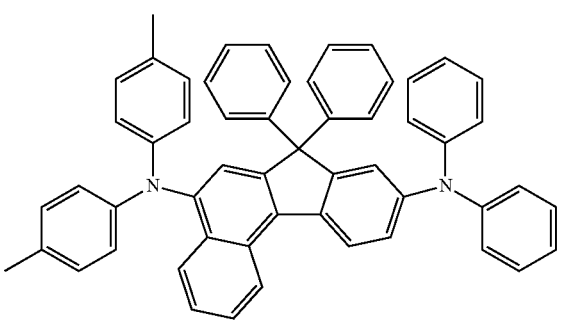
D9
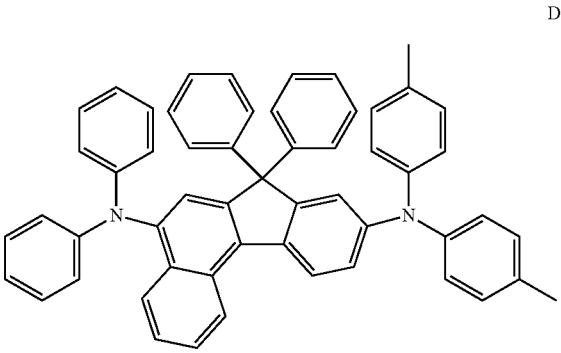
D10
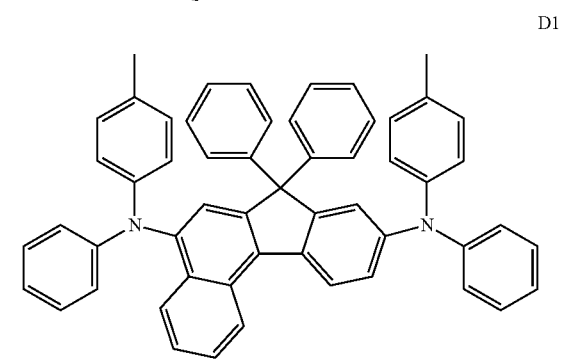
D11
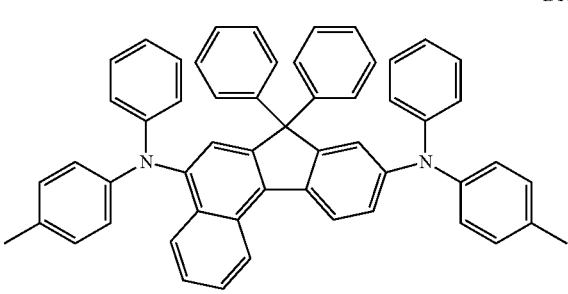
D12
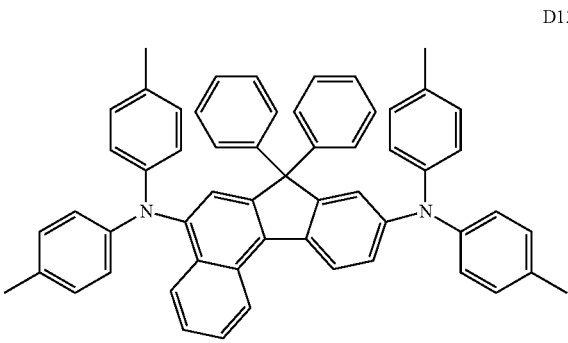

D13 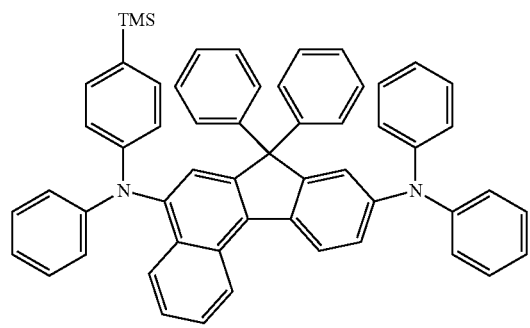
D14 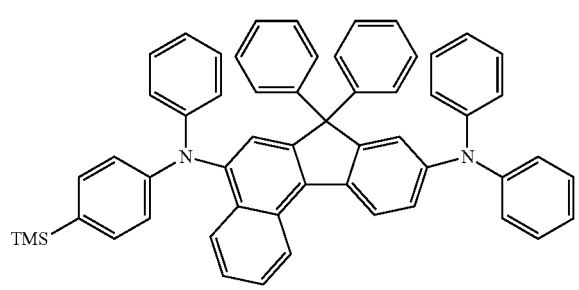
D15 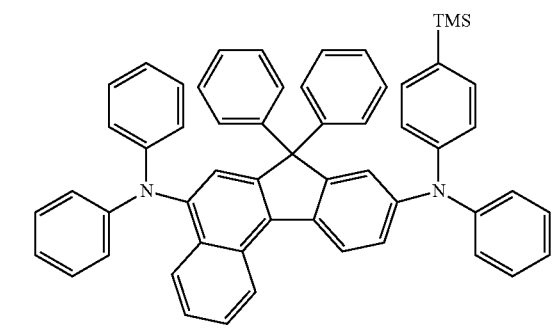
D16 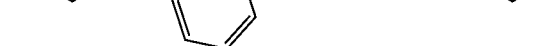 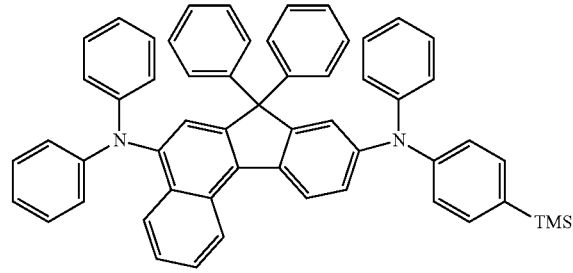
D17 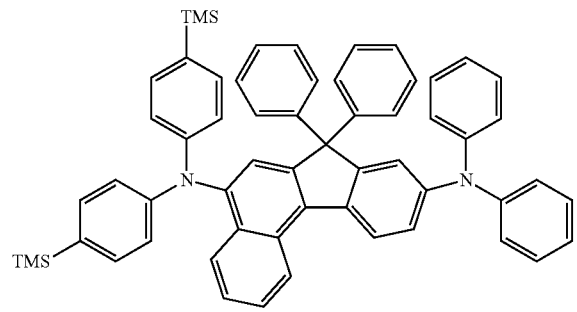
D18 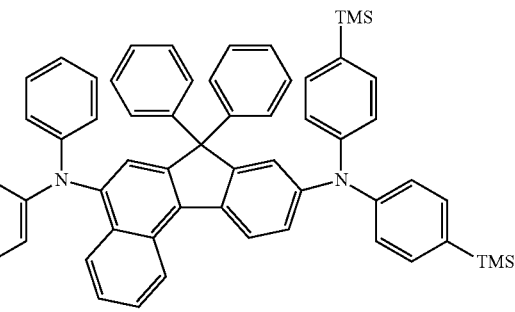
D19 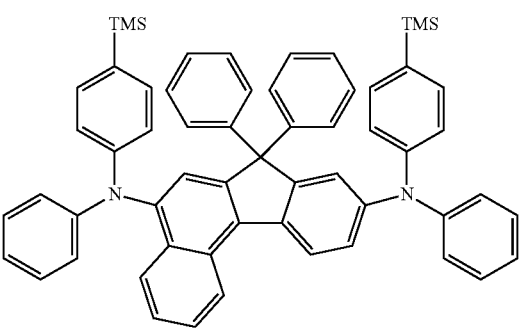
D20 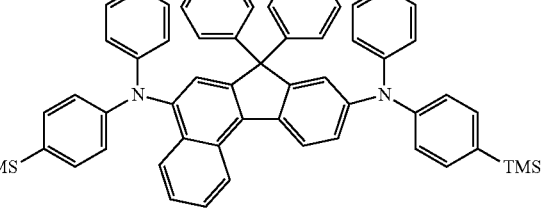
D21 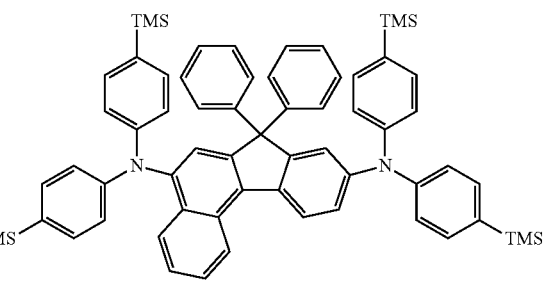
D22 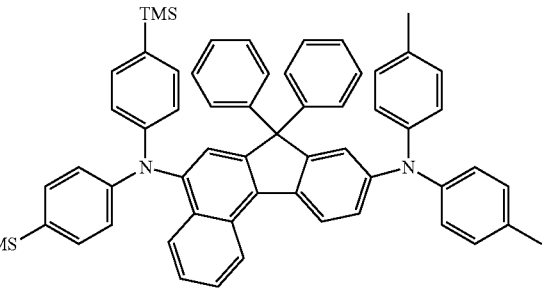

-continued
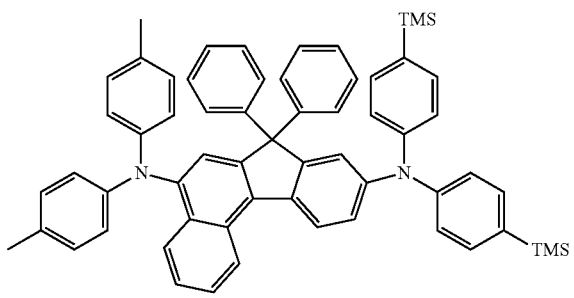
D23
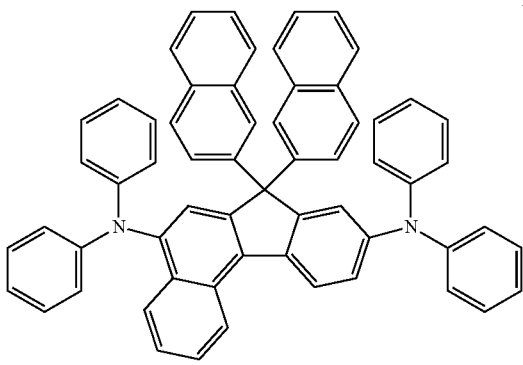
D27
D24
D28
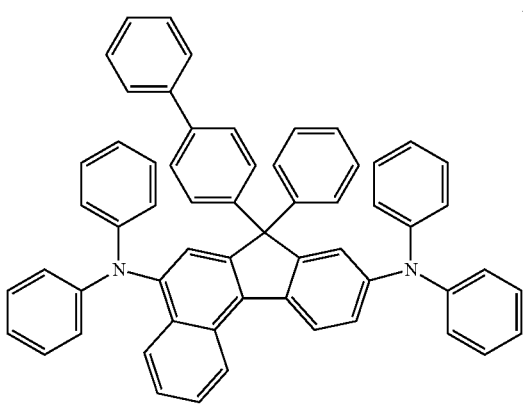
D29
D25
D26
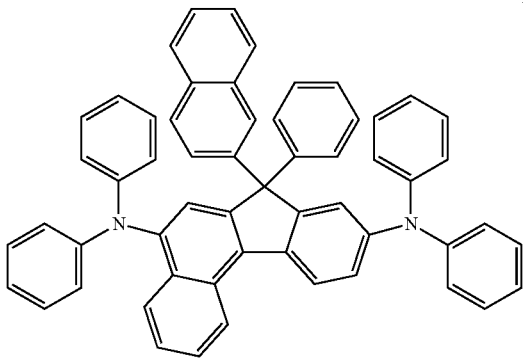
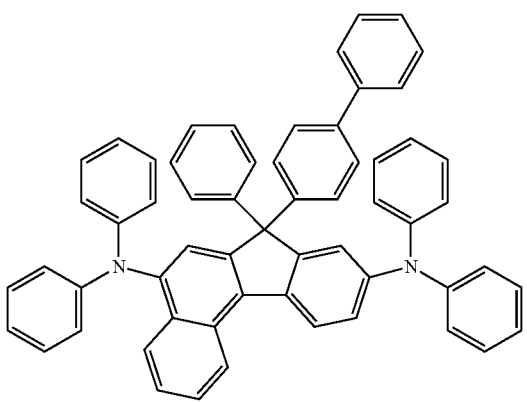
D30

-continued
D31
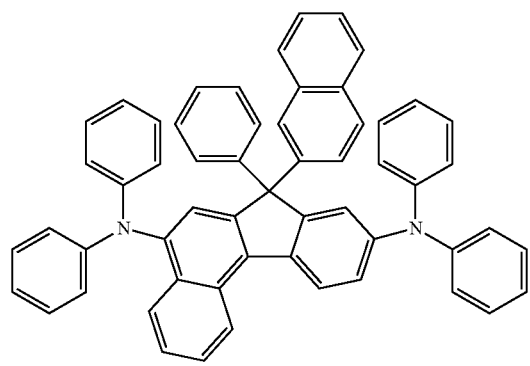
D32
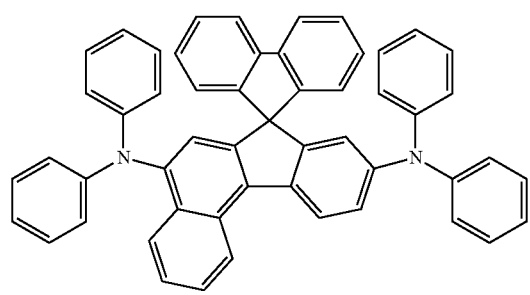
D33
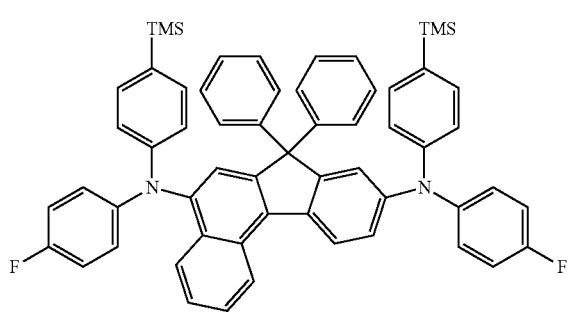
D34
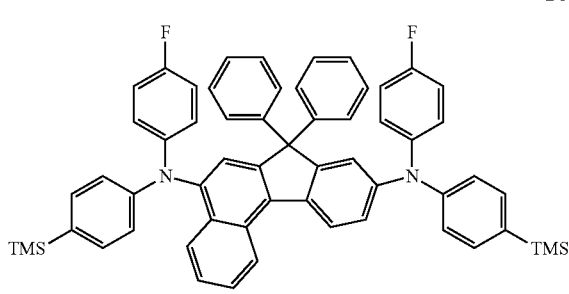
-continued
D35
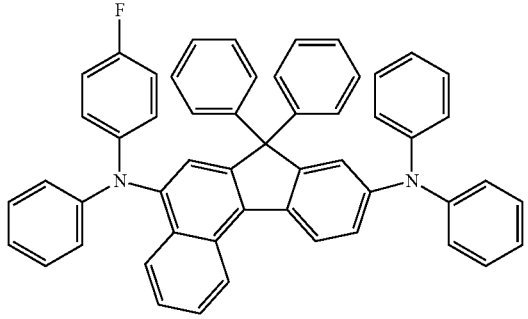
D36
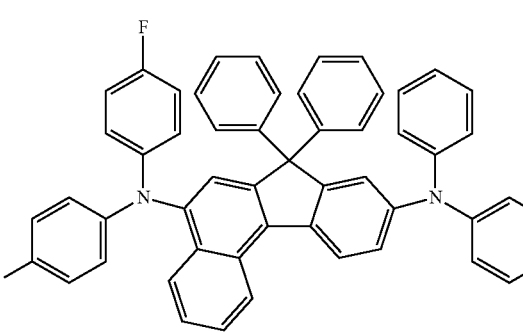
D37
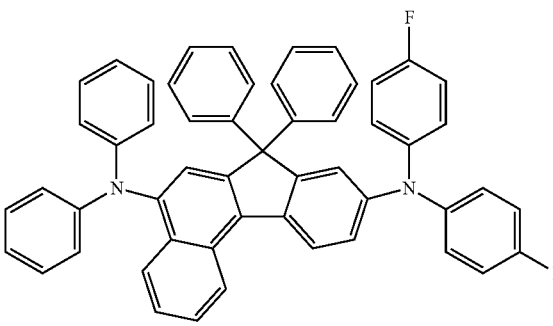
D38
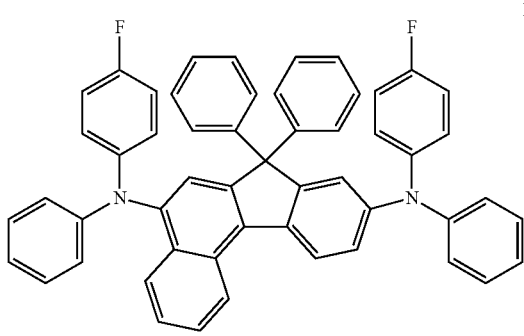
D39
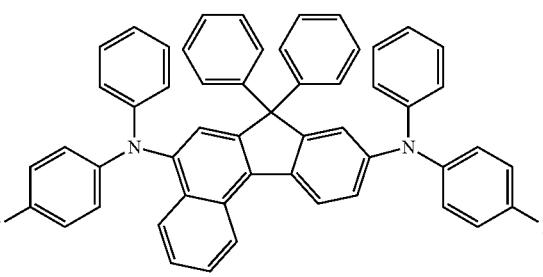

-continued
D40
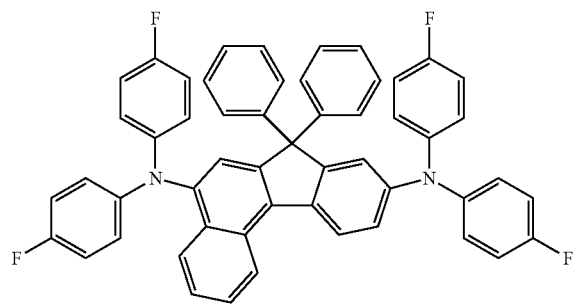
D41
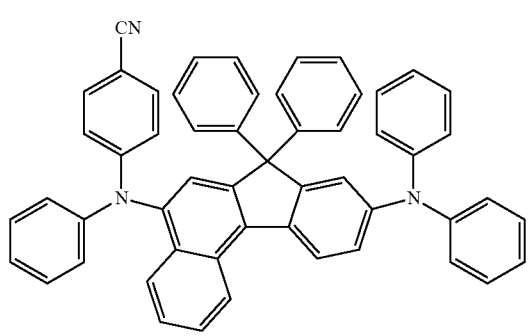
D42
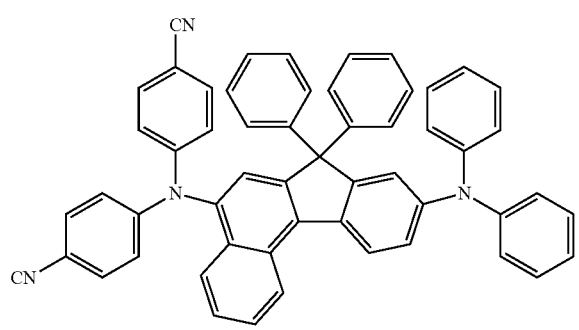
D43
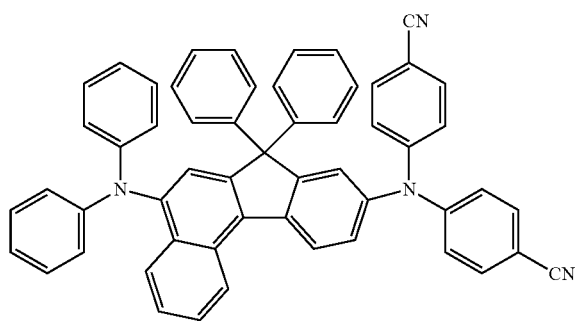
-continued
D44
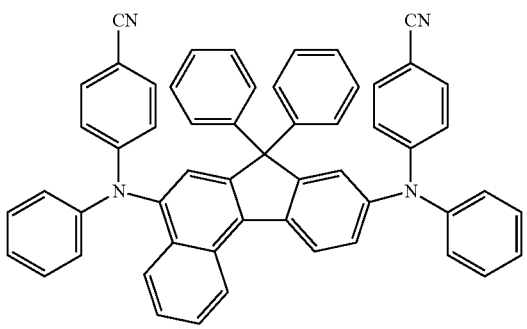
D45
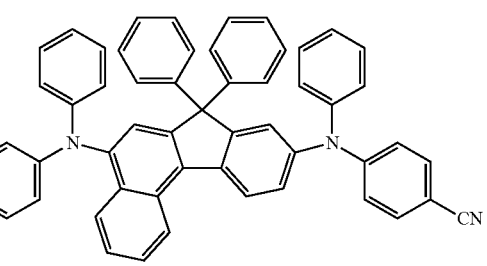
D46
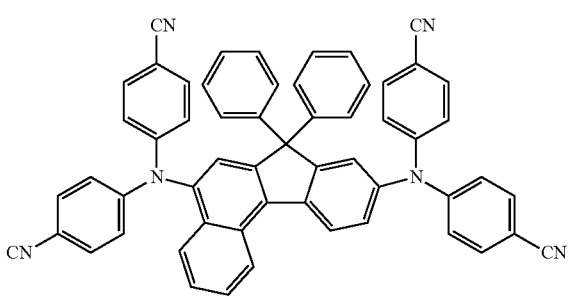
D47
D48
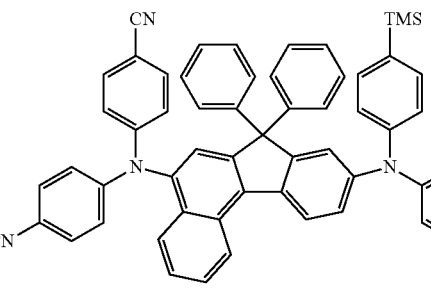

D49
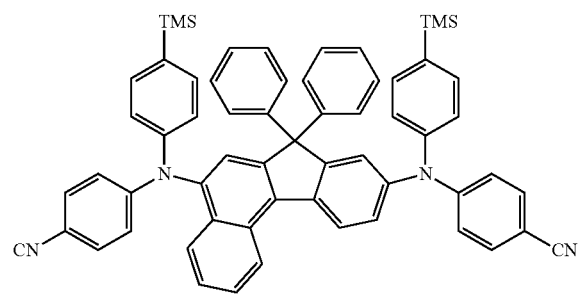
D50
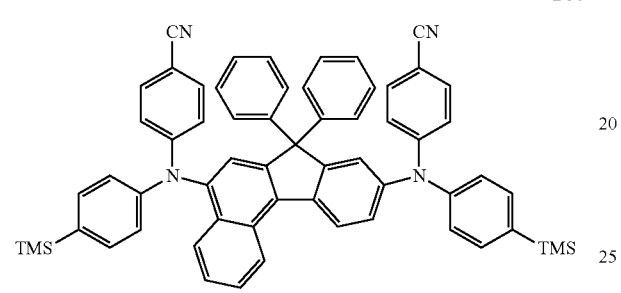
D51
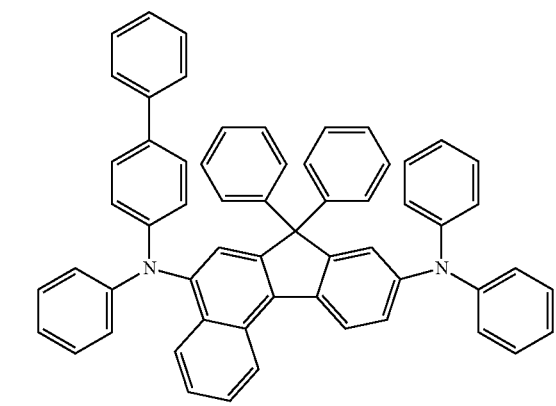
D52
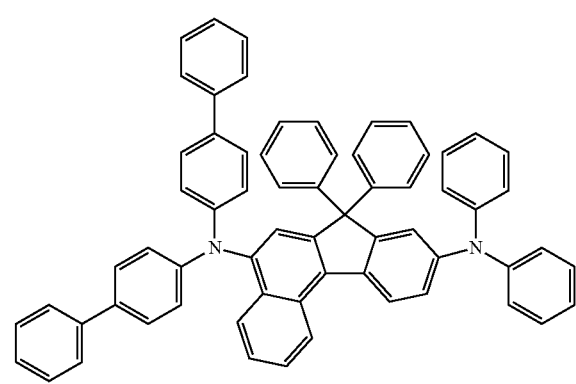
D53
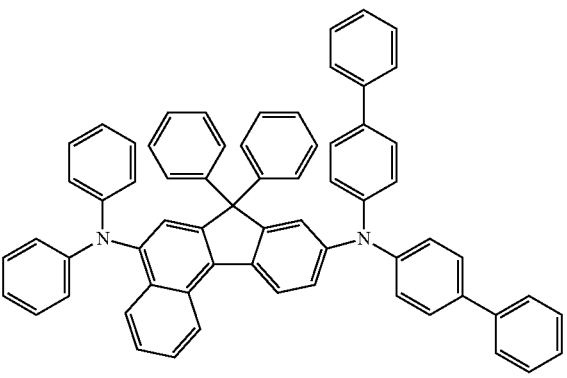
D54
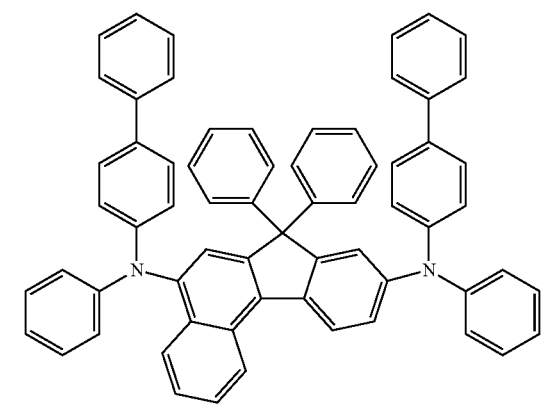
D55
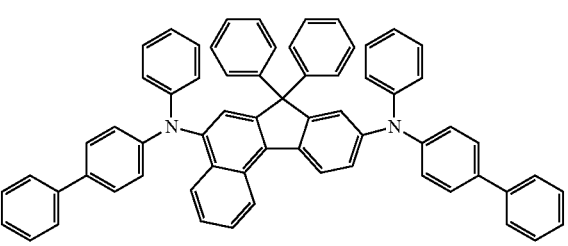
D56

D57
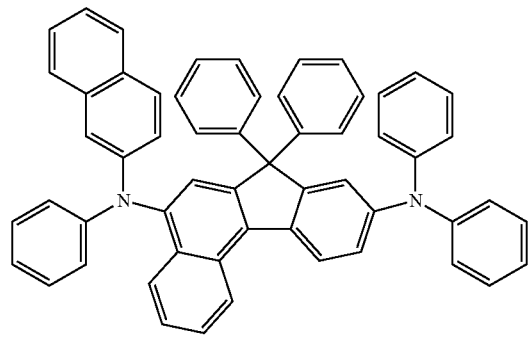
D58
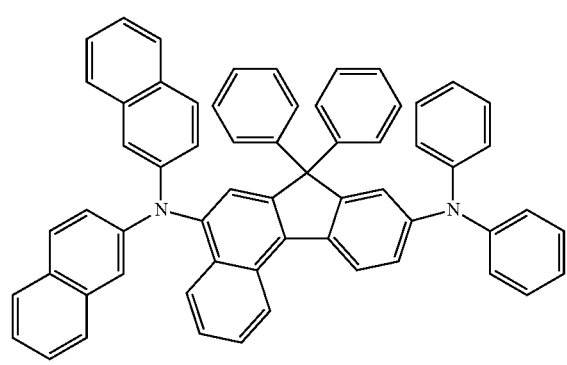
D59
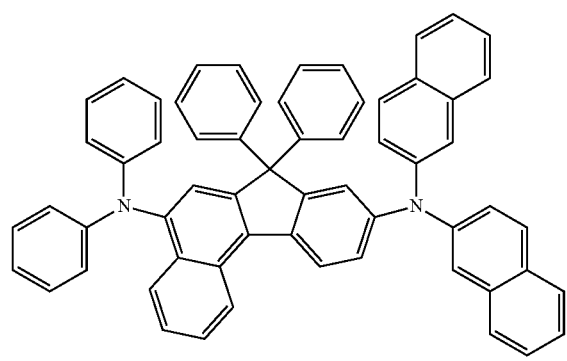
D60
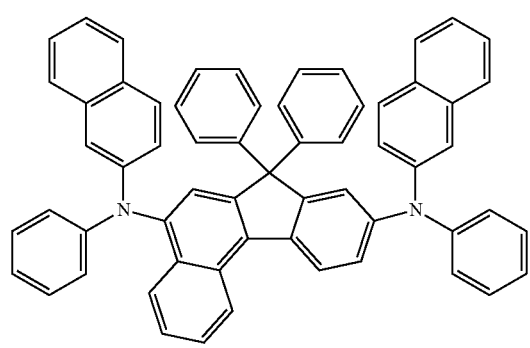
D61
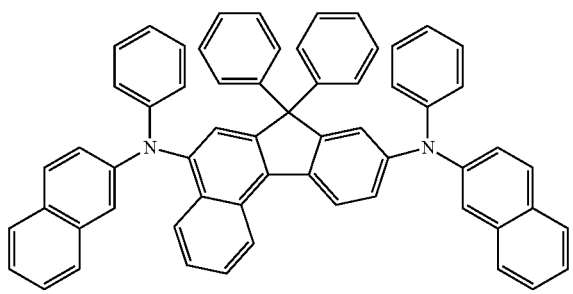
D62
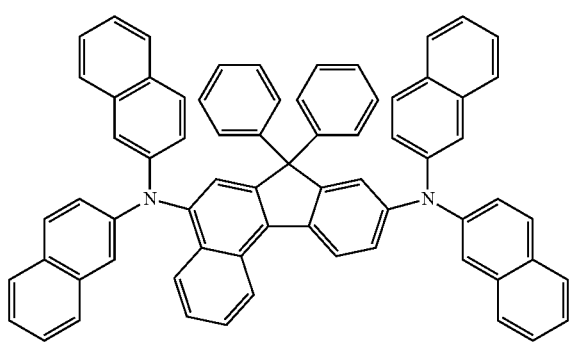
D63
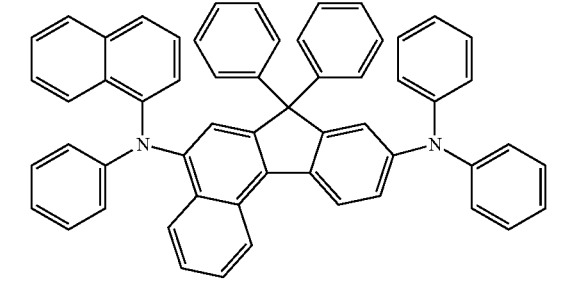
D64
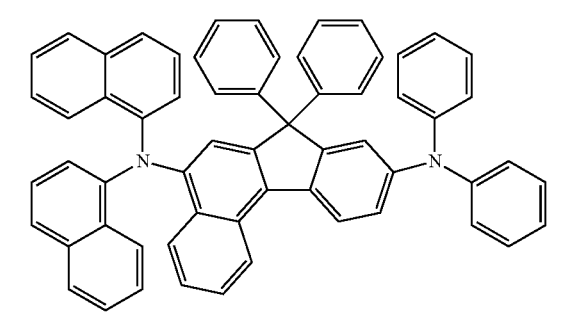

D65
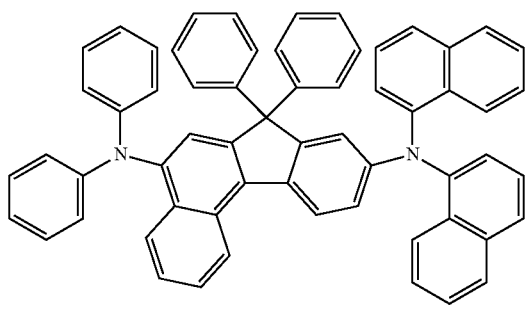
D66
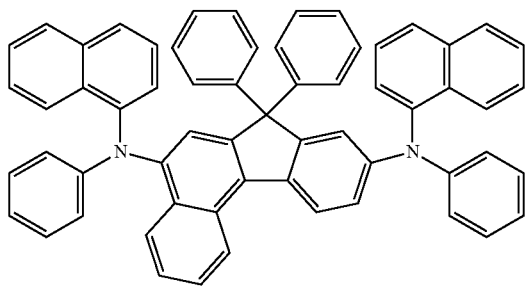
D67
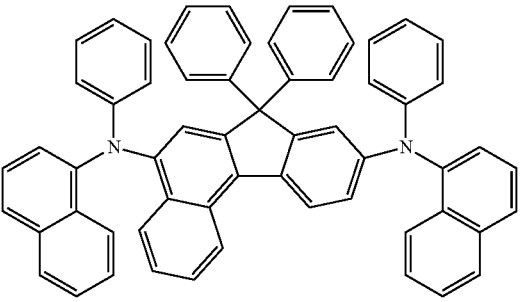
D68
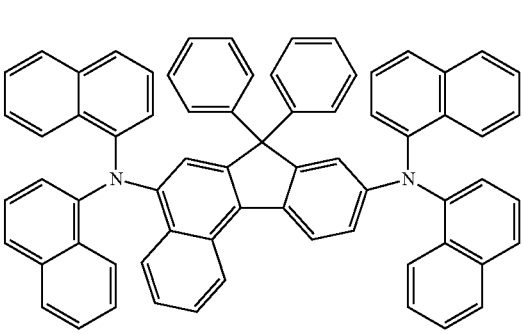
\* \* \* \* \*